(12) United States Patent
Woodgate et al.

(10) Patent No.: US 11,063,193 B2
(45) Date of Patent: Jul. 13, 2021

(54) COLOUR MICRO-LED DISPLAY APPARATUS

(71) Applicants: RealD Spark, LLC, Beverly Hills, CA (US); Optovate Limited, Hemel (GB)

(72) Inventors: Graham J. Woodgate, Henley-on-Thames (GB); Jonathan Harrold, Leamington Spa (GB); Michael G. Robinson, Boulder, CO (US)

(73) Assignee: RealD Spark, LLC, Beverly Hills, CA (US)

( * ) Notice: Subject to any disclaimer, the term of this patent is extended or adjusted under 35 U.S.C. 154(b) by 0 days.

(21) Appl. No.: 16/407,519

(22) Filed: May 9, 2019

(65) Prior Publication Data

US 2019/0348585 A1 Nov. 14, 2019

(30) Foreign Application Priority Data

May 13, 2018 (GB) ...................................... 1807747
Nov. 30, 2018 (GB) ...................................... 1819618

(51) Int. Cl.
*H01L 33/60* (2010.01)
*H01L 25/075* (2006.01)
(Continued)

(52) U.S. Cl.
CPC ............ *H01L 33/60* (2013.01); *G02B 17/086* (2013.01); *H01L 23/5387* (2013.01);
(Continued)

(58) Field of Classification Search
CPC ... H01L 33/60; H01L 25/0753; H01L 33/504; H01L 33/62; H01L 2933/0091; G02B 17/086
See application file for complete search history.

(56) References Cited

U.S. PATENT DOCUMENTS

| 5,184,114 A | 2/1993 | Brown |
| 5,812,105 A | 9/1998 | Ven |

(Continued)

FOREIGN PATENT DOCUMENTS

| DE | 102010031945 A1 | 1/2012 |
| EP | 1387412 A1 | 2/2004 |

(Continued)

OTHER PUBLICATIONS

International search report and written opinion of international searching authority in co-pending PCT/US2019/021570, dated May 24, 2019.

(Continued)

*Primary Examiner* — Matthew L Reames
(74) *Attorney, Agent, or Firm* — Penny L. Lowry

(57) ABSTRACT

A colour micro-LED display apparatus comprises an array of reflective optical elements and an array of micro-LED pixels with a uniform emission colour across the array arranged between the array of reflective optical elements and an output substrate. Light from the micro-LEDs is directed into the reflective optical elements and is incident on scattering regions in the apparatus. Colour converted scattered light is transmitted by the output substrate. A thin and efficient display apparatus may be provided with high spatial and angular colour uniformity and long lifetime.

49 Claims, 39 Drawing Sheets

(51) Int. Cl.
    *H01L 33/50*      (2010.01)
    *H01L 33/62*      (2010.01)
    *G02B 17/08*      (2006.01)
    *H01L 23/538*     (2006.01)

(52) U.S. Cl.
    CPC ........ *H01L 25/0753* (2013.01); *H01L 33/504* (2013.01); *H01L 33/62* (2013.01); *H01L 2933/0041* (2013.01); *H01L 2933/0058* (2013.01); *H01L 2933/0066* (2013.01); *H01L 2933/0091* (2013.01)

(56) References Cited

U.S. PATENT DOCUMENTS

| | | | |
|---|---|---|---|
| 6,547,423 | B2 | 4/2003 | Marshall et al. |
| 6,570,324 | B1 | 5/2003 | Tutt et al. |
| 7,014,964 | B1 | 3/2006 | Hsu et al. |
| 7,171,874 | B1 | 2/2007 | Huang |
| 7,863,614 | B2 * | 1/2011 | Toyama ............ G02F 1/133603 257/59 |
| 7,994,531 | B2 | 8/2011 | Lin et al. |
| 9,519,153 | B2 | 12/2016 | Robinson et al. |
| 10,121,772 | B1 * | 11/2018 | Wu ..................... H01L 25/0753 |
| 10,126,575 | B1 | 11/2018 | Robinson et al. |
| 10,303,030 | B2 | 5/2019 | Robinson et al. |
| 10,533,730 | B2 | 1/2020 | Harrold et al. |
| 2004/0089935 | A1 | 5/2004 | Lehner |
| 2004/0126911 | A1 | 7/2004 | Kimura |
| 2004/0161871 | A1 | 8/2004 | Omori |
| 2004/0218390 | A1 | 11/2004 | Holman et al. |
| 2004/0239243 | A1 | 12/2004 | Roberts et al. |
| 2004/0263061 | A1 | 12/2004 | Ishikawa et al. |
| 2005/0111100 | A1 | 5/2005 | Mather et al. |
| 2005/0219693 | A1 | 10/2005 | Hartkop et al. |
| 2006/0152931 | A1 | 7/2006 | Holman |
| 2006/0256255 | A1 | 11/2006 | Minami |
| 2006/0290276 | A1 | 12/2006 | Cok et al. |
| 2007/0007237 | A1 | 1/2007 | Wu et al. |
| 2007/0019131 | A1 | 1/2007 | Choi et al. |
| 2007/0047254 | A1 | 3/2007 | Schardt et al. |
| 2007/0116424 | A1 | 5/2007 | Ting et al. |
| 2007/0165394 | A1 | 7/2007 | Chang |
| 2007/0176195 | A1 | 8/2007 | Kuiseko et al. |
| 2007/0242477 | A1 | 10/2007 | Yoo et al. |
| 2007/0256453 | A1 | 11/2007 | Barnes et al. |
| 2008/0043466 | A1 | 2/2008 | Chakmakjian et al. |
| 2008/0089093 | A1 | 4/2008 | Miller et al. |
| 2008/0123350 | A1 | 5/2008 | Choe et al. |
| 2008/0225523 | A1 | 9/2008 | Samber et al. |
| 2008/0237612 | A1 | 10/2008 | Cok |
| 2008/0258162 | A1 | 10/2008 | Koung et al. |
| 2008/0315755 | A1 | 12/2008 | Han |
| 2009/0001869 | A1 | 1/2009 | Tanimoto et al. |
| 2009/0086508 | A1 * | 4/2009 | Bierhuizen .......... G02B 6/0018 362/617 |
| 2009/0109656 | A1 | 4/2009 | Chang |
| 2009/0128735 | A1 | 5/2009 | Larson et al. |
| 2009/0242929 | A1 | 10/2009 | Lin |
| 2009/0268428 | A1 | 10/2009 | Tsukada |
| 2009/0296389 | A1 | 12/2009 | Hsu |
| 2010/0097809 | A1 | 4/2010 | Munro et al. |
| 2010/0165635 | A1 | 7/2010 | Chen et al. |
| 2010/0171215 | A1 | 7/2010 | Fischer et al. |
| 2010/0195330 | A1 | 8/2010 | Schaefer et al. |
| 2010/0258543 | A1 | 10/2010 | Mizuno et al. |
| 2010/0295762 | A1 | 11/2010 | Yeom et al. |
| 2010/0317132 | A1 | 12/2010 | Rogers et al. |
| 2011/0018860 | A1 | 1/2011 | Parry-Jones et al. |
| 2011/0038150 | A1 | 2/2011 | Woodgate et al. |
| 2011/0090672 | A1 | 4/2011 | Zhu et al. |
| 2011/0194034 | A1 | 8/2011 | Shimizu |
| 2011/0255303 | A1 | 10/2011 | Nichol et al. |
| 2012/0086875 | A1 | 4/2012 | Yokota |
| 2012/0119237 | A1 | 5/2012 | Leatherdale et al. |
| 2012/0140462 | A1 | 6/2012 | Pickard |
| 2012/0258963 | A1 | 10/2012 | Berger et al. |
| 2013/0039062 | A1 | 2/2013 | Vintner et al. |
| 2013/0107525 | A1 | 5/2013 | Woodgate et al. |
| 2013/0258663 | A1 * | 10/2013 | Woodgate ................ F21K 9/64 362/236 |
| 2013/0293793 | A1 | 11/2013 | Lu |
| 2014/0098418 | A1 | 4/2014 | Lin |
| 2014/0140654 | A1 | 5/2014 | Brown et al. |
| 2014/0186979 | A1 * | 7/2014 | Tu ....................... H01L 33/0093 438/27 |
| 2014/0211462 | A1 | 7/2014 | Keller et al. |
| 2014/0211503 | A1 | 7/2014 | Tarsa |
| 2014/0240839 | A1 | 8/2014 | Yang et al. |
| 2014/0316742 | A1 | 10/2014 | Sun et al. |
| 2015/0054011 | A1 | 2/2015 | Koizumi et al. |
| 2015/0062490 | A1 * | 3/2015 | Kwon ............... G02F 1/133621 349/64 |
| 2015/0160396 | A1 | 6/2015 | Wilcox et al. |
| 2015/0268479 | A1 | 9/2015 | Woodgate et al. |
| 2015/0268513 | A1 | 9/2015 | Chang et al. |
| 2015/0295154 | A1 * | 10/2015 | Tu ........................... H01L 33/22 438/27 |
| 2015/0308635 | A1 | 10/2015 | Li et al. |
| 2016/0018077 | A1 | 1/2016 | Mallory et al. |
| 2016/0211413 | A1 | 7/2016 | Park et al. |
| 2016/0299281 | A1 | 10/2016 | Robinson et al. |
| 2017/0031085 | A1 | 2/2017 | Lim et al. |
| 2017/0045666 | A1 | 2/2017 | Vasylyev |
| 2017/0059127 | A1 * | 3/2017 | Jansma ................. F21V 7/0066 |
| 2017/0102127 | A1 | 4/2017 | Woodgate et al. |
| 2017/0139114 | A1 | 5/2017 | Woodgate et al. |
| 2017/0154919 | A1 | 6/2017 | Chen et al. |
| 2017/0205959 | A1 | 7/2017 | Seong |
| 2017/0248289 | A1 * | 8/2017 | Vasylyev ............. F21V 7/0083 |
| 2017/0161179 | A1 | 9/2017 | Wu et al. |
| 2017/0261179 | A1 | 9/2017 | Wu et al. |
| 2018/0014007 | A1 | 1/2018 | Brown |
| 2018/0226384 | A1 | 8/2018 | Park et al. |
| 2018/0321553 | A1 | 11/2018 | Robinson et al. |
| 2019/0086706 | A1 | 3/2019 | Robinson et al. |
| 2019/0139243 | A1 | 5/2019 | You et al. |
| 2019/0220121 | A1 | 7/2019 | Kim et al. |
| 2019/0250458 | A1 | 8/2019 | Robinson et al. |
| 2019/0265478 | A1 * | 8/2019 | Cok ..................... G02B 27/0172 |
| 2019/0278135 | A1 | 9/2019 | Woodgate et al. |
| 2019/0294004 | A1 | 9/2019 | Hashimoto |
| 2019/0377067 | A1 | 12/2019 | Han et al. |
| 2020/0049876 | A1 | 2/2020 | Watanabe et al. |
| 2020/0159055 | A1 | 5/2020 | Robinson et al. |
| 2020/0166783 | A1 | 5/2020 | Roy et al. |
| 2020/0259307 | A1 | 8/2020 | Sharma et al. |
| 2020/0321553 | A1 | 10/2020 | Kwon et al. |

FOREIGN PATENT DOCUMENTS

| | | |
|---|---|---|
| EP | 1835550 A2 | 9/2007 |
| EP | 1890343 A1 | 2/2008 |
| EP | 1986023 A1 | 10/2008 |
| EP | 2182783 A2 | 5/2010 |
| EP | 2595295 A1 | 5/2013 |
| GB | 2464102 A | 4/2010 |
| GB | 2484711 A | 4/2012 |
| JP | 2000323755 A | 11/2000 |
| JP | 2009295309 A | 12/2009 |
| JP | 2010238846 A | 10/2010 |
| JP | 2013219397 A | 10/2013 |
| WO | 2007074932 A | 7/2007 |
| WO | 2010038025 A | 4/2010 |
| WO | 2010038025 A2 | 4/2010 |
| WO | 2011131200 A1 | 10/2011 |
| WO | 2012052722 A | 4/2012 |
| WO | 2012052722 A2 | 4/2012 |
| WO | 2012052723 A1 | 4/2012 |
| WO | 2018185476 A | 10/2012 |
| WO | 2013064801 A1 | 5/2013 |
| WO | 2013112435 A1 | 8/2013 |
| WO | 2014043384 A1 | 3/2014 |

(56) References Cited

FOREIGN PATENT DOCUMENTS

| | | |
|---|---|---|
| WO | 2015089517 A1 | 6/2015 |
| WO | 2017007770 A2 | 1/2017 |
| WO | 2018185475 A1 | 10/2018 |
| WO | 2018185476 A1 | 10/2018 |
| WO | 2018208618 A1 | 11/2018 |
| WO | 2019067846 A1 | 4/2019 |
| WO | 2019107826 A1 | 6/2019 |

OTHER PUBLICATIONS

EP18200530.6—European Search Report of the European Patent Office dated May 23, 2019.

International search report and written opinion of international searching authority for PCT application PCT/GB2018/050893 dated Aug. 27, 2018.

International search report and written opinion of international searching authority for PCT application PCT/GB2018/050894 dated Aug. 27, 2018.

International search report and written opinion of international searching authority for PCT application PCT/GB2019/050076 dated May 9, 2019.

International search report and written opinion of international searching authority for PCT application PCT/US2019/021570 dated May 24, 2019.

International search report and written opinion of international searching authority for PCT application PCT/US2019/031526 dated Jul. 29, 2019.

International search report and written opinion of international searching authority for PCT application PCT/US2020/040686 dated Nov. 20, 2020.

International search report and written opinion of international searching authority for PCT application PCT/US2020/047383 dated Dec. 4, 2020.

International search report and written opinion of international searching authority for PCT application PCT/US2020/050460 dated Dec. 8, 2020.

International search report and written opinion of international searching authority for PCT application PCT/US2020/053864 dated Dec. 14, 2020.

International search report and written opinion of international searching authority for PCT application PCT/US2020/050527 dated Feb. 3, 2021.

International search report and written opinion of international searching authority for PCT application PCT/US2021/018544 dated Apr. 29, 2021.

* cited by examiner

COLOUR MICRO-LED DISPLAY APPARATUS

TECHNICAL FIELD

The present disclosure relates to colour micro-LED display apparatus comprising a plurality of addressable micro-LEDs aligned to an array of reflective optical elements and an array of wavelength conversion elements. Such an apparatus may be used as a high-resolution colour display apparatus.

BACKGROUND

In this specification, (except when qualified by the term packaged), "LED" or micro-LED refers to an unpackaged LED die chip extracted directly from a monolithic wafer, i.e. a semiconductor element. Micro-LEDs may be formed by array extraction methods in which multiple LEDs are removed from a monolithic epitaxial wafer in parallel and may be arranged with positional tolerances that are less than 5 micrometres.

This is different from packaged LEDs. Packaged LEDs have a lead-frame and plastic or ceramic package with solder terminals suitable for standard surface-mount PCB (printed circuit board) assembly. The size of the packaged LEDs and limits of PCB assembly techniques means that displays formed from packaged LEDs are difficult to assemble with pixel pitches below about 1 mm. The accuracy of components placed by such assembly machines is typically about plus or minus 30 micrometres. Such sizes and tolerances prevent application to very high-resolution displays.

One type of packaged LED display may provide colour pixels by means of arrays of packaged LEDs emitting in different wavelength bands. For example, arrays of packaged red LEDs, arrays of green emitting packaged LEDs and arrays of blue emitting packaged LEDs are soldered on to a PCB. Such displays do not use wavelength conversion layers or colour filters to achieve colour. The operating voltage of the different colour packaged LEDs is different from each other for such displays, adding cost and complexity to drive electronics. Further the emission efficiency of green direct emission is substantially lower than for red and blue emission, reducing display efficiency and brightness.

Liquid crystal displays (LCDs) typically provide colour images by means of white light backlights and an array of colour filters arranged at each pixel of the transmissive LCD. Organic LED (OLED) displays provide colour output either through white light emission from each pixel and an aligned colour filter or by direct red, green and blue emission from different OLED materials at each pixel.

Wavelength conversion materials such as phosphors or quantum dot materials can absorb light in one wavelength band for example blue and emit light in a different wavelength band, for example yellow. There is some blue transmitted through the phosphor resulting in yellow plus blue which appears as white.

Catadioptric optical elements combine refractive surfaces (dioptrics) and reflective surfaces (catoptrics), which may provide total internal reflection or reflection from metallised surfaces. Backlights employing catadioptric optical elements with small output luminous intensity solid angles are described in WO2010038025 incorporated by reference herein in its entirety.

BRIEF SUMMARY

It would be desirable to provide thin, flexible and free-form shape colour displays that have high luminance and high efficiency.

According to a first aspect of the present disclosure there is provided a colour display apparatus comprising: a plurality of LEDs arranged in an LED array, wherein the plurality of LEDs are unpackaged micro-LEDs; a plurality of reflective optical elements arranged in a reflective optical element array; and a plurality of wavelength conversion elements arranged in a wavelength conversion array, wherein each of the plurality of wavelength conversion elements is arranged to receive light emitted by one or more LEDs of the plurality of LEDs, convert the received light into light of a different colour wavelength hand, and output the light of a different colour wavelength band for display, wherein each of the plurality of reflective optical elements is arranged to re-direct at least part of the light emitted by one or more LEDs of the plurality of LEDs towards one or more of the plurality of wavelength conversion elements. Advantageously an emissive display may be provided with high resolution, high contrast, high efficiency and low power consumption. The display may be thin, flexible, curved, foldable and have low bezel width. Temperature of operation of wavelength conversion materials may be reduced, increasing efficiency and lifetime. Colour pixels may be provided with high colour gamut. Low cross talk between pixels may be achieved, to provide high image contrast. The colour output of the display may be substantially independent of viewing angle. Wavelength conversion materials with particle size similar to LED size may be used with high output efficiency, such that for example ground phosphor materials may be used with micro-LEDs while achieving high image resolution.

Each of the plurality of wavelength conversion elements may be spaced apart from the one or more LEDs that the wavelength conversion element is arranged to receive light from.

The LEDs may be arranged to emit light in an opposite direction to a direction in which the wavelength conversion elements output light for display.

The LEDs may be arranged to emit light in the same direction as a direction in which the wavelength conversion elements output light for display.

Each reflective optical element may comprise a reflective rear surface and reflective walls extending from the reflective rear surface, the reflective rear surface and reflective walls defining a space therebetween.

A transmissive material may be arranged in the space defined by the reflective rear surface and the reflective walls of each reflective optical element. Advantageously dimensional stability may be increased and susceptibility to pressure and moisture variations reduced. Advantageously the reliability and lifetime of the system is improved.

The reflective rear surface of each reflective optical element may comprise a reflective light input structure. Each of the plurality of LEDs may be aligned with a respective reflective light input structure. Advantageously light may be efficiently directed from the micro-LED increasing efficiency.

The light emitted by each of the plurality of LEDs may be of the same colour wavelength band. Advantageously the complexity of the micro-LED array fabrication may be reduced, reducing cost. Further the same drive voltage may be used for the array of micro-LEDs, reducing complexity of the control system.

The colour wavelength band of the light emitted by each of the plurality of LEDs may be blue light.

The colour wavelength band of the light emitted by each of the plurality of LEDs may be ultraviolet light.

The colour wavelength band of the light emitted by at least one of the LEDs of the plurality of LEDs may be red light and the colour wavelength band of the light emitted by at least one of the LEDs of the plurality of LEDs may be blue light or ultraviolet light. Advantageously the efficiency of red light output may be increased and fewer wavelength conversion elements may be provided, reducing complexity of the wavelength conversion array and reducing cost.

The wavelength conversion elements may comprise a phosphor or a quantum dot material. Advantageously known LED material systems such as gallium nitride may be used to provide high efficiency optical output. Further known wavelength conversion materials may be provided, reducing cost and complexity.

The wavelength conversion elements may be formed on the reflective rear surface of at least some of the reflective optical elements. Advantageously the wavelength conversion elements are remote from the micro-LEDs, reducing operating temperature and increasing efficiency. The area of the wavelength conversion elements may be larger than the micro-LED such that the positional tolerance for the regions may be relaxed, reducing cost.

Some of the reflective optical elements may be not aligned with wavelength conversion elements. Advantageously efficiency of output is increased. Further the complexity of the array of wavelength conversion elements is reduced, reducing cost.

Some of the reflective optical elements may be aligned with diffuser regions. Advantageously the colour output may be uniform with viewing angle.

The diffuser regions and/or wavelength conversion elements may be formed on a surface of the transmissive material.

Each micro-LED may be an LED that has a width that is at most 150 micrometres, preferably at most 100 micrometres and more preferably at most 50 micrometres. Advantageously a high-resolution display may be provided with high output efficiency.

The plurality of LEDs may be formed on a surface of the transmissive material. Advantageously wavelength conversion materials may be applied to a surface that may flat by printing or other known deposition methods.

The colour display apparatus may further comprise an output substrate. Advantageously output light from the reflective optical elements may be further controlled.

The wavelength conversion elements may be formed on a first side of the output substrate and the first side of the output substrate may face the reflective optical element. Advantageously the wavelength conversion elements may be conveniently aligned to the micro-LED array and reflective optical element array, reducing cost. Further the wavelength conversion elements may be provided at reduced cost.

The colour display apparatus may further comprise a colour filter array comprising a plurality of absorptive colour filter regions. The plurality of colour filter regions may be arranged in an array. Each of the colour filter regions may be aligned with only one respective reflective optical element of the reflective optical element array. The colour filter array may be formed on the output substrate. Advantageously, colour gamut may be increased.

Each of the plurality of LEDs may be formed between a respective optical reflective element and the output substrate.

The plurality of LEDs may be formed on the output substrate. Advantageously, the output substrate material may be provided that is resistant to processing conditions for micro-LED array assembly. Higher temperatures may be provided for micro-LED assembly, advantageously increasing reliability and efficiency. The entire array of micro-LEDs may be aligned to the entire array of reflective optical elements in a single alignment step, advantageously reducing cost.

The colour display apparatus may further comprise a control system arranged to address the plurality of LEDs with display pixel data to control the plurality of LEDs to emit light according to the display pixel data.

The control system may comprise a plurality of addressing electrodes arranged to provide colour pixel data to each LED of the plurality of LEDs. Advantageously a colour image may be provided.

The colour display apparatus may further comprise a plurality of light blocking elements arranged in an array. Each light blocking element may be aligned with a respective LED of the plurality of LEDs. The respective aligned LED may be arranged between the light blocking element and the reflective optical element. Advantageously colour gamut may be increased by preventing unwanted light propagating directly from the aligned micro-LED.

Each light blocking element may be reflective. Advantageously light from the micro-LED may be efficiently directed into the reflective optical element. Each light blocking element may be an addressing electrode. Advantageously cost and complexity may be reduced.

The output substrate may comprise an optical isolator comprising a linear polariser and at least one retarder. The at least one retarder may be a quarter waveplate. Advantageously unwanted reflections of ambient light from reflective internal surfaces may be reduced, increasing display contrast.

Each LED may be aligned with a respective reflective optical element.

At least one of the LEDs of the plurality of LEDs may be not aligned with a reflective optical element. Advantageously the complexity of the array of reflective optical elements may be reduced.

The reflective rear surface of each reflective optical element may comprise a white reflector. Advantageously a wide-angle output may be provided. The number fabrication steps may be reduced advantageously reducing cost and complexity.

The reflective rear surface of each reflective optical element may comprise a metal layer. Advantageously the efficiency of output for incident light may be increased.

The reflective rear surface of each reflective optical element may comprise a planar region. Advantageously light may be redirected within the reflective optical element, increasing uniformity of illumination across the reflective optical element.

The reflective rear surface of each reflective optical element may comprise a microstructure. Advantageously the output light may be scattered to provide wide angle luminance profile.

The reflective rear surface of each reflective optical element may define a well. A wavelength conversion element may be located within the well defined by the reflective rear surface of each reflective optical element. Advantageously wavelength conversion materials may be conveniently formed on the rear reflective surface. By contrast when phosphor is applied directly to the LED, the particles of phosphor should be smaller than the LED. Wavelength conversion particles that are large in comparison to micro-LEDs may be provided in the well with high output colour uniformity. Advantageously larger wavelength conversion particles may be cheaper than smaller ones.

A surface of the transmissive material may comprise a refractive input microstructure. The refractive input microstructure may be aligned with the reflective light input structure. Advantageously light may be efficiently directed from the micro-LED to the reflective rear surface.

In at least one cross-sectional plane the reflective light input structure may comprise at least one light deflecting surface. For each reflective optical element of the reflective optical element array, the at least one light deflecting surface may be arranged to direct at least some light from at least one LED towards a wavelength conversion element. The reflective light input structure may comprise at least one curved surface. The reflective light input structure may comprise at least one concave surface. Advantageously light may be efficiently coupled from the micro-LED to the output of the reflective optical element, increasing efficiency and reducing power consumption.

For each reflective optical element of the reflective optical element array, the reflective light input structure may be arranged to direct at least some light from at least one LED to be guided between a surface of the transmissive material and the reflective rear surface. Advantageously light may be redistributed within the reflective optical element, increasing uniformity of output.

A catadioptric optical element may be aligned with each reflective optical element. The catadioptric optical element may comprise in at least one catadioptric cross-sectional plane through its optical axis: a first outer surface and a second outer surface facing the first outer surface. The first and second outer surfaces may comprise curved surfaces. The first and second outer surfaces may extend from a first end of the catadioptric optical element to a second end of the catadioptric optical element, the second end of the catadioptric optical element facing the first end of the catadioptric optical element. The distance between the first and second outer surfaces at the first end of the catadioptric optical element may be less than the distance between the first and second outer surfaces at the second end of the catadioptric optical element. At least one transparent inner surface may be arranged between the first and second ends and between the first and second outer surfaces. Advantageously a directional display may be provided. Privacy display operation may be achieved, that may be switched between a narrow angle and wide-angle mode of operation. Further power consumption may be reduced for an observer in a head-on direction. Further stray light may be reduced for off-axis viewing positions providing low display leakage for night-time operation.

According to a second aspect of the present disclosure there is provided a colour display apparatus comprising: a plurality of LEDs, the plurality of LEDs being arranged in an LED array, wherein the LEDs of the plurality of LEDs are micro-LEDs; a control system arranged to address the plurality of LEDs with display pixel data to provide input light; a reflective optical element array comprising a plurality of reflective optical elements, the plurality of reflective optical elements being arranged in an array; wherein each reflective optical element of the reflective optical element array comprises: (i) a reflective rear surface; (ii) reflective walls extending away from the reflective rear surface (iii) a light transmission opening arranged between the reflective walls and facing the reflective rear surface wherein each reflective optical element is aligned in correspondence with a respective one or more LEDs of the plurality of LEDs, the LEDs of the plurality of LEDs that are aligned with reflective optical elements being aligned with only a respective one of the reflective optical elements; a wavelength conversion array comprising a plurality of wavelength conversion elements, the plurality of wavelength conversion elements being arranged in an array, wherein each of the wavelength conversion elements is aligned with only a respective one of the reflective optical elements; wherein input light from the respective aligned at least one LED is input through at least one light input region of the light transmission opening and is output through at least one light output region different from the light input region of the light transmission opening after incidence on at least one of the reflective rear surface and the respective aligned wavelength conversion element. Advantageously an emissive display may be provided with high resolution, high contrast, high efficiency and low power consumption. The display may be thin, flexible, curved, foldable and have low bezel width. Temperature of operation of wavelength conversion materials may be reduced, increasing efficiency and lifetime. Colour pixels may be provided with high colour gamut. Low cross talk between pixels may be achieved, to provide high image contrast. The colour output of the display may be substantially independent of viewing angle. Wavelength conversion materials with particle size similar to LED size may be used with high output efficiency, such that for example around phosphor materials may be used with micro-LEDs while achieving high image resolution.

A transmissive material may be arranged between the reflective rear surface, the reflective walls and the light transmission opening, and the light transmission opening comprises a transmissive front surface. Advantageously dimensional stability may be increased and susceptibility to pressure and moisture variations reduced. Advantageously the reliability and lifetime of the system is improved.

The reflective rear surface may comprise a reflective light input structure; wherein the LEDs of the plurality of LEDs that are aligned with reflective optical elements may be aligned with the reflective light input structure. Advantageously light may be efficiently directed from the micro-LED increasing efficiency.

The input light from each of the LEDs of the plurality of LEDs may be of the same colour wavelength band. Advantageously the complexity of the micro-LED array fabrication may be reduced, reducing cost. Further the same drive voltage may be used for the array of micro-LEDs, reducing complexity of the control system.

The input light colour wavelength band may be blue light or may be ultraviolet light. Each of the wavelength conversion elements may be arranged to convert the input light colour wavelength band to visible light of a different colour wavelength band. The wavelength conversion elements may comprise a phosphor or a quantum dot material. Advantageously known LED material systems such as gallium nitride may be used to provide high efficiency optical output. Further known wavelength conversion materials may be provided, reducing cost and complexity.

The input light colour wavelength band from some of the LEDs of the plurality of LEDs may be red light and the input light colour wavelength band from some of the LEDs of the plurality of LEDs may be blue light or ultraviolet light. Advantageously the efficiency of red light output may be increased and fewer wavelength conversion elements may be provided, reducing complexity of the wavelength conversion array and reducing cost.

The wavelength conversion elements may be formed on the reflective rear surface of at least some of the reflective optical elements. Advantageously the wavelength conversion elements are remote from the micro-LEDs, reducing operating temperature and increasing efficiency. The area of the wavelength conversion elements may be larger than the micro-LED such that the positional tolerance for the regions may be relaxed, reducing cost.

Some of the reflective optical elements may not be aligned with wavelength conversion elements. Advantageously efficiency of output is increased. Further the complexity of the array of wavelength conversion elements is reduced, reducing cost.

Some of the reflective optical elements may be aligned with diffuser regions. Advantageously the colour output may be uniform with viewing angle.

The diffuser regions and/or wavelength conversion elements may be formed on the output regions of the transmissive front surface. Advantageously wavelength conversion materials may be applied to a surface that may flat by printing or other known deposition methods.

Each micro-LED may be an LED that has a width that is at most 150 micrometres, preferably at most 100 micrometres and more preferably at most 50 micrometres. Advantageously a high-resolution display may be provided with high output efficiency.

The colour display apparatus may further comprise an output substrate. Advantageously output light from the reflective optical elements may be further controlled.

The wavelength conversion elements may be formed on a first side of the output substrate and the first side of the output substrate may face the light transmission opening of the reflective optical element. Advantageously the wavelength conversion elements may be conveniently aligned to the micro-LED array and reflective optical element array, reducing cost. Further the wavelength conversion elements may be provided at reduced cost.

The colour display apparatus may further comprise a colour filter array comprising a plurality of absorptive colour filter regions, the plurality of colour filter regions being arranged in an array. Each of the colour filter regions may be aligned in correspondence with a light output region of the light transmission opening of only one of the respective reflective optical elements of the reflective optical element array. The colour filter array may be formed on the output substrate. Advantageously, colour gamut may be increased.

The plurality of LEDs may be formed between the transmissive front surface and the output substrate. The plurality of LEDs is formed on the transmissive front surface. Advantageously the complexity of the output substrate may be reduced, reducing cost. The plurality of LEDs may be formed on the output substrate. The output substrate material may be provided that is resistant to processing conditions for micro-LED array assembly. Higher temperatures may be provided for micro-LED assembly, advantageously increasing reliability and efficiency. The entire array of micro-LEDs may be aligned to the entire array of reflective optical elements in a single alignment step, advantageously reducing cost.

The control system may comprise a plurality of addressing electrodes arranged to provide colour pixel data to each LED of the plurality of LEDs. Advantageously a colour image may be provided.

The colour display apparatus may further comprise a plurality of light blocking elements, the plurality of light blocking elements being arranged in an array; wherein each of the light blocking element is aligned in correspondence with a LED of the plurality of LEDs and the respective aligned LED is arranged between the light blocking element and the reflective optical element for each light blocking element. Advantageously colour gamut may be increased by preventing unwanted light propagating directly from the aligned micro-LED.

Each light blocking element may be reflective. Advantageously light from the micro-LED may be efficiently directed into the reflective optical element. Each light blocking element may comprise an addressing electrode. Advantageously cost and complexity may be reduced.

The output substrate may comprise an optical isolator comprising a linear polariser and at least one retarder. The at least one retarder may be a quarter waveplate. Advantageously unwanted reflections of ambient light from reflective internal surfaces may be reduced, increasing display contrast.

Some of the LEDs of the plurality of LEDs may not be aligned to a reflective optical element. Advantageously the complexity of the array of reflective optical elements may be reduced.

The reflective rear surface may comprise a white reflector. Advantageously a wide-angle output may be provided. The number fabrication steps may be reduced advantageously reducing cost and complexity.

The reflective rear surface may comprise a metal layer. Advantageously the efficiency of output for incident light may be increased.

The reflective rear surface may comprise a planar region. Advantageously light may be redirected within the reflective optical element, increasing uniformity of illumination across the reflective optical element. The reflective rear surface may comprise a microstructure. Advantageously the output light may be scattered to provide wide angle luminance profile.

The reflective rear surface may comprise a recess or well. The well may comprise a wavelength conversion element. Advantageously wavelength conversion materials may be conveniently formed on the rear reflective surface. By contrast when phosphor is applied directly to the LED, the particles of phosphor should be smaller than the LED. Wavelength conversion particles that are large in comparison to micro-LEDs may be provided in the well with high output colour uniformity. Advantageously larger wavelength conversion particles may be cheaper than smaller ones.

The light input region of the transmissive front surface may comprise a refractive input microstructure. The refractive input microstructure may be aligned to the reflective light input structure. Advantageously light may be efficiently directed from the micro-LED to the reflective rear surface.

In at least one cross-sectional plane through its optical axis the reflective light input structure may comprise at least one light deflecting surface; wherein for each reflective optical element of the reflective optical element array, the at least one light deflecting surface may be arranged to direct at least some light from the respective aligned at least one LED towards the at least one light transmission opening output region. The reflective light input structure may comprise at least one curved surface. The reflective light input structure may comprise at least one concave surface. Advantageously light may be efficiently coupled from the micro-LED to the output of the reflective optical element, increasing efficiency and reducing power consumption.

For each reflective optical element of the reflective optical element array, the reflective light input structure may be arranged to direct at least some light from the respective aligned at least one LED to guide between the transmissive front surface and the reflective rear surface. Advantageously light may be redistributed within the reflective optical element, increasing uniformity of output.

A catadioptric optical element may be aligned with the output region of each reflective optical element. The catadioptric optical element may comprise in at least one catadioptric cross-sectional plane through its optical axis: a first outer surface and a second outer surface facing the first outer surface; wherein the first and second outer surfaces comprise curved surfaces; wherein the first and second outer surfaces extend from a first end of the catadioptric optical element to a second end of the catadioptric optical element, the second end of the catadioptric optical element facing the first end of the catadioptric optical element; wherein the distance between the first and second outer surfaces at the first end of the catadioptric optical element is less than the distance between the first and second outer surfaces at the second end of the catadioptric optical element; and at least one transparent inner surface is arranged between the first and second ends and between the first and second outer surfaces. Advantageously a directional display may be provided. Privacy display operation may be achieved, that may be switched between a narrow angle and wide-angle mode of operation. Further power consumption may be reduced for an observer in a head-on direction. Further stray light may be reduced for off-axis viewing positions providing low display leakage for night-time operation.

Such an apparatus may be used for colour display and for directional display.

These and other features and advantages of the present disclosure will become apparent to those of ordinary skill in the art upon reading this disclosure in its entirety.

BRIEF DESCRIPTION OF THE DRAWINGS

Embodiments are illustrated by way of example in the accompanying figures, wherein like reference numbers indicate similar parts.

DETAILED DESCRIPTION

Figure 1:
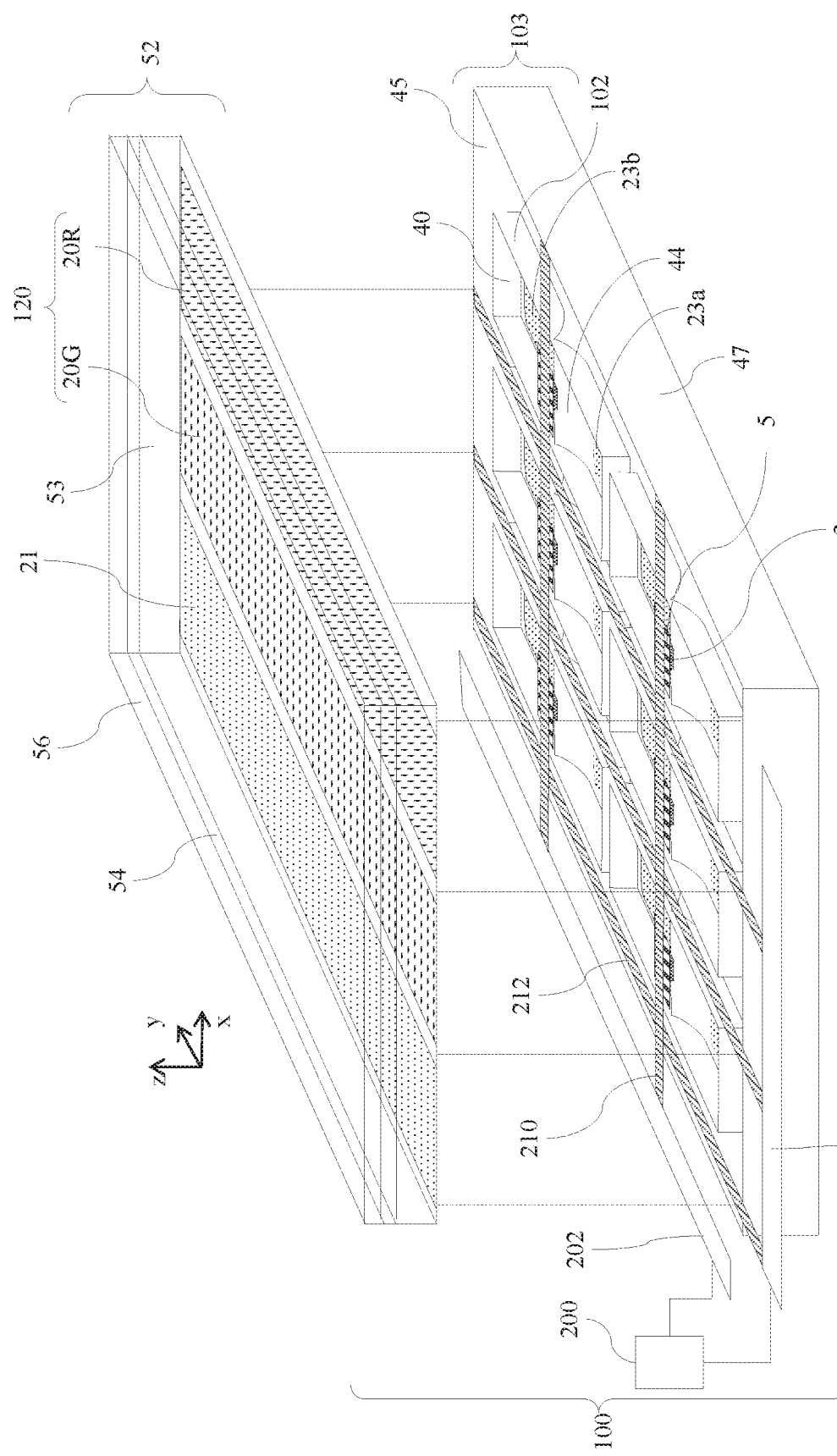
FIG. 1 is a schematic diagram illustrating in side perspective view a colour display apparatus comprising an array of micro-LEDs, an array of wavelength conversion elements and an array of reflective optical elements wherein the micro-LEDs are arranged on the reflective optical elements.

It would be desirable to provide a micro-LED colour display apparatus that is a spatial light modulator that is addressed with colour pixel information and achieves high luminous efficiency, colour fidelity and colour uniformity over a wide viewing angle. Further it would be desirable to provide illumination of wavelength conversion materials in a manner that minimises degradation of performance with time and protects such materials from environmental degradations.

The structure and operation of various switchable display devices will now be described. In this description, common elements have common reference numerals. It is noted that the disclosure relating to any element applies to each device in which the same or corresponding element is provided. Accordingly, for brevity such disclosure is not repeated.

A colour display apparatus comprising an array of micro-LEDs 3 and an array 120 of wavelength conversion elements will now be described.

Figure 2A:
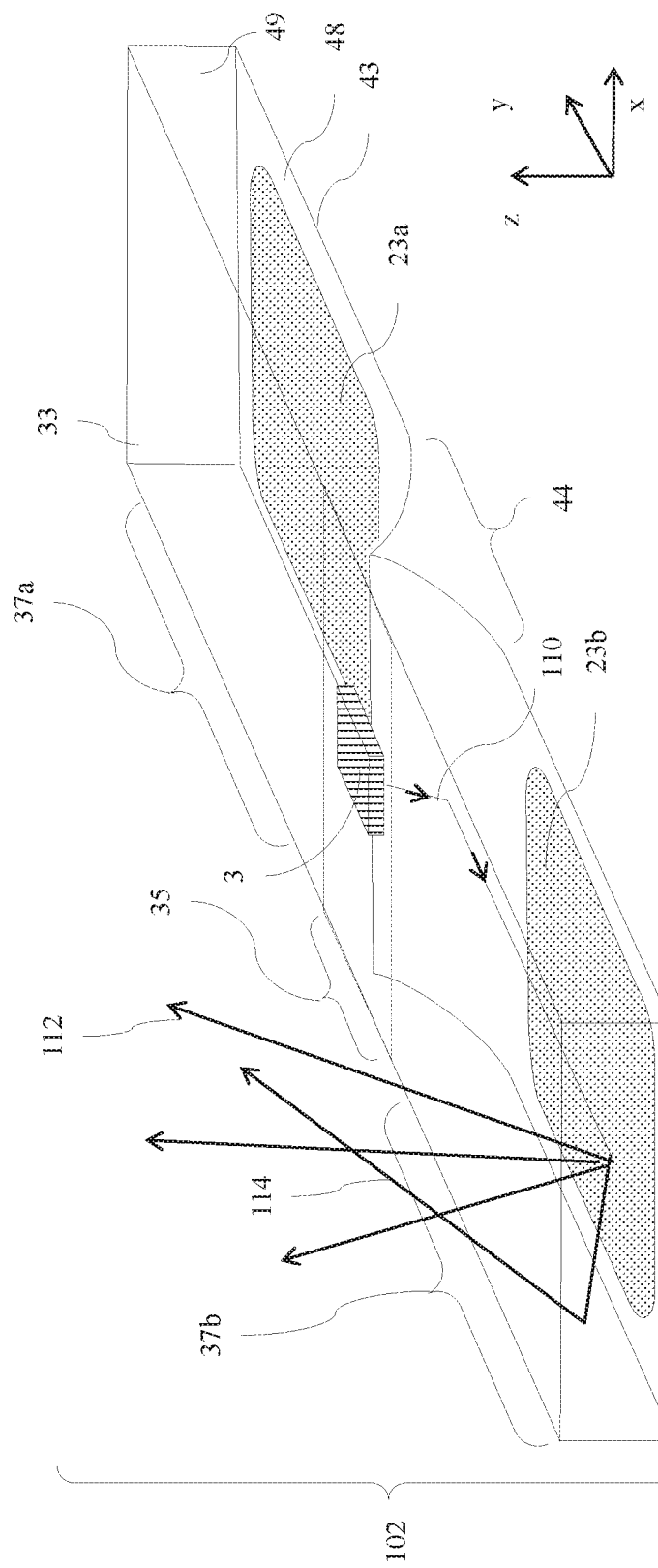
FIG. 2A is a schematic diagram illustrating in side perspective view a reflective optical element and an aligned micro-LED arranged to provide pixel illumination wherein the reflective optical element comprises a diffusing reflective surface.

FIG. 1 is a schematic diagram illustrating in side perspective view a colour display apparatus 100 comprising an array of micro-LEDs 3, an array 120 of wavelength conversion elements 20R, 20G and an array 103 of reflective optical elements 102 wherein the micro-LEDs 3 are arranged on the reflective optical elements 102; FIG. 2A is a schematic diagram illustrating in side perspective view a reflective optical element 102 and an aligned micro-LED 3 of FIG. 1 arranged to provide pixel illumination wherein the reflective optical element 102 comprises a diffusing reflective surface 23a, 23b; FIG. 29 is a schematic diagram illustrating in side view a reflective optical element, a micro-LED 3 and light blocking element 5; and FIG. 2C is a schematic diagram illustrating in front view a reflective optical element 102, a micro-LED 3 and light blocking element 5.

FIG. 1 illustrates a colour display apparatus 100 that comprises: a plurality of LEDs, the plurality of LEDs being arranged in an LED array, wherein the LEDs of the plurality of LEDs are micro-LEDs 3.

The micro-LEDs 3 are unpackaged micro-LEDs, that is they are semiconductor dies that are extracted directly from a monolithic wafer, i.e. a semiconductor element. Unpackaged micro-LEDs may be formed by array extraction methods in which multiple LEDs are removed from a monolithic epitaxial wafer in parallel and may be arranged with positional tolerances that are less than 5 micrometres. This is different from packaged LEDs. Packaged LEDs have a lead-frame and plastic or ceramic package with solder terminals suitable for standard surface-mount PCB (printed circuit board) assembly. The size of the packaged LEDs and limits of PCB assembly techniques means that displays formed from packaged LEDs are difficult to assemble with pixel pitches below about 1 mm. The accuracy of components placed by such assembly machines is typically about plus or minus 30 micrometres. Such sizes and tolerances prevent application to very high-resolution displays.

The reflective optical element array 103 may be formed as an integrated body, such that the array 103 of reflective optical elements 102 provide a substrate on which the micro-LEDs 3 are formed. In the embodiment of FIGS. 1-2C the micro-LEDs 3 are in a micro-LED array formed on the integrated body with the reflector array. In other embodiments described below the micro-LEDs may be formed on a separate substrate which is aligned with the array 103 of reflective optical elements 102. The micro-LEDs 3 may be transferred by parallel transfer methods as described below to the reflective optical element array 103. Thus the alignment between the micro-LEDs 3 and reflective optical element array 103 may be achieved in a single step or a small number of steps as opposed to aligning each individual reflector with each individual micro-LED. The position of the micro-LEDs 3 and reflective optical elements 102 may be defined or formed with lithographic precision so that the array alignment may be achieved with high precision. Advantageously uniformity is increased and alignment time and costs are reduced. The wavelength conversion materials may be provided with lower precision compared to that provided for the micro-LEDs and reflective optical elements. Advantageously lower cost methods may be provided for forming the array 120 of wavelength conversion elements 20.

The colour display apparatus thus comprises: a plurality of LEDs that are unpackaged LEDs arranged in an LED array, wherein the plurality of LEDs are micro-LEDs 3; a plurality of reflective optical elements 102 arranged in a reflective optical element array 103; and a plurality of wavelength conversion elements 20 arranged in a wavelength conversion array 120, wherein each of the plurality of wavelength conversion elements 20 is arranged to receive light emitted by one or more LEDs 3 of the plurality of LEDs, convert the received light into light of a different colour wavelength band, and output the light of a different colour wavelength band for display, wherein each of the plurality of reflective optical elements 102 is arranged to re-direct at least part of the light emitted by one or more LEDs 3 of the plurality of LEDs towards one or more of the plurality of wavelength conversion elements 20. Each of the plurality of wavelength conversion elements 20 is spaced apart from the one or more LEDs 3 that the wavelength conversion element 20 is arranged to receive light from.

In a large size TV application colour sub-pixel pitch may be typically of order 200×600 micrometres, with a full colour pixel pitch of 600×600 micrometres for an RGB stripe pixel arrangement. Micro-LED 3 sizes of approximately 100 micrometres or less may be typically provided for each colour sub-pixel. In mobile displays such as for a cell phone application, colour sub-pixel pitch may be typically of order 20×60 micrometres. For such pixels micro-LED 3 sizes of 10 micrometres or less may be provided. In the present disclosure, a micro-LED 3 is an LED that has a width or diameter that is at most 150 micrometres, preferably at most 100 micrometres and more preferably at most 50 micrometres. The micro-LEDs 3 of the array of micro-LEDs may be square, rectangular or other shapes such as circular.

A control system is arranged to address the plurality of micro-LEDs 3 with display pixel data to provide input light and comprises a plurality of addressing electrodes 210, 212 arranged to provide colour pixel data to each micro-LED 3 of the plurality of micro-LEDs 3. The control system further comprises row and column electrode drivers 202, 204 and a controller 200 arranged to provide image data to the drivers 202, 204. The control system may also comprise additional circuitry including but not limited to thin film transistors, capacitors, ICs or transistors located within the array of micro-LEDs 3 and adjacent to the micro-LEDs 3.

In the present embodiments, the area of the micro-LEDs 3 may be substantially less than the total pixel area defined by pixel pitch. Further electronics, for example for touch sensing may be provided between the micro-LEDs 3. Controller 200 may also be arranged to process and sense measurement data from touch sensors (not shown).

A reflective optical element array 103 comprises a plurality of reflective optical elements 102, the plurality of reflective optical elements 102 being arranged in an array. The reflective optical element may be formed in or on an optical body 47. Transmissive material 40 may be provided between the reflective rear surface 43 and transmissive front surface 33.

The colour display apparatus 100 further comprises an output substrate 52 that is transmissive and arranged to receive light from the reflective optical element array 103. The plurality of micro-LEDs 3 is formed between the transmissive front surface 33 and the output substrate 52.

Figure 2B:
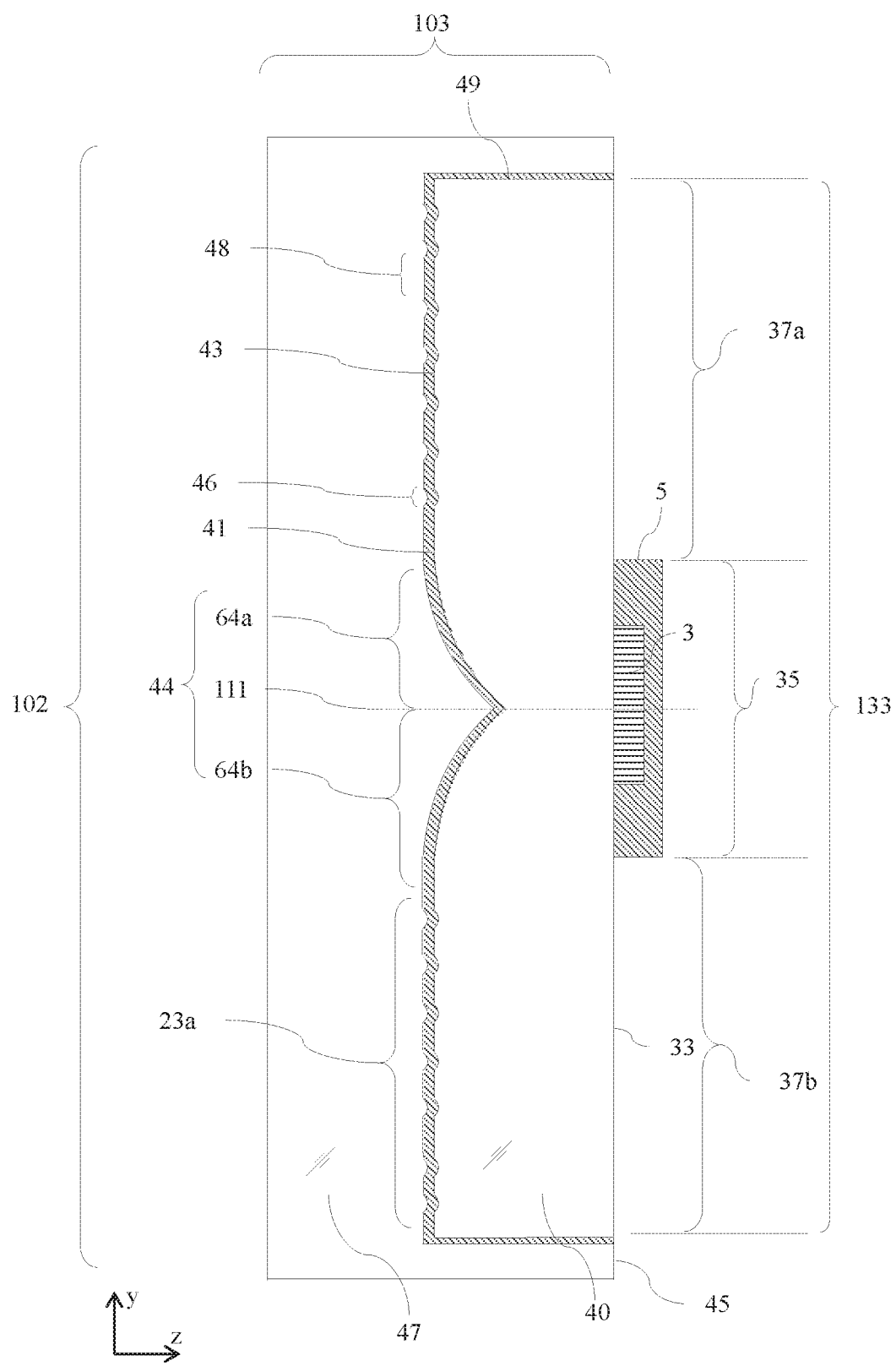
FIG. 2B is a schematic diagram illustrating in side view a reflective optical element, a micro-LED and light blocking element.
Figure 2C:
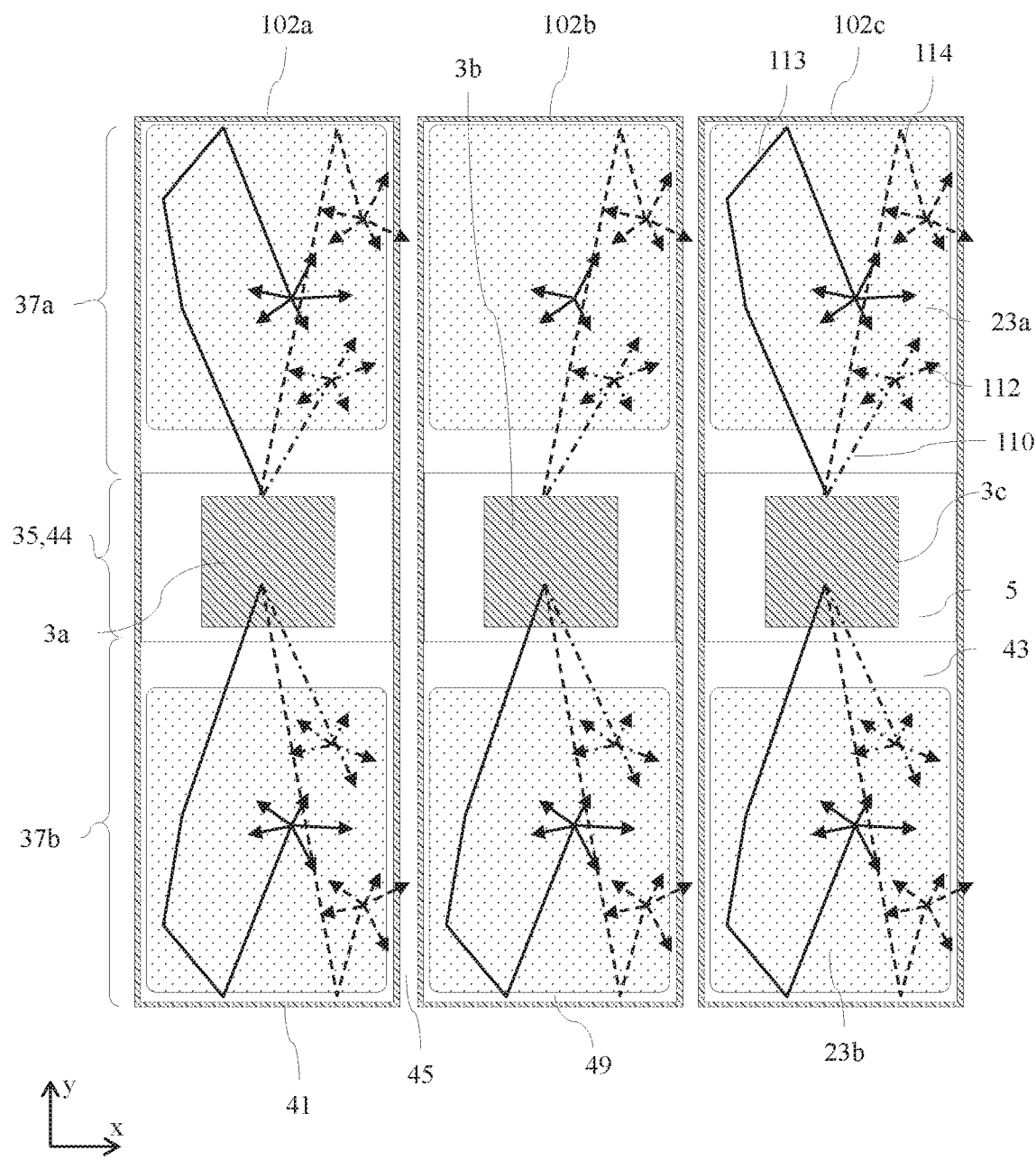
FIG. 2C is a schematic diagram illustrating in front view a reflective optical element, a micro-LED and light blocking element.

As illustrated further in FIGS. 2A-C, each reflective optical element 102 of the reflective optical element array 103 comprises: (i) a reflective rear surface 43 (ii) reflective walls 49 extending away from the reflective rear surface 43 and (iii) a light transmission opening 133 arranged between the reflective walls 49 and facing the reflective rear surface 43.

Transmissive material 40 is arranged between the reflective rear surface 43, the reflective walls 49 and the light transmission opening 133, and the light transmission opening comprises a transmissive front surface 33.

The reflective rear surface 43 further comprises a reflective light input structure 44; wherein the micro-LEDs 3 of the plurality of LEDs that are aligned with reflective optical elements 102 are aligned with the reflective light input structure 44 for example through optical axis 111 that is centred on the reflective optical element 102 and micro-LED 3.

In other words, each reflective optical element 102 of the reflective optical element array 103 comprises (i) a transmissive front surface 33 comprising a light input region 35 and at least one light output region 37a, 37b; (ii) a reflective rear surface 43 facing the transmissive front surface 33 comprising a reflective light input structure 44 wherein the reflective light input structure 44 is aligned with the light input region 35; (iii) reflective walls 49 extending between the reflective rear surface 43 and the transmissive front surface 33. The walls 49 of neighbouring optical elements 102 are separated by the upper surface 45 of body 47.

As illustrated in FIG. 2C, adjacent reflective optical elements 102a, 102b, 102c may be provided with independently addressed micro-LEDs 3a, b, 3c. Thus, reflective optical elements 102a, 102b, 102c may be addressed with red, green and blue pixel data respectively. Further reflective optical elements 102 (not shown) that are addressed with data for further colours such as yellow and white may be further provided.

Each reflective optical element 102 is aligned in correspondence with a respective one or more micro-LEDs 3 of the plurality of micro-LEDs, the micro-LEDs 3 of the plurality of micro-LEDs that are aligned with reflective optical elements 102 being aligned with only a respective one of the reflective optical elements 102.

The light input region 35 of each reflective optical element 102 is aligned in correspondence with a respective one or more micro-LEDs 3a, 3b, 3c of the plurality of micro-LEDs 3, each of the micro-LEDs 3 of the plurality of micro-LEDs 3 that are aligned with reflective optical elements 102a, 102b, 102c being aligned with only a respective one of the reflective optical elements 102a, 102b, 102c.

The colour display apparatus 100 further comprises a plurality of light blocking elements 5, the plurality of light blocking elements 5 being arranged in an array. Each of the light blocking elements 5 is aligned in correspondence with a micro-LED 3 of the plurality of micro-LEDs 3 and the respective aligned micro-LED 3 is arranged between the light blocking element 5 and the reflective optical element 102 for each light blocking element 5. The light blocking element may also function as a component such as an electrode or capacitor plate in the addressing of the micro-LEDs 3.

In operation, micro-LED 3 is arranged to input input light rays 110 through the light input region 35 of the transmissive front surface 33. Light blocking element 5 may be reflective and may be arranged to block or to reflect light rays from the micro-LED 3 that are otherwise directed away from the light input region 35. In other words, the light output from the micro-LED 3 is directed away from the output direction of the display 100.

Each light blocking element 5 may also be an addressing electrode, for example connected to electrode 210. The light blocking element 5 may provide a large area attachment electrode for the micro-LED, advantageously achieving convenient tolerance for micro-LED 3 mounting and for connection to the addressing electrodes 210 or 212.

The reflective rear surface 43 and reflective walls 49 may comprise a reflective coating 41 that may be a metal coating or a white reflective coating. Alternatively, the material of the optical body 47 may be a white material such as CEL-W epoxy material marketed by Hitachi Chemical, such that reflective coating 41 may be omitted, advantageously reducing cost and fabrication complexity.

As illustrated in FIG. 2B, the reflective rear surface 43 may further comprise a microstructure in light diffusing regions 23 comprising surface relief structures 46 and may further comprise planar regions 48.

In at least one cross-sectional plane the reflective light input structure 44 comprises a first light deflecting surface 64a and a second light deflecting surface 64b wherein the first and second light deflecting surfaces 64a, 64b are arranged to direct to first and second regions of the reflective optical element 102.

In operation, some of the input light rays 110 from micro-LED 3 are incident on reflective light input structure 44 and are deflected so as to be incident onto light diffusing regions 23a, 23b as will be described further below.

Input light rays 110 that are not incident on input structure 44 are incident directly on the light diffusing regions 23a, 23b of the reflective rear surface 43.

Light rays 110 incident on microstructure 46 of the light diffusing regions 23a, 23b of the reflective rear surface 43 are diffused as output light such that light rays 112 are transmitted through the light output region 37a, 37b of the transmissive front surface 33. As will be described below, some light rays 113 may be guided within the reflective optical element 113. Further some light rays 114 may be reflected by reflective walls 49 that may be diffusive or planar.

The light blocking layer 5 prevents light output from the input region 35 of the transmissive front surface and the input structure 44 efficiently directs input light onto the light diffusing regions 23a, 23b. Advantageously the output regions 37a, 37b of the transmissive front surface 33 are efficiently filled with light from the micro-LED.

Light from micro-LED 3b is constrained within a single reflective optical element 102b before output at transmissive front surface 33 output region 35. The light output from each reflective optical element 102b is optically separated from adjacent elements 102a, 102c. Advantageously cross talk between adjacent optical outputs is reduced and high contrast may be achieved.

Light ray propagation in the display apparatus 100 will now be further described.

Figure 3A:
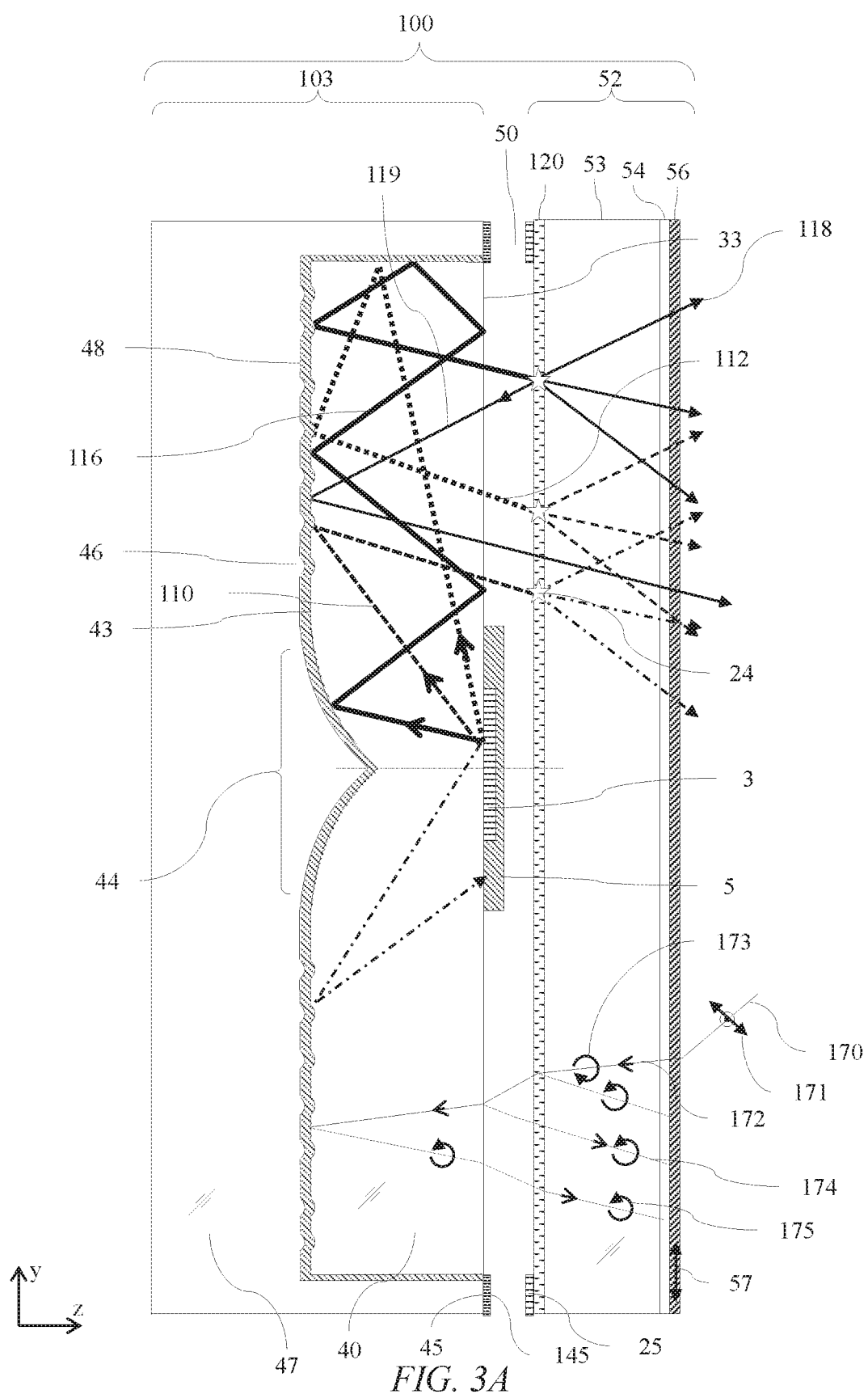
FIG. 3A is a schematic diagram illustrating in side view operation of a reflective optical element, a micro-LED and aligned wavelength conversion element wherein the output substrate is separated from the reflective optical element.

FIG. 3A is a schematic diagram illustrating in side view operation of a reflective optical element 102, a micro-LED 3 and aligned wavelength conversion array 120 wherein the output substrate 52 is separated from the reflective optical element 102.

Gap 50 is provided between the reflective optical element 102 and output substrate 52.

Light output from the micro-LED 3 is typically Lambertian, that is the highest luminous intensity of output is in the normal direction (parallel to the z direction).

The reflective light input structure 44 comprises a curved surface that is a concave surface. In operation light rays that are emitted in the normal direction from the micro-LED are directed towards the light diffusing regions 23 and not towards the micro-LED 3 and light blocking element 5. By way of comparison, when the reflective light input structure 44 is planar, then light will be reflected back towards the micro-LED 3 and light blocking element 5. Advantageously the reflective light input structure 44 increases display light output efficiency.

For each reflective optical element 102 of the reflective optical element array 103, the reflective light input structure 44 is arranged to direct at least some light rays 110 from the respective aligned at least one micro-LED 3 to guide as light rays 116 between the transmissive front surface 33 and the reflective rear surface 43 in the transmissive material 40. Planar regions 48 on the reflective rear surface 43 between microstructure 48 elements provide guiding of light from the reflective rear surface 43. Light rays 110 are distributed over the light diffusing regions 23a, 23b. Advantageously such distribution of light in the reflective optical element 102 reduces the peak energy density of light at the wavelength conversion elements and achieves higher efficiency and increased lifetime as will be further described below.

FIG. 3A further illustrates light ray propagation in the output substrate 52. Wavelength conversion array 120 is arranged on the input side of a transparent support substrate 53. Light rays 112 from the output regions 37 of the transmissive front surface 33 of the reflective optical element 102 incident on wavelength conversion element of array 120 an undergo wavelength conversion at wavelength conversion location 24. An optical isolator comprising retarder 54 and polariser 56 is arranged on the output side of transparent support substrate 53, operation of which will be described further below.

The output substrate 52 comprises an optical isolator comprising a linear polariser and at least one retarder. The at least one retarder is a quarter waveplate.

The upper surface 45 of body 47 may further be provided with a coating 145. The coating may be provided in the same step used to provide reflective coating 41, advantageously reducing cost. The optical isolator removes visibility of reflections from the surface 45. Alternatively, an absorbing coating 145 may be provided on the upper surface 45 of body 47. The array 120 of wavelength converting elements 20 may further be provided with an absorbing mask 25. Advantageously stray light from the reflective optical elements may be prevented from propagating between adjacent reflective optical elements, improving cross talk.

Features of the arrangement of FIG. 3A not discussed in further detail may be assumed to correspond to the features with equivalent reference numerals as discussed above, including any potential variations in the features.

Figure 3B:
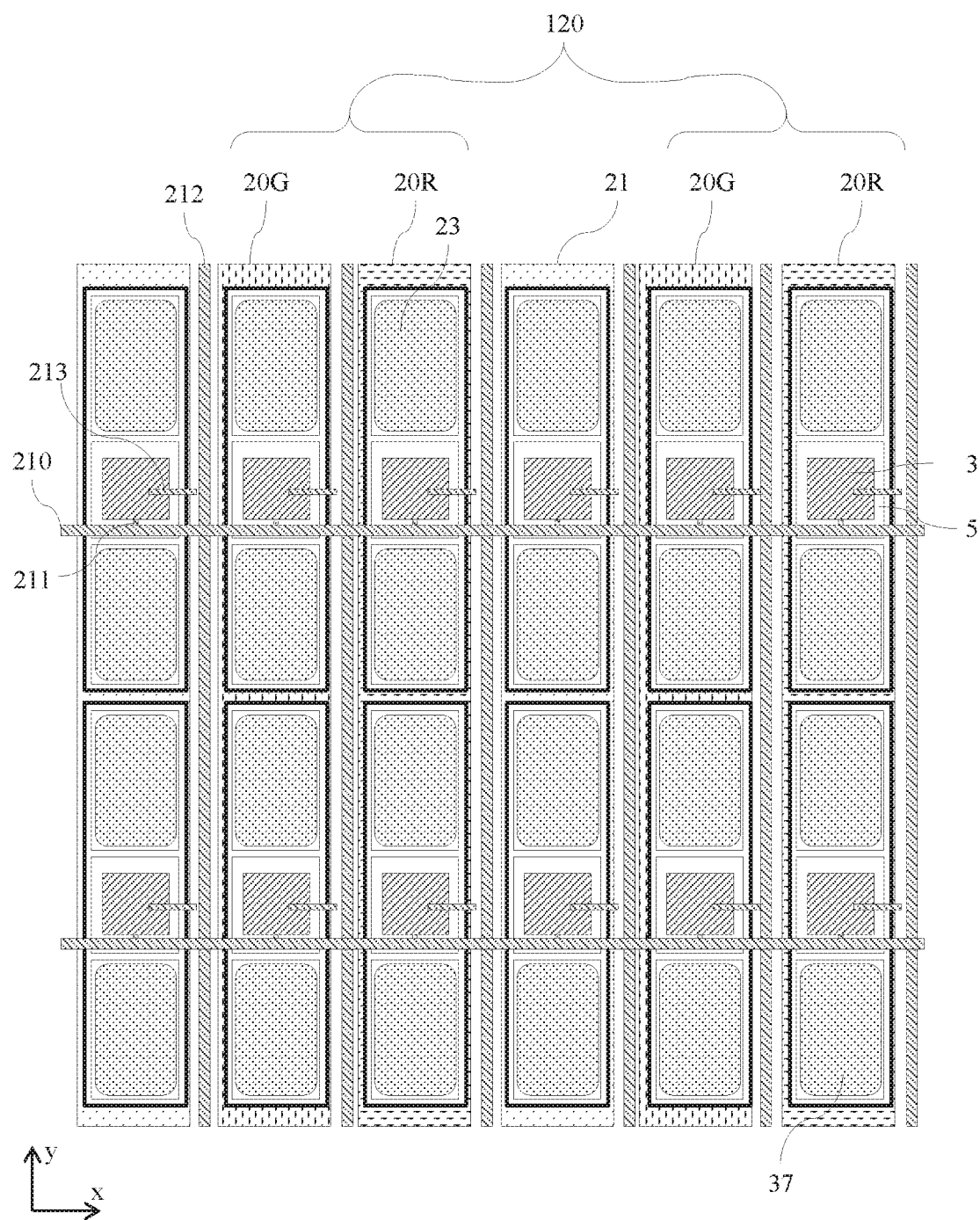
FIG. 3B is a schematic diagram illustrating in front view alignment of reflective optical elements, micro-LEDs and output wavelength conversion elements wherein a reflective optical element is aligned to each of the micro-LEDs in the array of micro-LEDs.

FIG. 3B is a schematic diagram illustrating in front view alignment of reflective optical elements 102, micro-LEDs 3 and output wavelength conversion elements 20R, 20G and diffuser element 21 of FIG. 1 wherein a reflective optical element 102 is aligned to each of the micro-LEDs 3 in the array of micro-LEDs 3.

The wavelength conversion array 120 comprises a plurality of wavelength conversion elements 20R, 20G, the plurality of wavelength conversion elements 2R, 20G being arranged in an array, wherein each of the wavelength conversion elements 20R, 20G is aligned with only a respective one of the reflective optical elements 102. Each of the wavelength conversion elements 20R, 20G is aligned in correspondence with a light output region 37 of the transmissive front surface 33 of the respective reflective optical element 102.

In the present disclosure a wavelength conversion element 20 is a region comprising a wavelength conversion material. As will be described further below, the wavelength conversion elements 20 may be arranged on or in the reflective optical elements 102 or may be arranged on output substrate 52 as illustrated in FIG. 3A.

Electrodes 211, 213 are arranged to connect micro-LED 3 and light blocking element 5 via addressing circuitry such as TFTs (not shown) or directly to row and column addressing electrodes 210, 212 respectively.

In an illustrative embodiment the input light 110 from each of the micro-LEDs 3 of the plurality of micro-LEDs 3 is of the same colour wavelength band that is blue light. Advantageously the micro-LEDs may be provided from gallium nitride wafers across the array of micro-LEDs. The forward voltage characteristics of the array may be the same for all the micro-LEDs 3, reducing cost and complexity of the control system.

The wavelength conversion elements 20R, 20G are formed on a first side of the output substrate 52 and the first side of the output substrate 52 faces the transparent front surface of the reflective optical element 102.

Each of the wavelength conversion elements 20R, 20G is arranged to convert input light 110 to visible light of a different wavelength band to the wavelength band of the input light 110. The wavelength conversion elements 20R, 20G may comprise a phosphor or a quantum dot material. Efficient colour conversion materials that have been tuned for use with gallium nitride emission wavelengths may be used, advantageously reducing cost and power consumption.

Input light rays 110 from the respective aligned at least one micro-LED 3 is input through the light input region 35 of the transmissive front surface 33 and is output through at least one light output region 37 of the transmissive front surface 33 after incidence on at least one of the reflective rear surface 43. The output light 112 is incident on wavelength conversion array 120 and the respective wavelength conversion element 20R, 20G. At wavelength conversion location 24 light rays 112 undergo wavelength conversion and output light rays 118 are scattered. Some light rays 119 are back scattered and undergo reflection from the reflective rear surface 43 of the aligned reflective optical element 102 and are output as output rays.

Advantageously an addressable colour sub-pixel may be provided by each reflective optical element 102. Further the energy density at the wavelength conversion material is substantially lower than the energy density if the wavelength conversion material were to be provided directly on the micro-LED 3. Further the temperature of operation of the wavelength conversion material is reduced, advantageously increasing conversion efficiency and material lifetime. Further a uniform angular illumination of the wavelength conversion element 20 is provided such that advantageously colour variations with angle are minimised.

In the case that the input light is blue light, it may not be desirable to provide wavelength conversion. Some of the reflective optical elements 102 are aligned with diffuser regions 21. In combination with the diffusing regions 23 of the reflective rear surface 43 of the reflective optical elements 102, diffuser regions 21 provide similar scattering properties to the light that is scattered by the wavelength conversion elements 20R, 20G. Advantageously uniform colour may be provided from a wide range of viewing angles.

Features of the arrangement of FIG. 3B not discussed in further detail may be assumed to correspond to the features with equivalent reference numerals as discussed above, including any potential variations in the features.

Figure 3C:
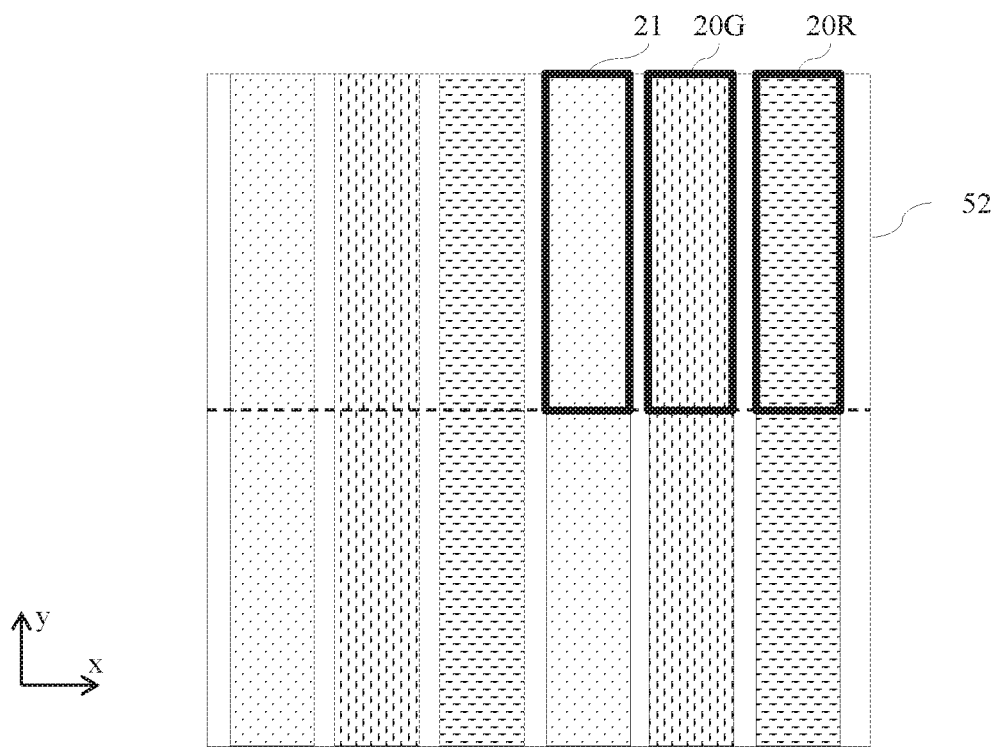
FIGS. 3C-D are schematic diagrams illustrating in front view arrangements of wavelength conversion elements and diffusing regions.
Figure 3D:
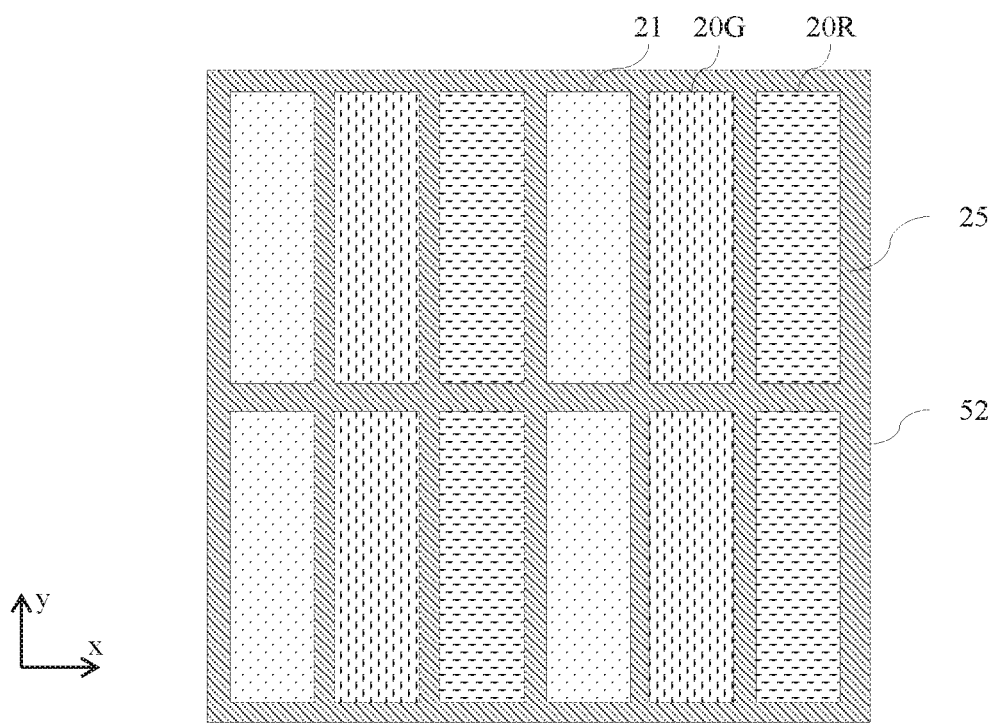

FIGS. 3C-D are schematic diagrams illustrating in front view arrangements of wavelength conversion elements 20R, 20G and diffusing regions 21.

The wavelength conversion elements 20R, 20G and diffusing regions 23 may be arranged as continuous stripes as illustrated in FIG. 3C, and the wavelength conversion elements for adjacent reflective optical elements may be contiguous in one direction. Each stripe of contiguous wavelength conversion elements 20R, 20G are arranged with a column of reflective optical elements 102.

Advantageously, such an arrangement may be conveniently provided by printing or other known deposition methods onto support substrate 53. The angular diffusion properties of region 21 may be provided to match the diffusion produced by wavelength conversion elements 20A, 20B.

FIG. 3D illustrates that wavelength conversion elements 20R, 20G and diffusing regions 21 may be provided with light absorbing mask 25 may be provided between the regions 20A, 20G, 21. Advantageously cross talk between adjacent colour sub-pixels may be provided, as stray light may be absorbed in light absorbing mask 25.

Figure 4:
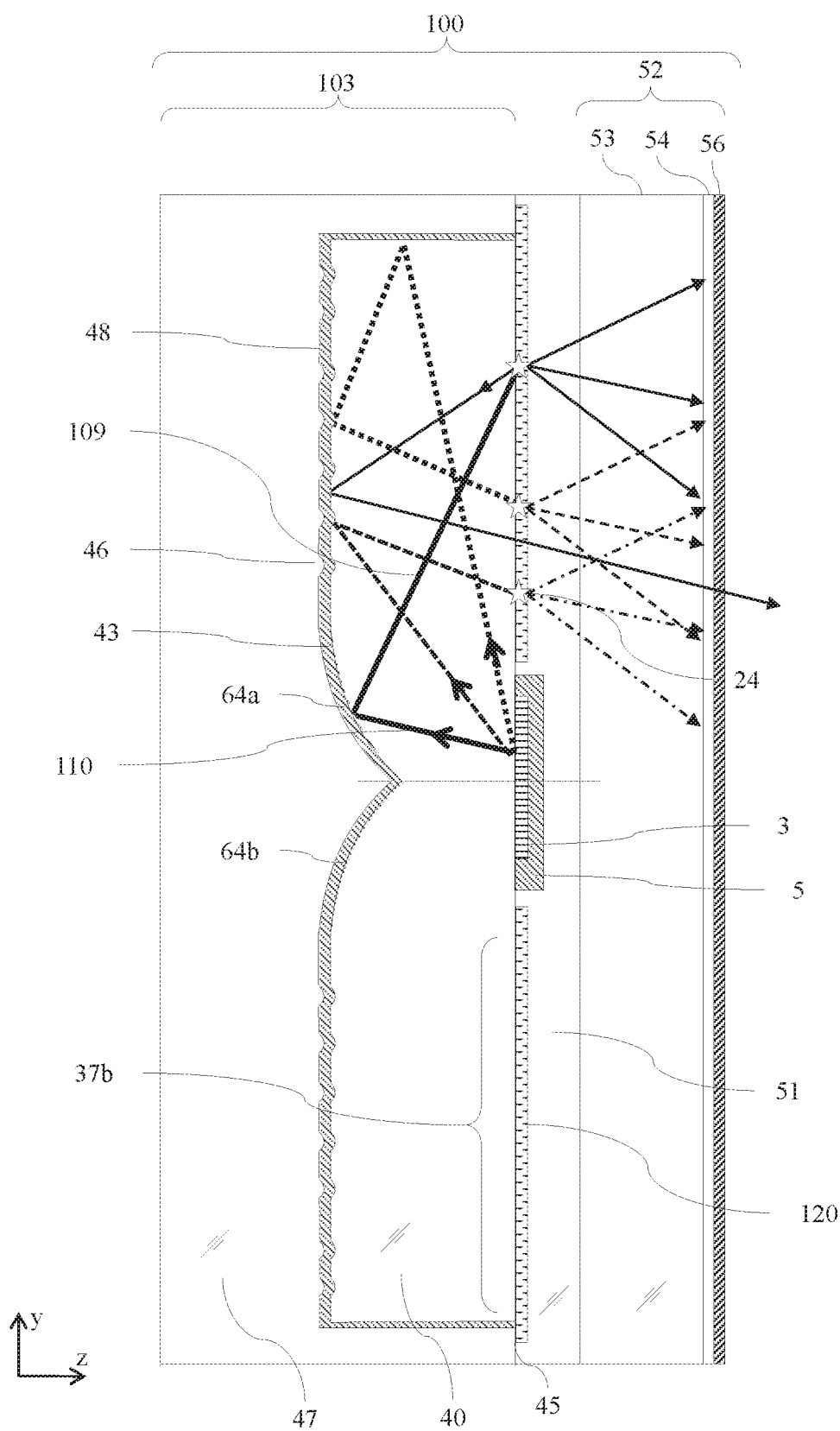
FIG. 4 is a schematic diagram illustrating in side view operation of a reflective optical element, a micro-LED and aligned wavelength conversion element wherein a transmissive material is provided between the output substrate and the reflective optical element.

FIG. 4 is a schematic diagram illustrating in side view operation of a reflective optical element 102, a micro-LED 3 and aligned wavelength conversion element wherein a transmissive material 51 is provided between the output substrate 52 and the reflective optical element 102.

Further, for each reflective optical element 102 of the reflective optical element array 103, the reflective light input structure 44 is arranged to direct at least some light from the respective aligned at least one micro-LED 3 towards the at least one transmissive front surface 33 output region 37.

Diffuser regions 21 and/or wavelength conversion elements 20R, 20G are formed on the output regions 37 of the transmissive front surface 33. Output substrate 52 may be attached to the array 103 of reflective optical elements 102 by means of material 51 that may be a transparent bonding material.

Further micro-LEDs 3 and addressing electrodes 210, 212 may be arranged on the front surface 33 of the reflective optical elements 102. Advantageously rugged alignment of micro-LEDs 3 and reflective optical elements 102 may be achieved.

Advantageously an integrated optical structure may be provided without air gaps. Internal reflections and stray light may be reduced. Further, sensitivity to environmental pressure changes may be reduced, and alignment may be maintained between components of the display for temperature and pressure changes. In comparison to FIG. 3A, parallax between the wavelength conversion array 120 and reflective optical elements 102 may be reduced, achieving improved cross-talk.

Features of the arrangement of FIG. 4 not discussed in further detail may be assumed to correspond to the features with equivalent reference numerals as discussed above, including any potential variations in the features.

A further arrangement of the array of micro-LEDs 3 and array 103 of reflective optical elements 102 will now be described.

Figure 5A:
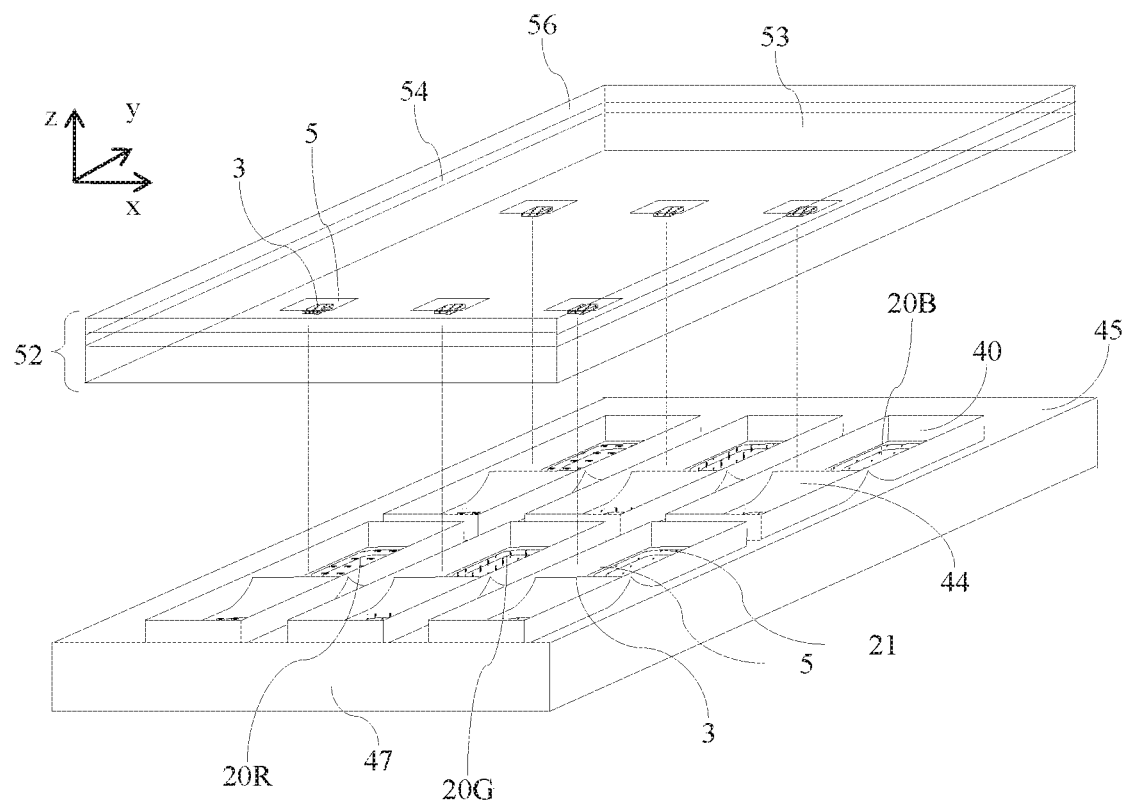
FIG. 5A is a schematic diagram illustrating in side perspective view a colour display apparatus comprising an array of micro-LEDs, an array of wavelength conversion elements and an array of reflective optical elements wherein the micro-LEDs are arranged on the output substrate.

FIG. 5A is a schematic diagram illustrating in side perspective view a colour display apparatus 100 comprising an array of micro-LEDs 3 arranged on an output substrate 52, an array of wavelength conversion elements 20R, 20G, array of light diffusing regions 21 and an array of reflective optical elements 102. The plurality of micro-LEDs 3 is formed on the output substrate 52.

Advantageously, the substrate 52 may comprise a material suitable for forming addressing electrodes 210, 212, and for attaching micro-LEDs 3 and other addressing electronics. For example, the substrate 52 may comprise a glass support substrate that can be processed with high temperature in comparison to a polymeric material that may be used to form the body 47 for the reflective optical elements 102. For example, micro-LED 3 may be attached to substrate 52 by means of high temperature solders. Alternatively, output substrate 52 may comprise a support substrate 53 that comprises a flexible material for example a polymer such as polyimide that can be used with electrode deposition techniques developed for flexible film OLED displays.

Features of the arrangement of FIG. 5A not discussed in further detail may be assumed to correspond to the features with equivalent reference numerals as discussed above, including any potential variations in the features.

A further arrangement of reflective optical element 102 will now be described.

Figure 5B:
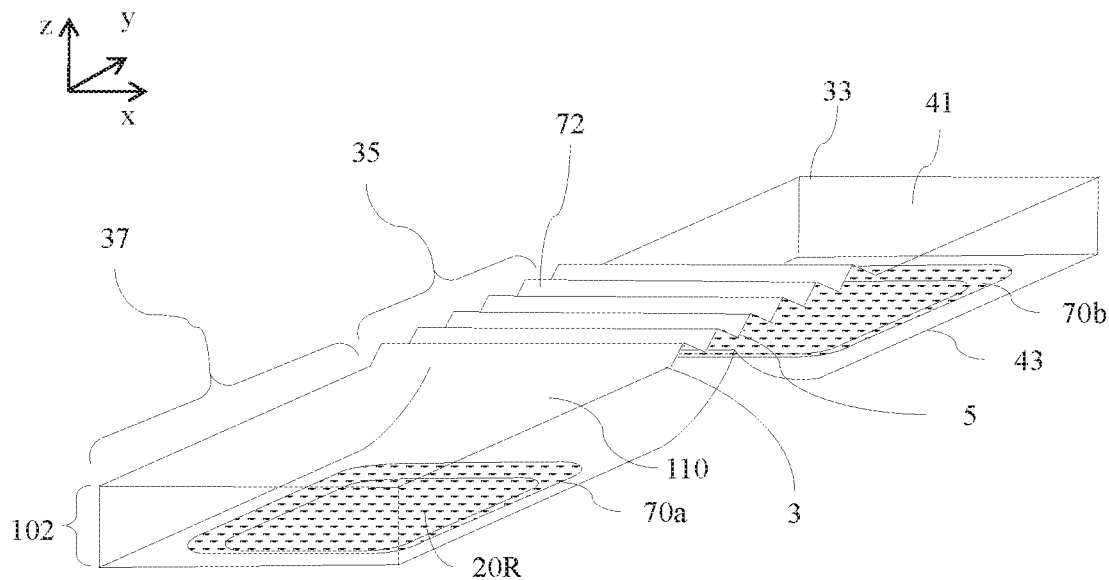
FIG. 5B is a schematic diagram illustrating in side perspective view a reflective optical element and an aligned micro-LED arranged to provide pixel illumination wherein the reflective optical element comprises a wavelength conversion element arranged on the reflective surface.

FIG. 5B is a schematic diagram illustrating in side perspective view a reflective optical element 102 and an aligned micro-LED 3 arranged to provide pixel illumination wherein the reflective optical element 102 comprises a wavelength conversion element 20R arranged on the reflective rear surface 43.

FIG. 5B differs from FIG. 2A in that the light input region 35 of the transmissive front surface 33 comprises a refractive input microstructure 72. Input microstructure 72 redistributes the output light cone from the micro-LED 3 such that input light rays 110 from micro-LED 3 are directed in directions that are towards the diffusing region 23 of the reflective rear surface 43. Advantageously efficiency of output may be increased.

FIG. 5B further illustrates that the reflective rear surface 43 comprises a wells 70a, 70b. The wavelength conversion elements 20R, 20G are formed on the reflective rear surface 43 of at least some of the reflective optical elements 102 and is formed in the wells 70a, 70b. The wells 70a, 70b comprise a wavelength conversion element 20R. In other words, the material of the wavelength conversion element 20R is arranged in the wells 70a, 70b. Alternatively wells 70a and 70b may contain different wavelength conversion materials for example two different red phosphors in order to produce a wider colour gamut for the display.

Features of the arrangement of FIG. 5A not discussed in further detail may be assumed to correspond to the features with equivalent reference numerals as discussed above, including any potential variations in the features.

Figure 6A:
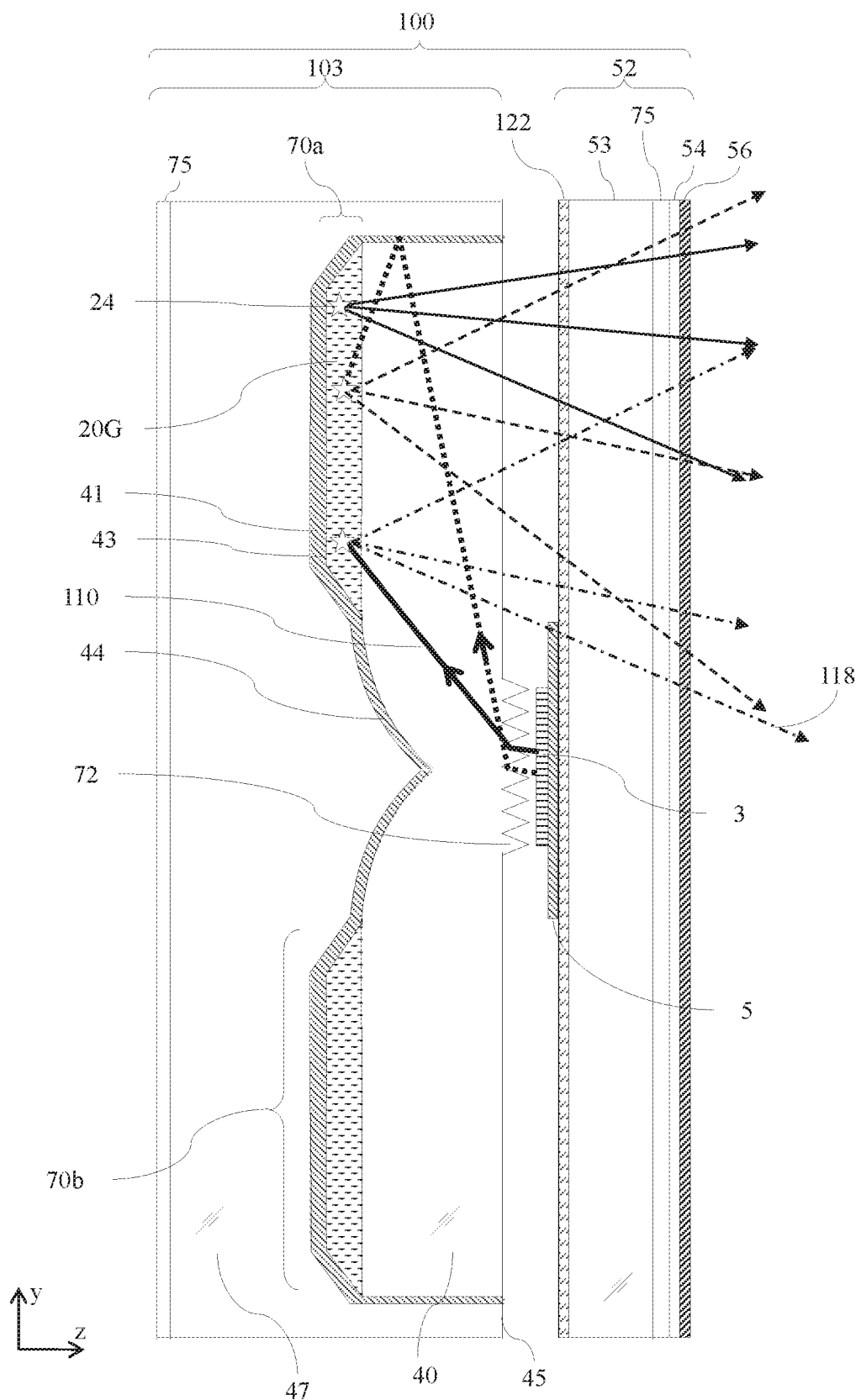
FIG. 6A is a schematic diagram illustrating in side view operation of a reflective optical element, a micro-LED and aligned wavelength conversion element wherein the reflective optical element comprises a wavelength conversion element arranged on the reflective surface.

FIG. 6A is a schematic diagram illustrating in side view operation of a reflective optical element 102, a micro-LED 3 and aligned wavelength conversion element 20 wherein the reflective optical element 102 comprises a wavelength conversion element arranged on the reflective rear surface 43. The wells 70a, 70b may be provided in addition to or alternatively to the light diffusing regions 23a, 23b of FIG. 2B. Thus, the wells 70a, 70b may be provided with wavelength conversion materials such as quantum dot or phosphor materials.

Transmissive material 40 that is arranged between the wavelength conversion materials in region 20R and the transparent front surface 33 may additionally provide a protective coating for the material of the wavelength conversion materials. Advantageously material 40, reflective coating 41, the material arranged to form the body 47 and output substrate 52 may provide barriers to water and oxygen migration to the wavelength conversion materials. Further barrier layers 75 that may comprise inorganic coatings such as silica oxides or aluminium oxides may be provided on the substrate 52 and body 47. Advantageously efficiency of output may be increased and lifetime of materials extended.

The reflective optical element 102 array 103 may comprise an integrated body that is aligned to the substrate 52 on which the micro-LEDs 3 are formed. The integrated body of the array 103 and substrate 52 comprising micro-LEDs 3 may be aligned in a single step as opposed to multiple individual alignments. Advantageously alignment time and costs are reduced.

In operation, input light rays 110 from the respective aligned at least one micro-LED 3 is input through the light input region 35 of the transmissive front surface 33 and is output as light rays 118 through at least one light output region 37 of the transmissive front surface 33 after incidence on at least one reflective rear surface 43 and the respective wavelength conversion element 20R, 20G.

For blue pixels, diffuser regions 23 may be provided in place of wavelength conversion elements 20R, 20G. The diffuser regions may be provided by surface relief structure as illustrated in FIG. 2B for example or may be provided by a bulk diffuser, such as suspended white light scattering particles such as titanium dioxide. The bulk diffuser may be arranged in a curable material and arranged in the wells 70 of the reflective optical element 102 for example. Both bulk diffusion and surface relief diffusion comprising microstructure 46 arranged on the reflective surface 43 may be provided.

For colour converted pixels, some blue light may be scattered from red and green pixels, undesirably reducing colour gamut.

It would be desirable to increase colour gamut.

The colour display apparatus 100 further comprises a colour filter array 122 comprising a plurality of absorptive colour filter regions, the plurality of colour filter regions 22 being arranged in an array; wherein each of the colour filter regions is aligned in correspondence with a light output region 37 of the transmissive front surface 33 of only one of the respective reflective optical elements 102 of the reflective optical element array 103.

Colour filter array 122 may be provided on the input surface of the output substrate 52 or may be formed on the output regions 37 of the transmissive front surface 33. Colour filter array 122 may transmit light rays 112 that are colour converted by interaction with the material of the wavelength conversion element 20 in the respective well 70.

Features of the arrangement of FIG. 6A not discussed in further detail may be assumed to correspond to the features with equivalent reference numerals as discussed above, including any potential variations in the features.

Figure 6B:
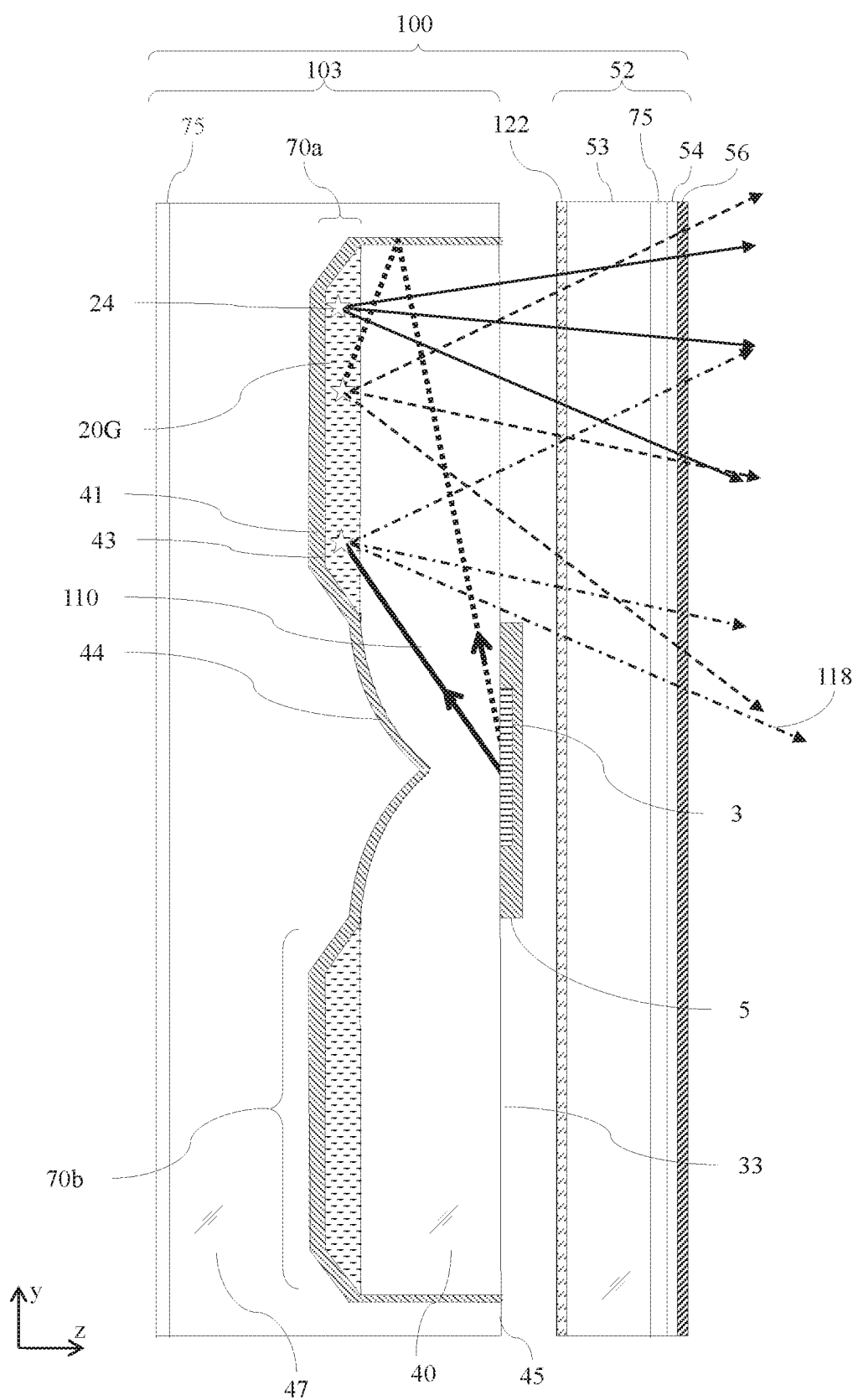
FIG. 6B is a schematic diagram illustrating in side view operation of a reflective optical element, a micro-LED and aligned wavelength conversion element wherein the micro-LED is provided on the transmissive material provided between the reflective rear surface and transmissive front surface.

FIG. 6B is a schematic diagram illustrating in side view operation of a reflective optical element 102, a micro-LED 3 and aligned wavelength conversion element 20 wherein the micro-LED 3 is provided on the transmissive material 40 provided between the reflective rear surface 43 and transmissive front surface 33. In comparison to the arrangement of FIG. 6A, the micro-LED may be aligned on the reflective optical element 102 during fabrication, and further alignment steps are reduced, advantageously reducing cost and complexity. Features of the arrangement of FIG. 6B not discussed in further detail may be assumed to correspond to the features with equivalent reference numerals as discussed above, including any potential variations in the features.

Figure 6C:
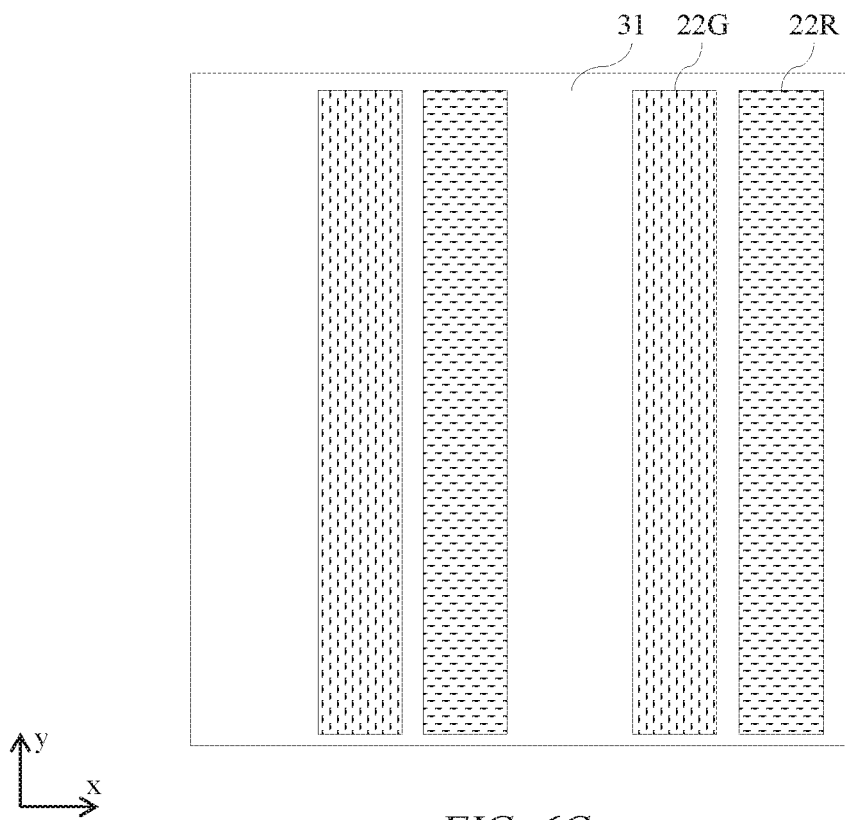
FIGS. 6C-D are schematic diagrams illustrating in front view arrangements of colour filters for a colour display apparatus.
Figure 6D:
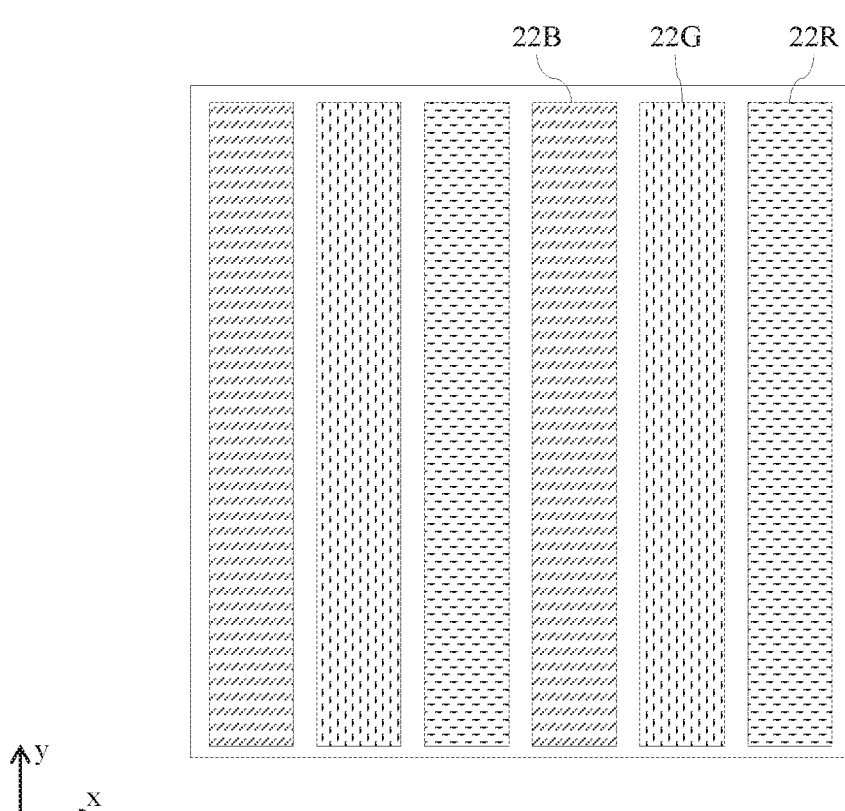

FIGS. 6C-D are schematic diagrams illustrating in front view arrangements of colour filters 22A, 22B for the colour display apparatus 100 of FIG. 6A.

As illustrated in FIG. 6C colour filter array 122 may comprise clear regions for blue pixels, green transmitting filters 22A for green pixels and red transmitting filters 22B for red pixels. Colour leakage is reduced and advantageously colour gamut may be increased.

FIG. 6D illustrates that a further blue absorbing colour filter 22B may be provided. Advantageously red and green light leakage due to stray light in the blue sub-pixels is reduced.

The arrangement of wavelength conversion elements will now be further described.

Figure 6E:
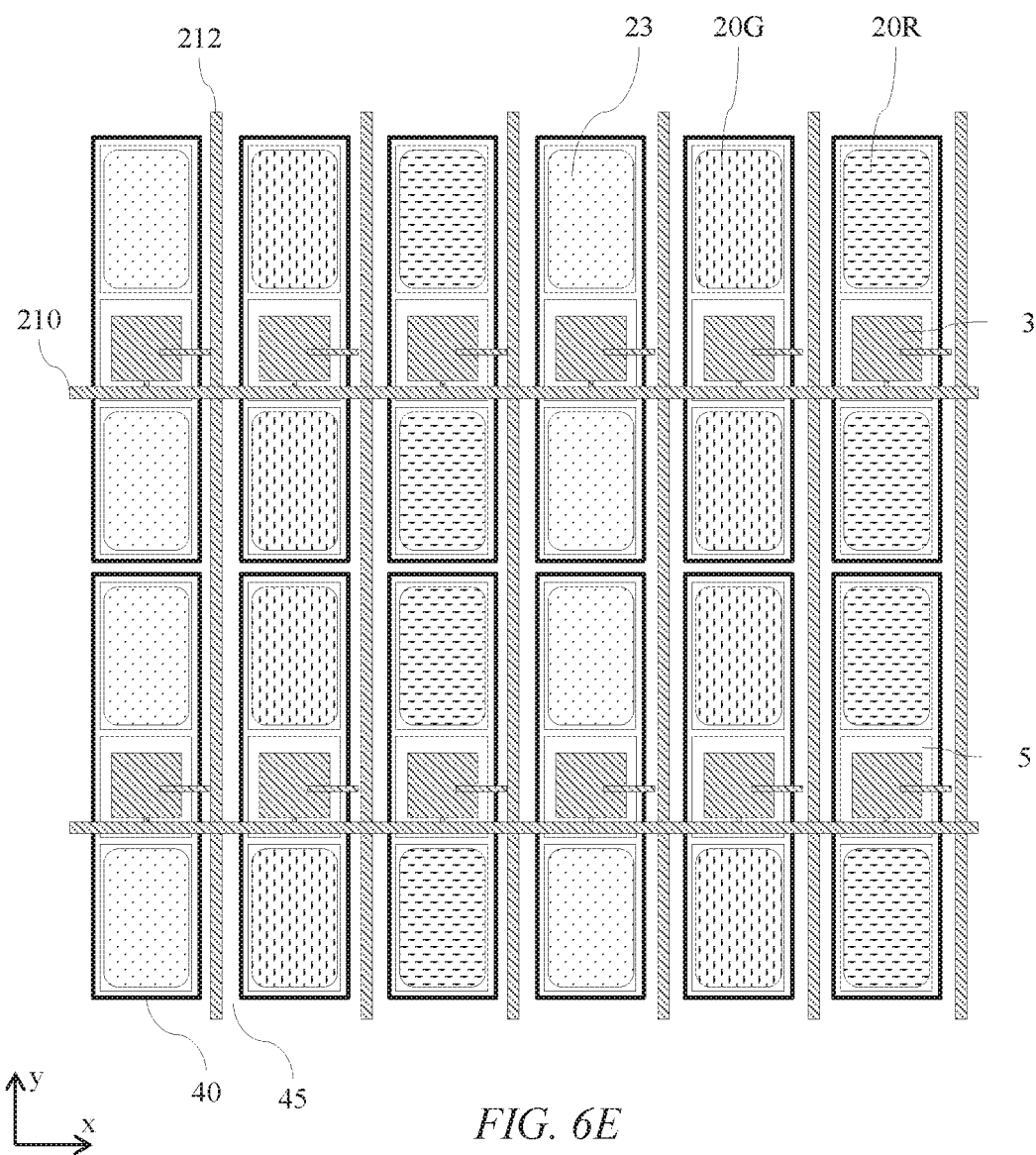
FIG. 6E is a schematic diagram illustrating in front view alignment of reflective optical elements, micro-LEDs and wavelength conversion elements arranged on the reflective surface of some of the reflective optical elements wherein a reflective optical element is aligned to each of the micro-LEDs in the array of micro-LEDs and the micro-LEDs are arranged to output light of the same colour across the array of micro-LEDs.

FIG. 6E is a schematic diagram illustrating in front view alignment of reflective optical elements 102, micro-LEDs 3 and wavelength conversion elements 20R, 20G arranged on the reflective rear surface 43 of some of the reflective optical elements 102 wherein a reflective optical element 102 is aligned to each of the micro-LEDs 3 in the array of micro-LEDs 3 and the micro-LEDs 3 are arranged to output light of the same colour across the array of micro-LEDs 3.

Some of the reflective optical elements 102 are not aligned with wavelength conversion elements 20R, 20G, and diffusers 23 such as bulk or surface relief diffusers are provided for example as described with respect to FIG. 6A. The diffuser regions 23 may be replaced by colour filter 23B so that the blue colour of for example the blue emitting micro-LEDs 3 may be modified.

Advantageously a high efficiency colour display with long lifetime materials and high colour gamut may be provided.

Features of the arrangement of FIG. 6E not discussed in further detail may be assumed to correspond to the features with equivalent reference numerals as discussed above, including any potential variations in the features.

Various other arrangements of micro-LED 3 array and reflective optical element 102 will now be described.

Figure 7A:
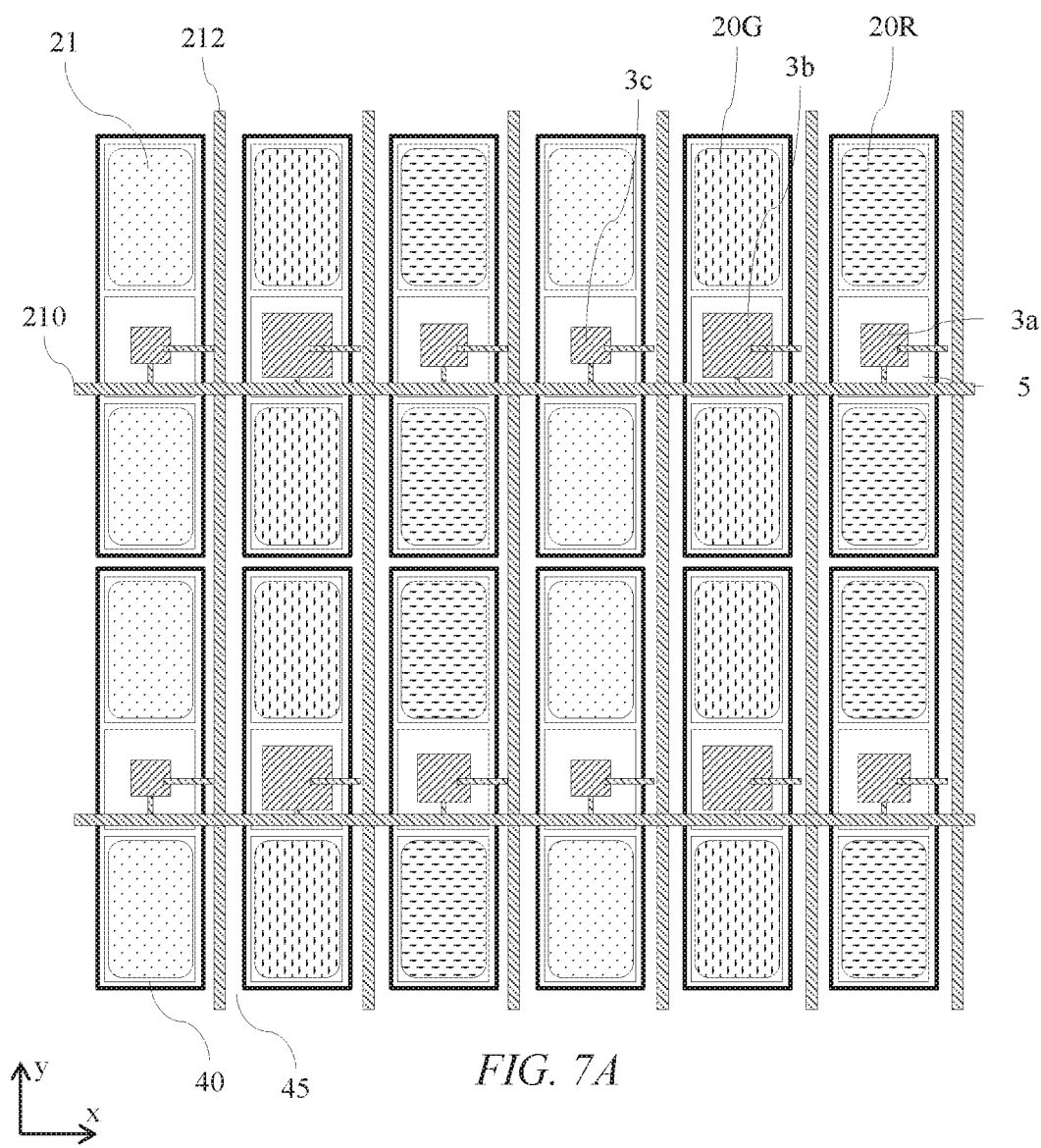
FIG. 7A is a schematic diagram illustrating in front view alignment of reflective optical elements, micro-LEDs and wavelength conversion elements arranged on the reflective surface of some of the reflective optical elements wherein a reflective optical element is aligned to each of the micro-LEDs in the array of micro-LEDs and the micro-LEDs are arranged to output light of the same colour across the array of micro-LEDs wherein the area of the micro-LED varies according to the output wavelength of the light emitting element and aligned wavelength conversion element.

FIG. 7A is a schematic diagram illustrating in front view alignment of reflective optical elements 102, micro-LEDs 3 and wavelength conversion elements 20R, 20G arranged on the reflective rear surface 43 of some of the reflective optical elements 102 wherein a reflective optical element 102 is aligned to each of the micro-LEDs 3 in the array of micro-LEDs 3 and the micro-LEDs 3 are arranged to output light of the same colour across the array of micro-LEDs 3 wherein the area of the micro-LED 3 varies according to the output wavelength of the light emitting element and aligned wavelength conversion element.

In comparison to FIG. 6E, the size of the micro-LEDs for red, green and blue sub-pixels is different. The efficiency of luminous output can vary between red, green and blue sub-pixels. Different sized micro-LEDs 3a, 3b, 3c may provide compensation for the differences in luminous efficiency of the red, green and blue colour sub-pixels. A larger micro-LED 3 may provide higher luminous flux for the same drive voltage than a smaller micro-LED. Advantageously the control system may be simpler with lower complexity and cost.

Figure 7B:
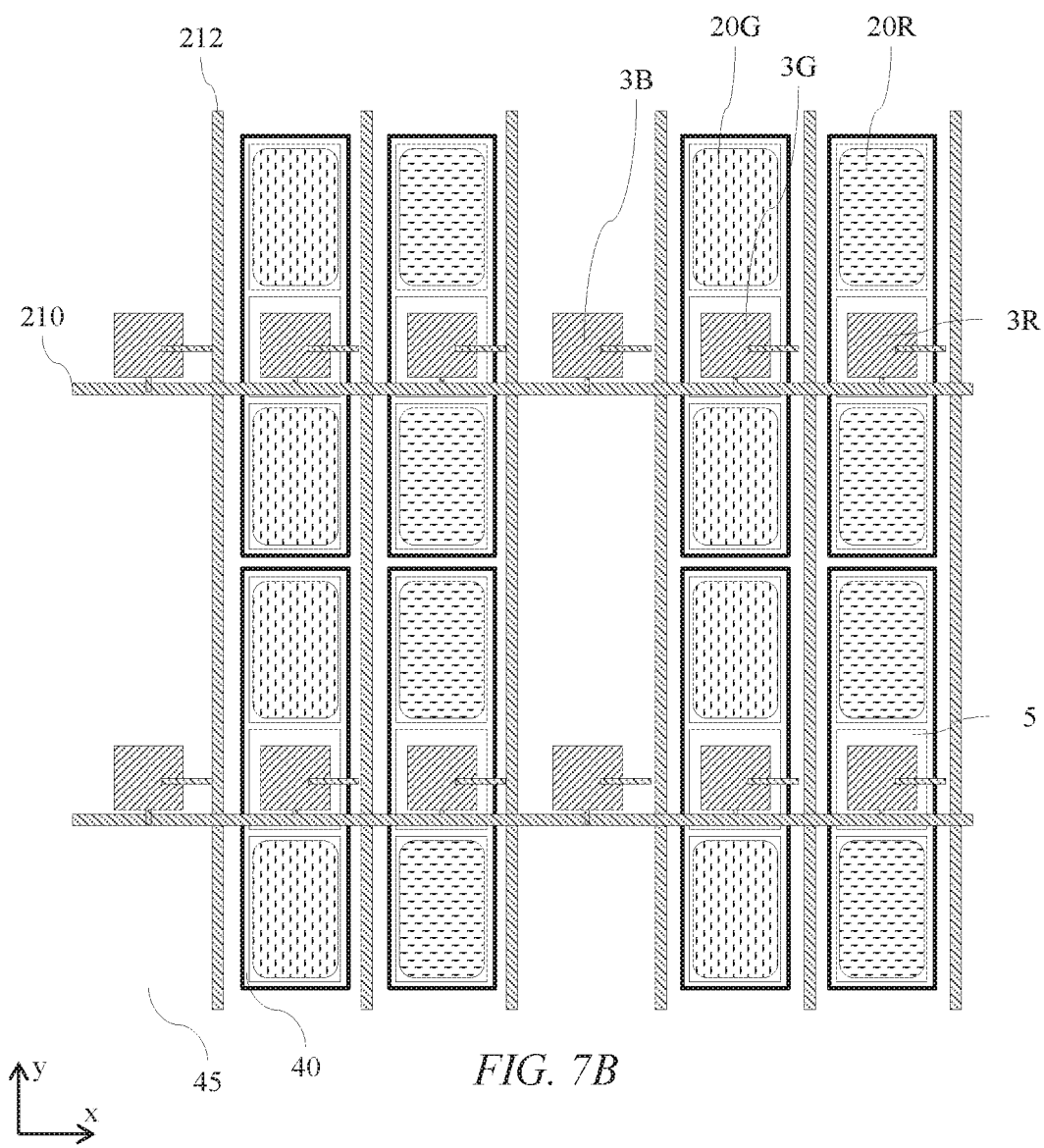
FIG. 7B is a schematic diagram illustrating in front view alignment of reflective optical elements, micro-LEDs and wavelength conversion elements arranged on the reflective surface of the reflective optical elements wherein a reflective optical element is aligned to some of the micro-LEDs in the array of micro-LEDs and the micro-LEDs are arranged to output light of the same colour across the array of micro-LEDs.

FIG. 7B is a schematic diagram illustrating in front view alignment of reflective optical elements 102, micro-LEDs 3 and wavelength conversion elements 20R, 20G arranged on the reflective rear surface 43 of the reflective optical elements 102 wherein a reflective optical element 102 is aligned to some of the micro-LEDs 3 in the array of micro-LEDs 3 and the micro-LEDs 3 are arranged to output light of the same colour across the array of micro-LEDs 3.

Some of the micro-LEDs 3B of the plurality of micro-LEDs are not aligned to a reflective optical element 102 and further have no light blocking element 5. Light may be output directly through output substrate 52 without being incident onto surface 45 of body 47 by means of a reflector arranged between the micro-LED 3B and the body 47. Alternatively, the surface 45 of body 47 may comprise a reflective coating 41 such that light from the micro-LED 3 is reflected and directed through the output substrate 52.

For example, blue sub-pixels may be provided directly by micro-LEDs 3C and reflective optical elements and wavelength conversion elements 20R, 20G may provide red and green light from blue input light from micro-LEDs 3R,3G, 3B. Using the micro-LEDs of the same colour, for example blue means that each display colour channel for example R, G, B may be addressed by the same voltage. Advantageously, the cost and complexity of the array 103 of reflective optical elements may be reduced.

Figure 7C:
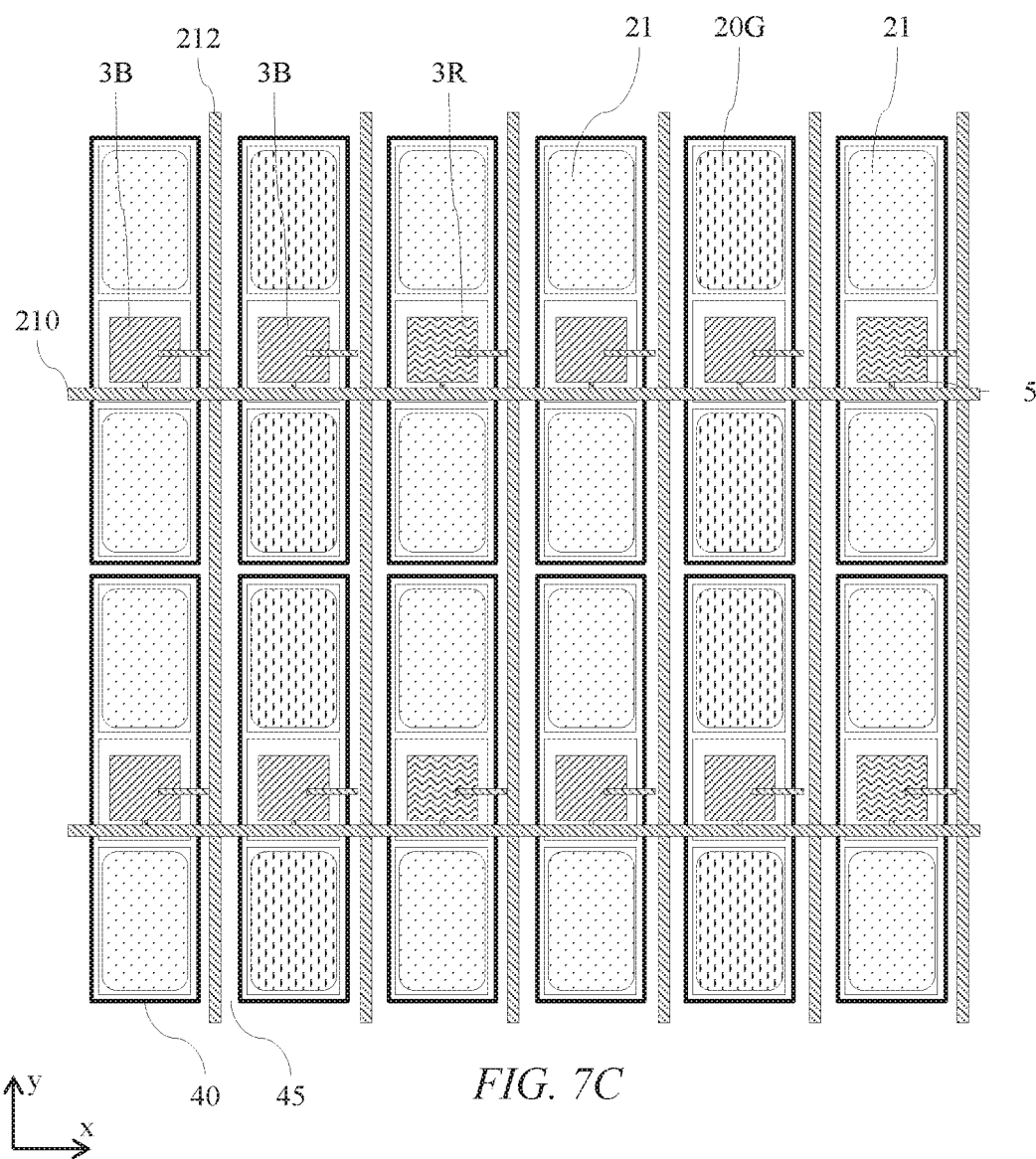
FIG. 7C is a schematic diagram illustrating in front view alignment of reflective optical elements, micro-LEDs and wavelength conversion elements arranged on the reflective surface of some of the reflective optical elements wherein a reflective optical element is aligned to each of the micro-LEDs in the array of micro-LEDs and the micro-LEDs are arranged to output light of different colours across the array of micro-LEDs.

FIG. 7C is a schematic diagram illustrating in front view alignment of reflective optical elements 102, red emitting micro-LEDs 3R, blue emitting micro-LEDs 3G with green wavelength conversion elements 20G and blue emitting micro-LEDs 3B. Green wavelength conversion elements 20G are arranged on the reflective rear surface 43 of some of the reflective optical elements 102 wherein a reflective optical element 102 is aligned to each of the micro-LEDs 3R, 3G, 3B in the array of micro-LEDs and the micro-LEDs 3R, 3G, 3B are arranged to output light of different colours across the array of micro-LEDs.

The input light 110 from some of the micro-LEDs 3R of the plurality of micro-LEDs 3 is red light and the input light 110 from some of the micro-LEDs 3G, 3B of the plurality of micro-LEDs is blue light.

Advantageously the optical output distribution may be substantially the same for each colour pixel, and increased luminous efficiency may be provided for the red sub-pixels in comparison to wavelength converting light from blue to red. The forward voltage difference between driving the red micro-LEDs 3R and blue micro-LEDs 3B may be compensated controlling the micro-LED 3 current and or adjusting the drive voltage for different colour columns of micro-LEDs 3.

Figure 7D:
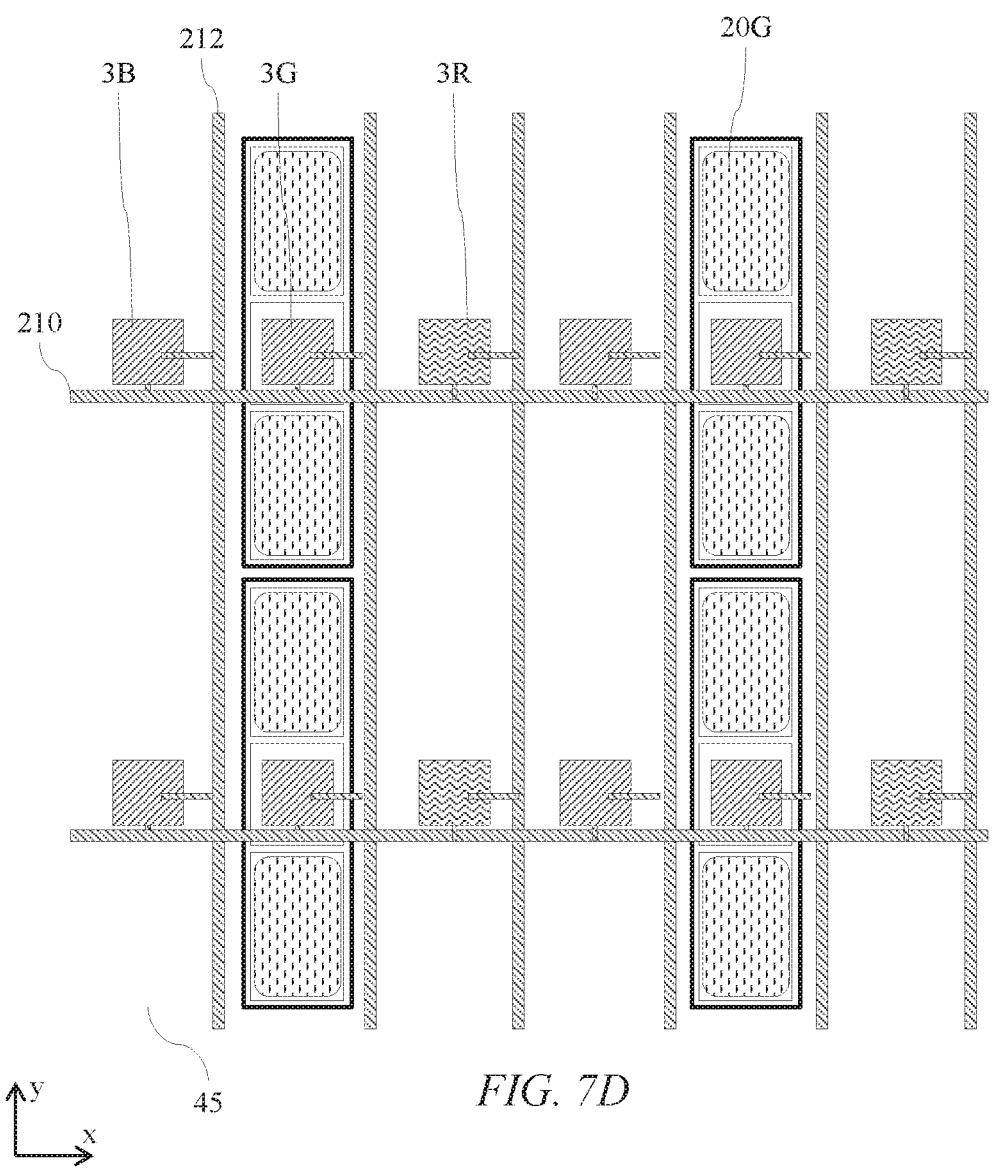
FIG. 7D is a schematic diagram illustrating in front view alignment of reflective optical elements, micro-LEDs and wavelength conversion elements arranged on the reflective surface of the reflective optical elements wherein a reflective optical element is aligned to some of the micro-LEDs in the array of micro-LEDs and the micro-LEDs are arranged to output light of different colours across the array of micro-LEDs.

FIG. 7D is a schematic diagram illustrating in front view alignment of reflective optical elements 102, red emitting micro-LEDs 3R, blue emitting micro-LEDs 3G with green wavelength conversion elements 20G and blue emitting micro-LEDs 3B. Green wavelength conversion elements 20G are arranged on the reflective rear surface 43 of the reflective optical elements 102 which are aligned to the micro-LEDs 3G in the array of micro-LEDs and the micro-LEDs 3R are arranged to output light of different colours to micro-LEDs 3G, 3B across the array of micro-LEDs.

Thus, colour converted sub-pixels may be illuminated by blue micro-LEDs 3B that are converted by wavelength conversion element 20G to green light, whereas blue and red pixels are provided by blue and red micro-LEDs 3B, 3R with no reflective optical element 102. Advantageously a less complex arrangement is provided, reducing cost.

Figure 7E:
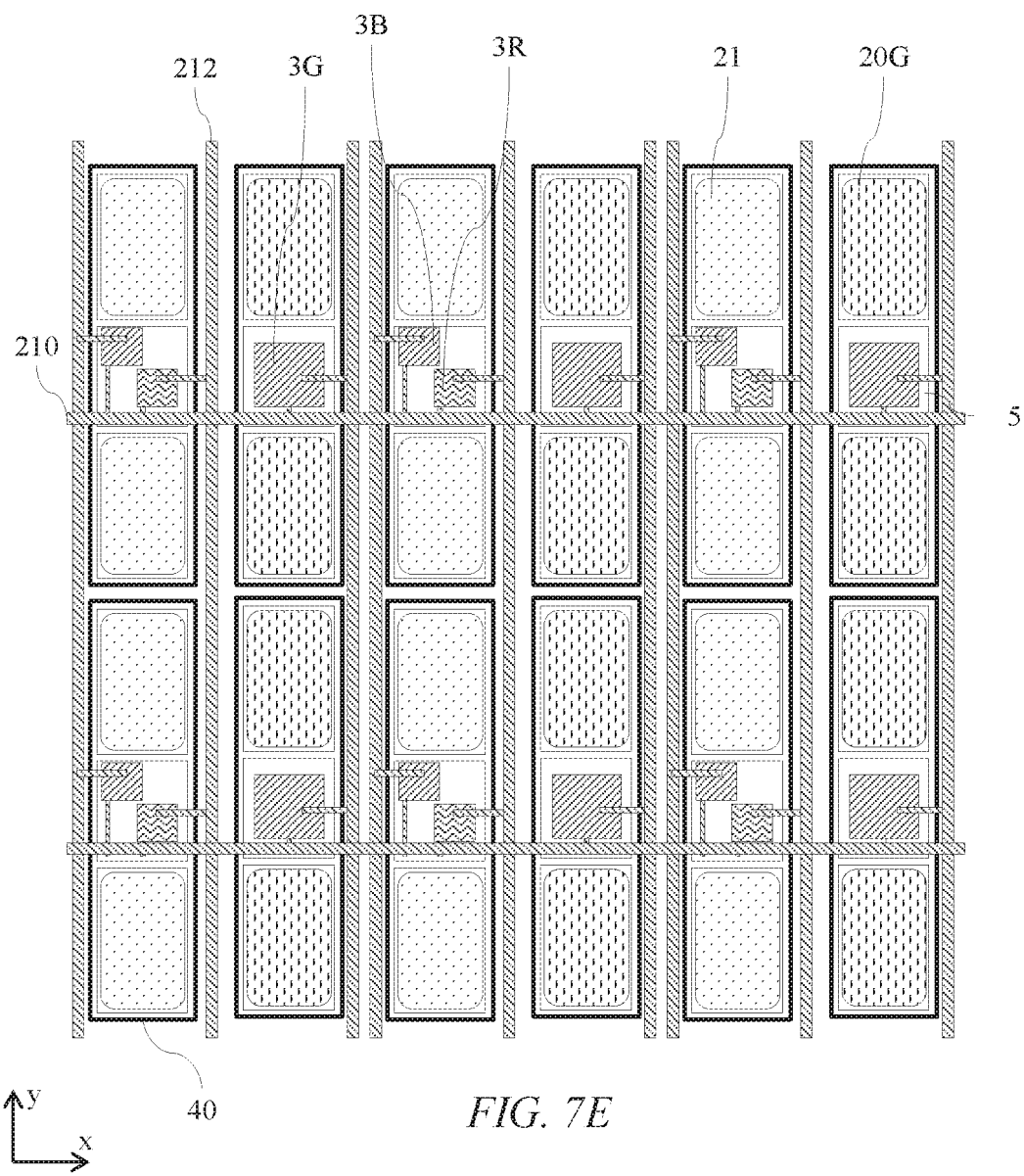
FIG. 7E is a schematic diagram illustrating in front view alignment of reflective optical elements, micro-LEDs and wavelength conversion elements arranged on the reflective surface of some of the reflective optical elements wherein each of a first plurality of reflective optical elements is aligned to a red emitting micro-LED and a blue emitting micro-LED and further comprises a light diffusing region; and each of a second plurality of reflective optical elements is aligned to a blue emitting micro-LED and further comprises a green wavelength conversion element.

FIG. 7E is a schematic diagram illustrating in front view alignment of reflective optical elements 102, micro-LEDs 3R, 3G, 3B and wavelength conversion elements 20G on the reflective rear surface 43 of some of the reflective optical elements 102 wherein each of a first plurality of reflective optical elements 102 is aligned to a red emitting micro-LED 3R and a blue emitting micro-LED 3B and further comprises a light diffusing region 21; and each of a second plurality of reflective optical elements 102 is aligned to a blue emitting micro-LED 3G and further comprises a green wavelength conversion element 20G.

In comparison to the arrangement of FIG. 7A, the resolution of the display is advantageously increased, as some of the colour reflective optical elements 102 may provide two different addressable colours. Further for a given pixel pitch, increased feature size may be provided, advantageously reducing cost and complexity of tooling and replication.

Figure 7F:
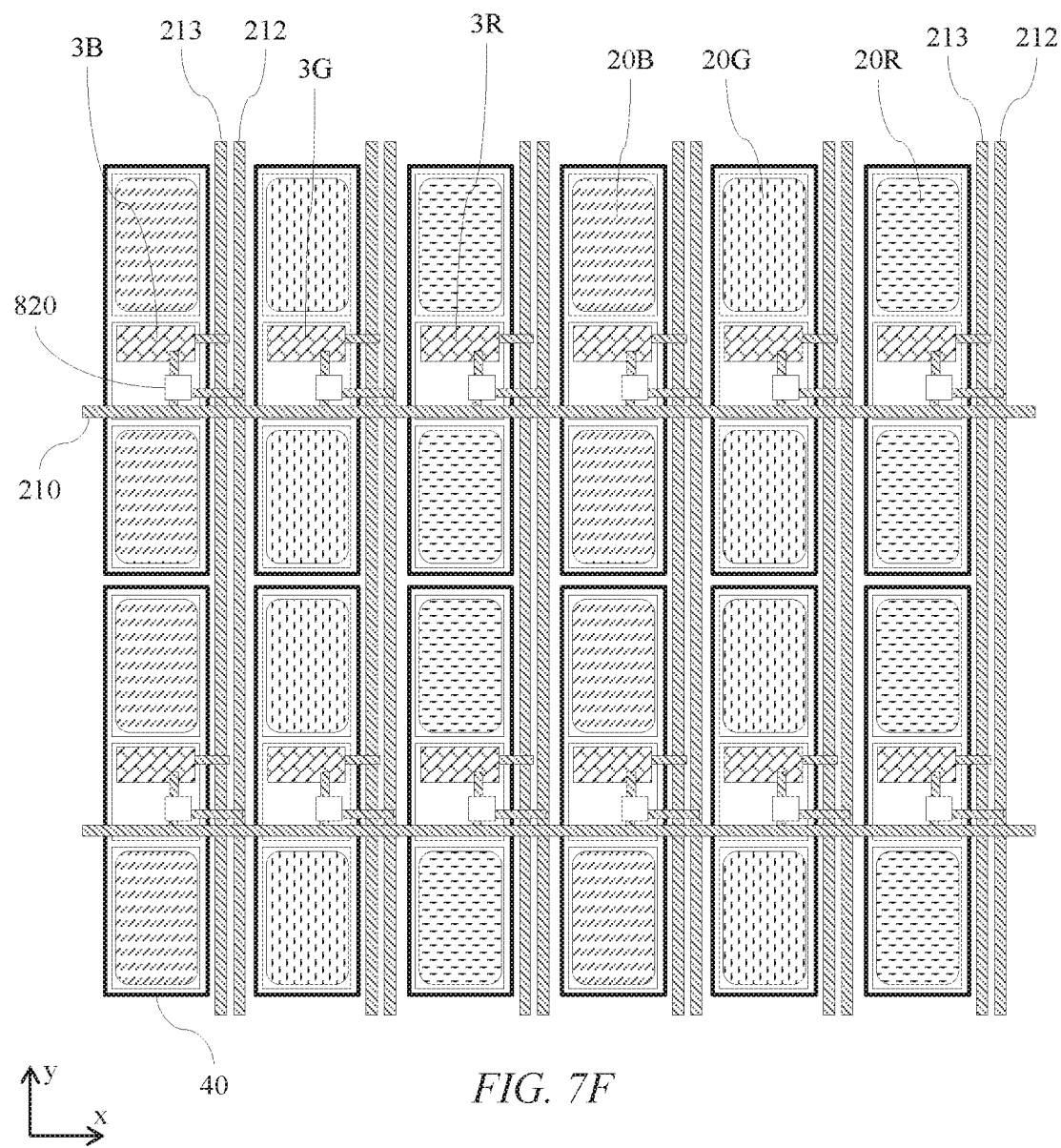
FIG. 7F is a schematic diagram illustrating in front view alignment of reflective optical elements, micro-LEDs and wavelength conversion elements arranged on the reflective surface of some of the reflective optical elements wherein a reflective optical element is aligned to each of the micro-LEDs in the array of micro-LEDs and the micro-LEDs are arranged to output ultra-violet light.

FIG. 7F is a schematic diagram illustrating in front view alignment of reflective optical elements 102 and aligned ultra-violet emitting micro-LEDs 3R, 3G, 3B that are not red, green and blue light emitting micro-LEDs but are ultra-violet micro-LEDs that are addressed with red, green and blue pixel data. Wavelength conversion elements 20R, 20G, 20B are arranged on the reflective rear surface 43 of the respective reflective optical elements 102 wherein a reflective optical element 102 is aligned to each of the micro-LEDs 3R, 3G, 3B in the array of micro-LEDs and the micro-LEDs 3R, 3G, 3B are arranged such that the input light 110 is ultra-violet light.

In comparison to the arrangement of FIG. 7A, a blue wavelength conversion element 20B is provided to convert ultraviolet light to blue light. Advantageously, a uniform array of micro-LEDs is provided reducing cost and complexity of assembly and addressing. Further leakage between pixels of input light 110 can be minimised by providing an ultra-violet filter on or in the output substrate 52. Cross talk may thereby be reduced. There is no visible mixing of the input wavelength band of light with the wavelength converted band of output light and the colour gamut of the display is improved.

Features of the arrangements of FIGS. 7A-F not discussed in further detail may be assumed to correspond to the features with equivalent reference numerals as discussed above, including any potential variations in the features.

FIG. 7F further illustrates an arrangement of electrodes 212, 213, 210 and drive circuit 820 for addressing the micro-LEDs 3R, 3G, 3B as will be described further below.

It may be desirable to provide the micro-LEDs on an opaque support substrate.

Figure 8A:
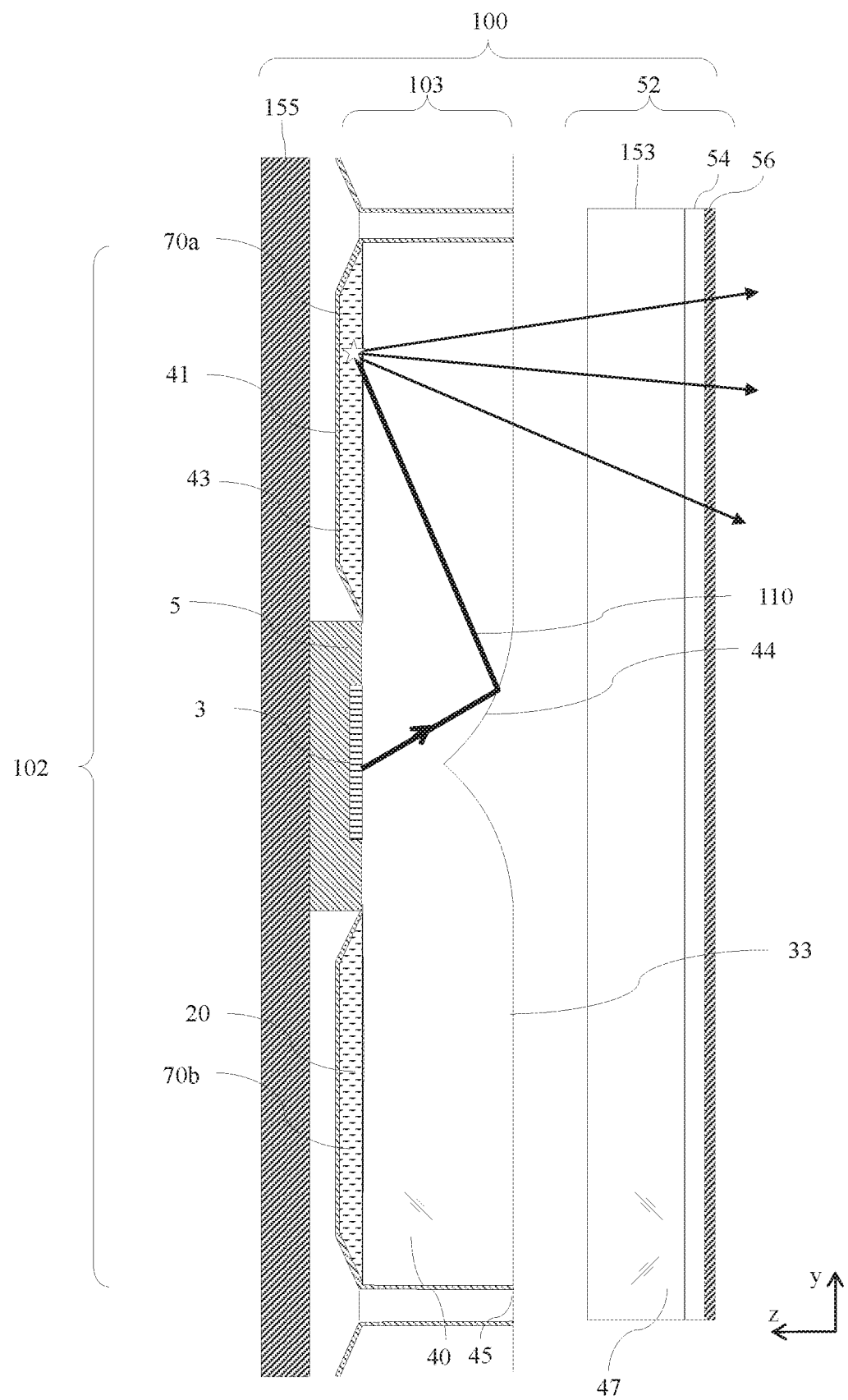
FIG. 8A is a schematic diagram illustrating in side view a further structure of reflective optical element, aligned micro-LED and aligned wavelength conversion element wherein the aligned micro-LED is arranged on an opaque support substrate.

FIG. 8A is a schematic diagram illustrating in side view a further structure of reflective optical element 102, aligned micro-LED 3 and aligned wavelength conversion elements 20 wherein the aligned micro-LED 3 is arranged on an opaque support substrate 155. Transparent substrate 153 is provided with retarder 54, polariser 56 and optionally colour filters as described elsewhere herein. Features of the arrangement of FIG. 8A not discussed in further detail may be assumed to correspond to the features with equivalent reference numerals as discussed above, including any potential variations in the features.

In comparison to arrangements with a transparent support substrate 53, light emission from the micro-LED is provided in the same direction as the output substrate 52. Reflective light input structure 44 provides total internal reflection for light rays 110 from the micro-LED 3 such that rays are guided on to the wavelength conversion elements 20 and output surface 33.

The substrate 155 may be provided with opaque electrode materials and other control electronic components that do not reduce the output efficiency. Advantageously efficiency may be increased. Further the substrate 155 may be provided with thermally conductive regions and/or layers arranged to achieve reduced semiconductor junction temperature during operation of the micro-LED. Advantageously micro-LED efficiency may be increased.

Figure 8B:
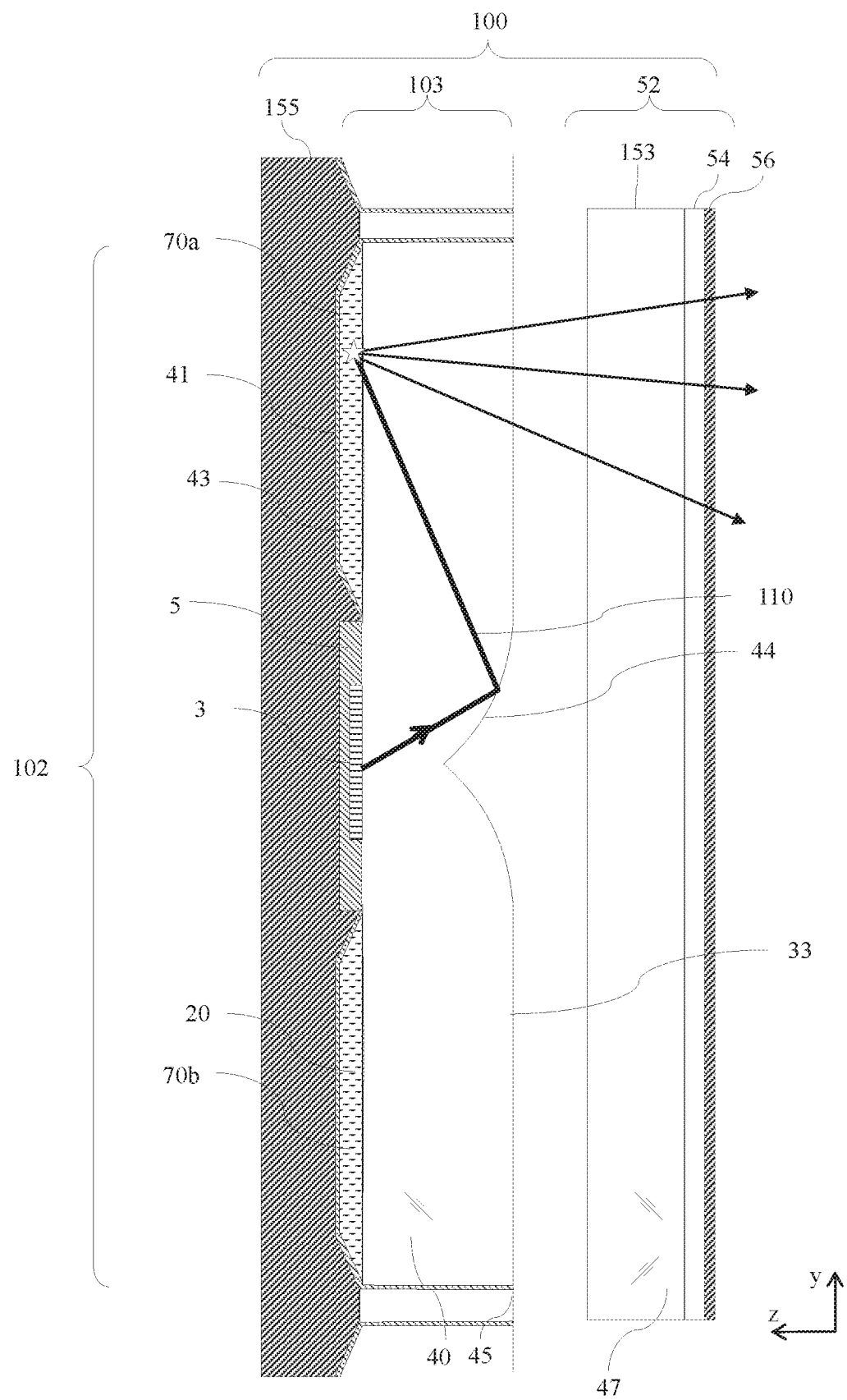
FIG. 8B is a schematic diagram illustrating in side view a further structure of reflective optical element, aligned micro-LED and aligned wavelength conversion element wherein the aligned micro-LED and part of the reflective optical element is arranged on an opaque support substrate.

FIG. 8B is a schematic diagram illustrating in side view a further structure of reflective optical element, aligned micro-LED and aligned wavelength conversion element wherein the aligned micro-LED and part of the reflective optical element is arranged on the opaque support substrate 155. In comparison to FIG. 8A, the reflective rear surface 43 may be formed on the substrate 155. Transmissive material 40 and walls 49 may be formed on the surface of the substrate 155. Advantageously thickness may be reduced. Further thermal expansion differences between the substrate 155 and reflective optical element array 103 may be reduced, achieving increased uniformity.

Figure 9A:
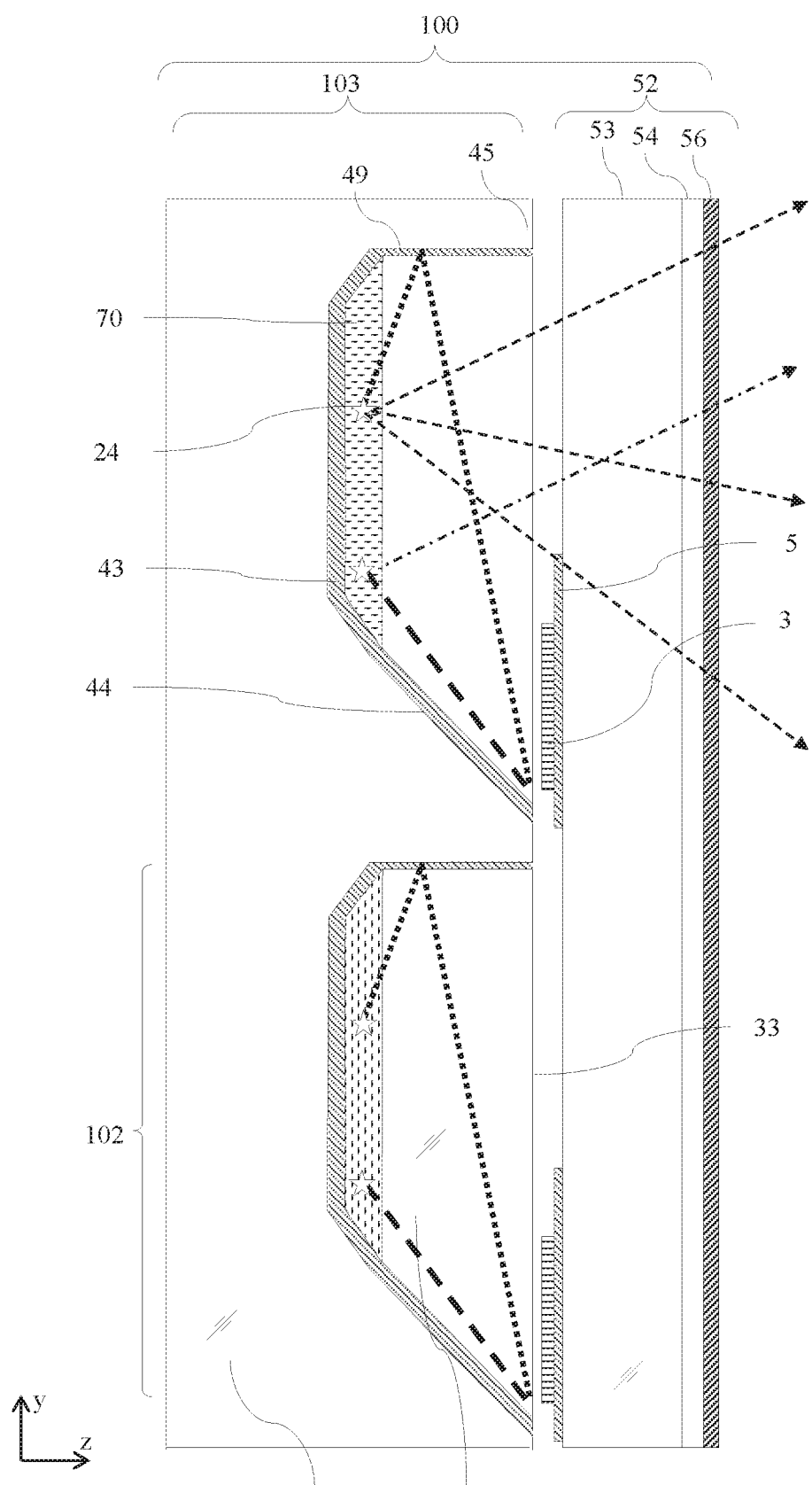
FIG. 9A is a schematic diagram illustrating in side view a further structure of reflective optical element, aligned micro-LED and aligned wavelength conversion element.

FIG. 9A is a schematic diagram illustrating in side view a further structure of reflective optical element 102, aligned micro-LED 3 and aligned wavelength conversion element. In comparison to FIG. 6A, the reflective light input structure 44 comprises a single tilted surface. Such a structure of reflective optical element 102 may be more conveniently tooled and/or reliably replicated than the structure of FIG. 6A. Further, only one well 70 may be provided reducing cost and complexity of forming wavelength conversion elements 20 in the wells. FIG. 9A further illustrates that the reflective light input structure 44 may form a wall 49 of the reflective optical element 102.

Features of the arrangement of FIG. 9A not discussed in further detail may be assumed to correspond to the features with equivalent reference numerals as discussed above, including any potential variations in the features.

Figure 9B:
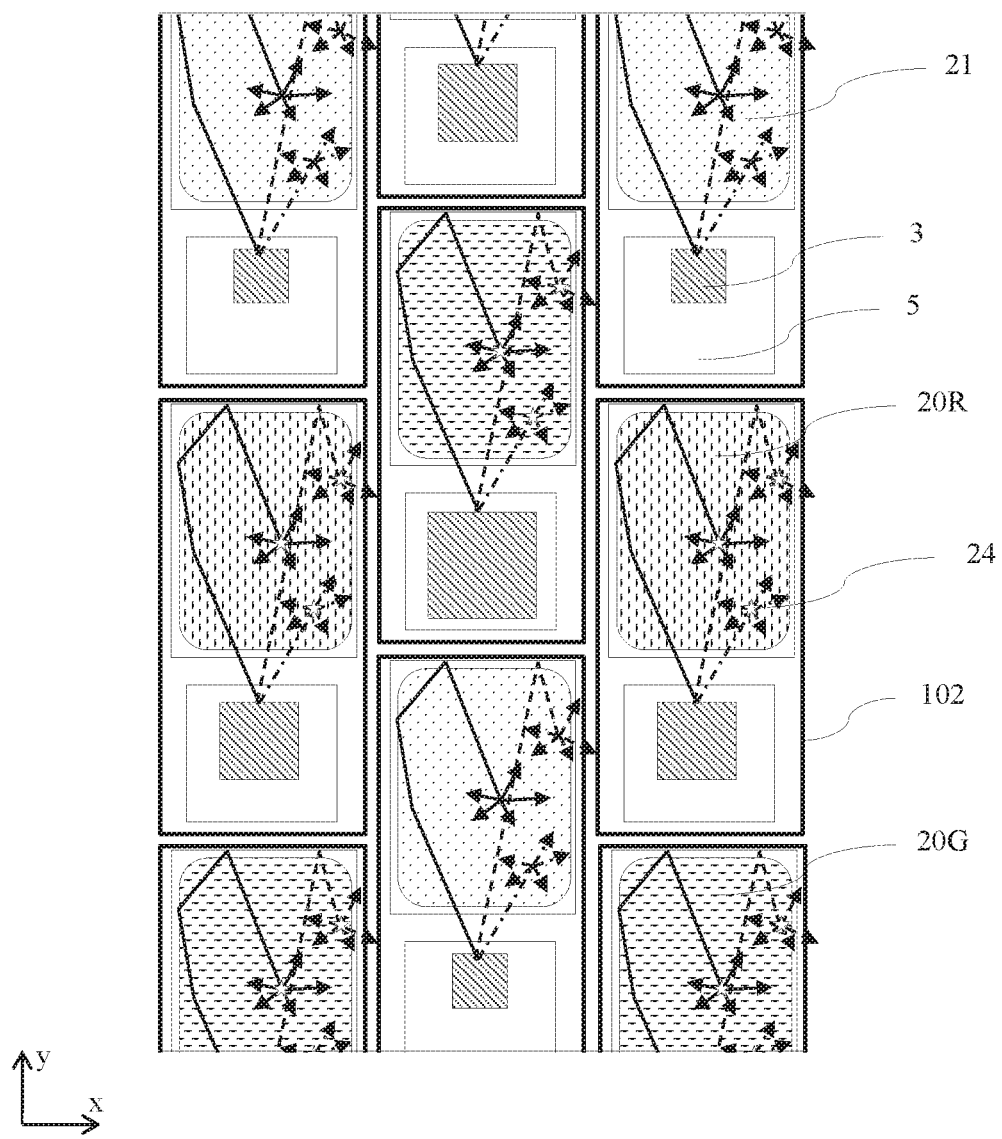
FIG. 9B is a schematic diagram illustrating in front view alignment of reflective optical elements, micro-LEDs and wavelength conversion elements arranged to provide a delta pixel pattern.

FIG. 9B is a schematic diagram illustrating in front view alignment of reflective optical elements 102, micro-LEDs 3 and wavelength conversion elements 20R, 20G arranged to provide a delta pixel pattern and using the reflective optical element 102 of FIG. 9A. Advantageously image appearance may be improved for moving images. Features of the arrangement of FIG. 9B not discussed in further detail may be assumed to correspond to the features with equivalent reference numerals as discussed above, including any potential variations in the features.

It would be desirable to provide phosphors for wavelength conversion materials in high resolution display.

Figure 10A:
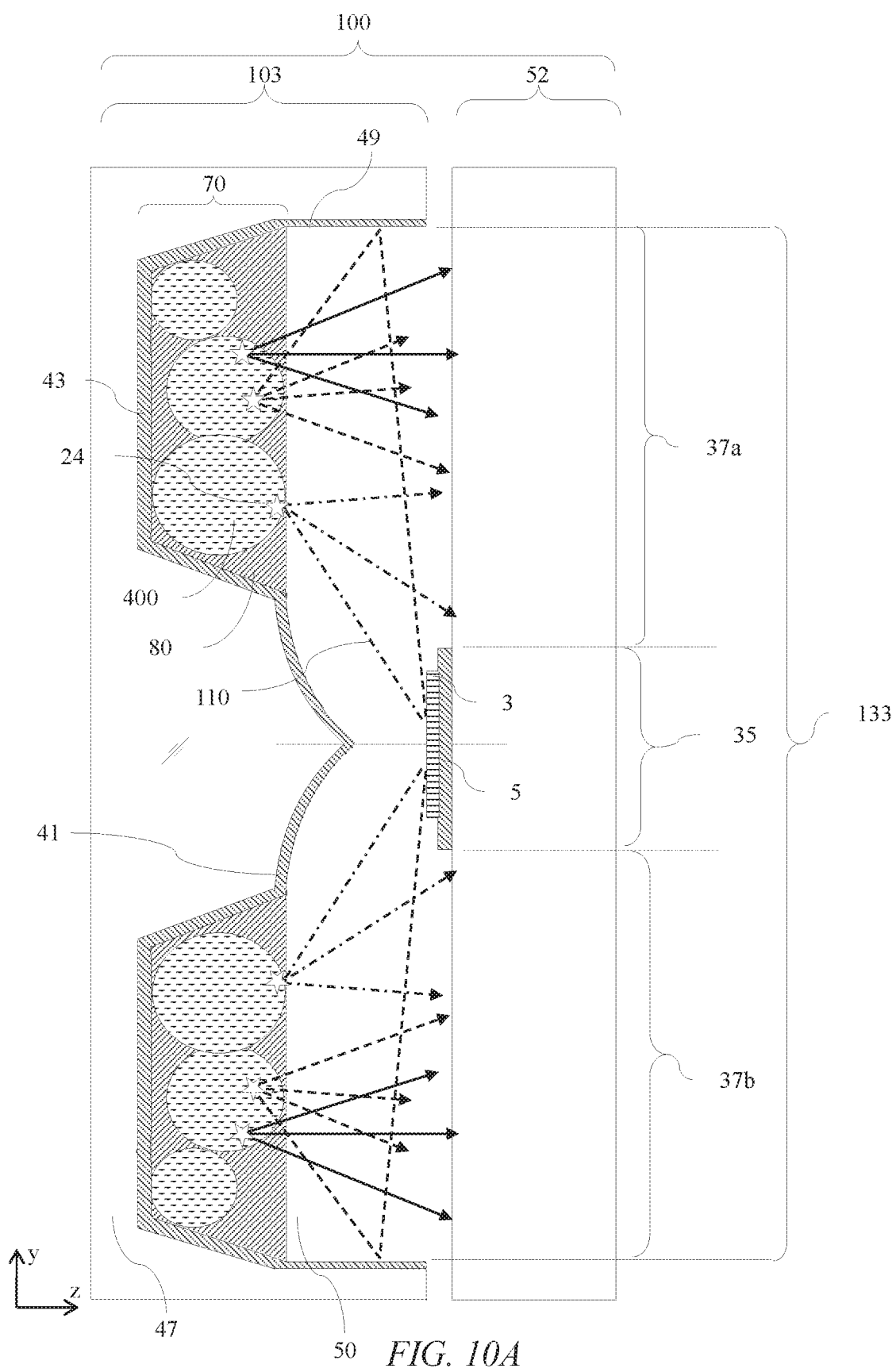
FIG. 10A is a schematic diagram illustrating in side view operation of a reflective optical element, a micro-LED and aligned wavelength conversion element wherein the wavelength conversion material comprises a large particle size material.
Figure 10B:
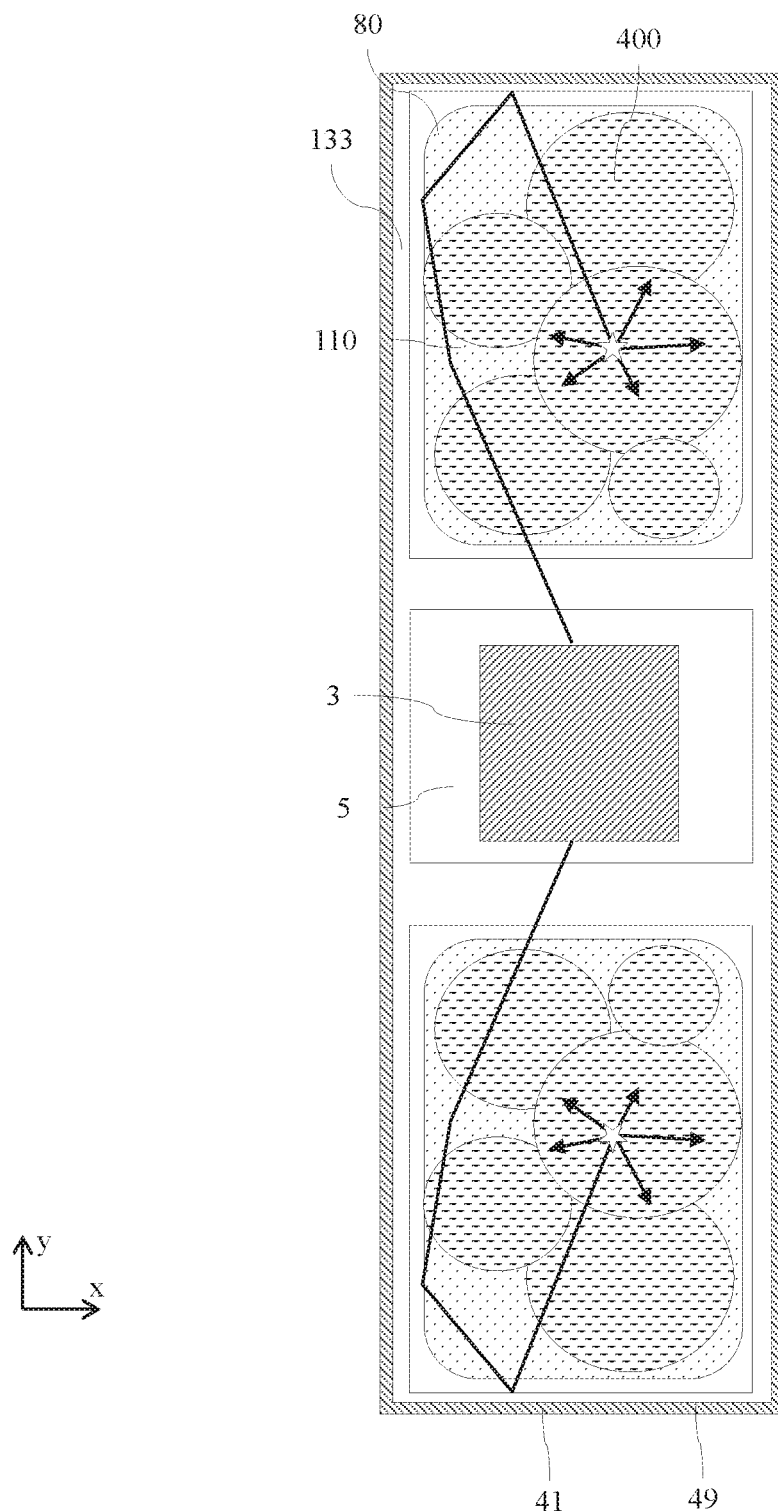
FIG. 10B is a schematic diagram illustrating in top view operation of a reflective optical element, a micro-LED and aligned wavelength conversion element wherein the wavelength conversion material comprises a large particle size material.

FIG. 10A is a schematic diagram illustrating in side view and FIG. 10B is a schematic diagram illustrating in top view operation of a reflective optical element 102, a micro-LED 3 and aligned wavelength conversion element and wherein the wavelength conversion material comprises a material 400 with relatively large particle size compared to the size of the micro-LED 3. The material 400 may comprise one or more phosphors.

In a cell phone application, a typical sub-pixel size is 15×45 micrometres for example. Phosphor materials can provide efficient wavelength conversion but are typically produced by grinding to small particles 400, typically of size 5 micrometres or greater. The wells 70 arranged on the reflective side 43 of the reflective optical element 102 can confine such particles in a binding material 80 such as a silicone and provide illumination of such particle sized phosphors for small pixel pitches, that is at off-axis angles, thus increasing the effective area of the phosphor to incident illumination, even for low packing densities that result from the large particle 400 size.

Advantageously a high-resolution colour display 100 may be provided with high conversion efficiency and colour gamut. Further phosphors are not typically sensitive to oxygen and water in comparison to quantum dot materials, and such devices can achieve long lifetime. Further the phosphor particles 400 are remote from the micro-LED 3 and so phosphor operating temperature is reduced and phosphor efficiency may be increased.

The reflective optical element 102 may comprise air gap 50 between the walls 49, reducing cost and complexity of assembly. Input light rays 110 from the respective aligned at least one micro-LED 3 is input through at least one light input region 35 of the light transmission opening 133 and is output through light output regions 37a, 37b different from the light input region 35 of the light transmission opening 133 after incidence on at least one reflective rear surface 43 and the respective aligned wavelength conversion element 400.

Figure 10C:
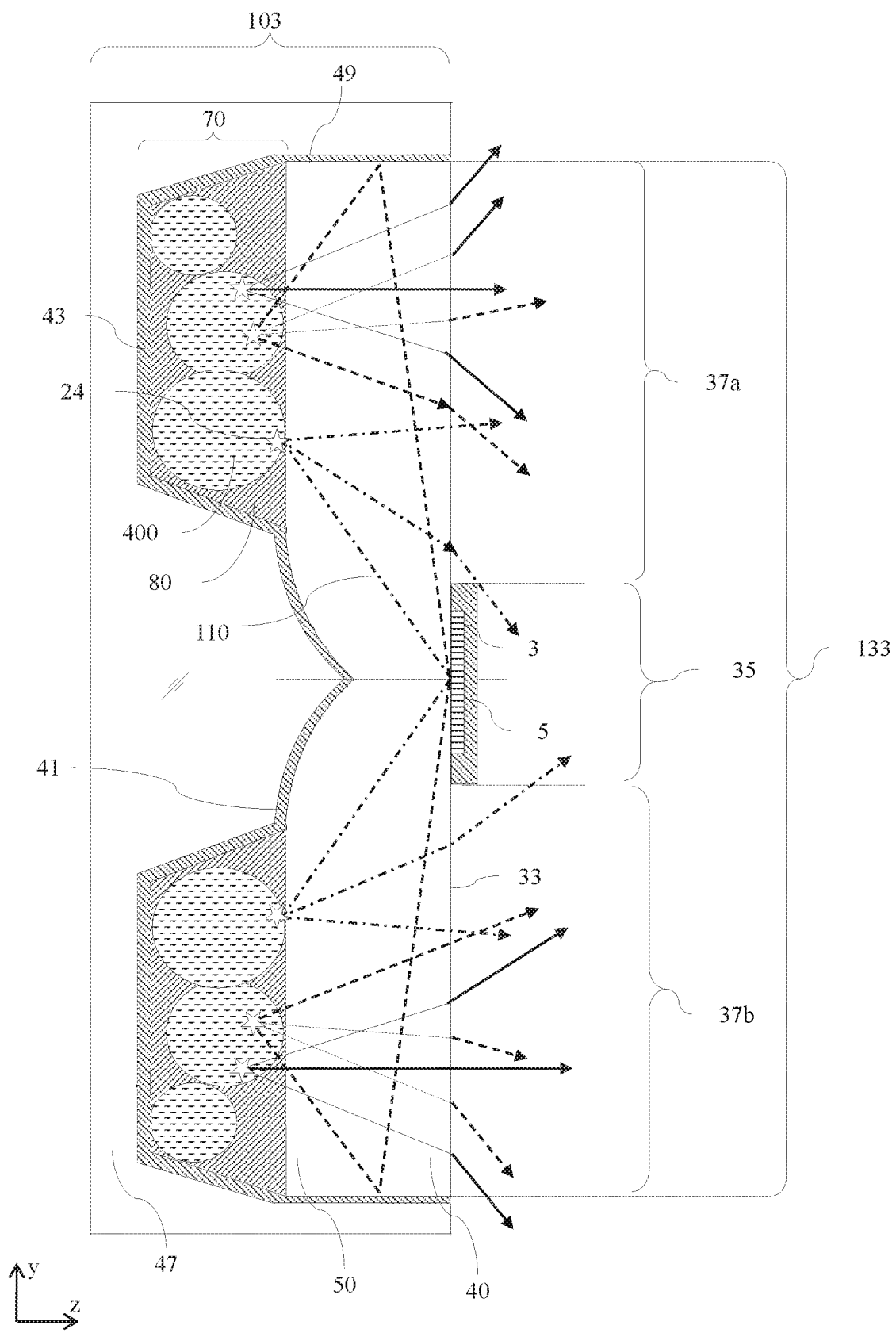
FIG. 10C is a schematic diagram illustrating in side view operation of a reflective optical element, a micro-LED and aligned wavelength conversion element wherein the wavelength conversion material comprises a large particle size material and wherein the micro-LED is provided on a transmissive material provided between the reflective rear surface and transmissive front surface.

FIG. 10C is a schematic diagram illustrating in side view operation of a reflective optical element 102, a micro-LED 3 and aligned wavelength conversion elements wherein the wavelength conversion material comprises a large particle size material 400 and wherein the micro-LED 3 is provided on a light-transmissive material 40 provided between the reflective rear surface 43 and a light transmissive front surface 33. In comparison to the arrangement of FIG. 10A, the micro-LED 3 may be aligned on the reflective optical element 102 during fabrication, and alignment of separate substrates are reduced, advantageously reducing cost and complexity.

Features of the arrangements of FIGS. 10A-C not discussed in further detail may be assumed to correspond to the features with equivalent reference numerals as discussed above, including any potential variations in the features.

It would be desirable to provide a directional output from the display 100.

Figure 11A:
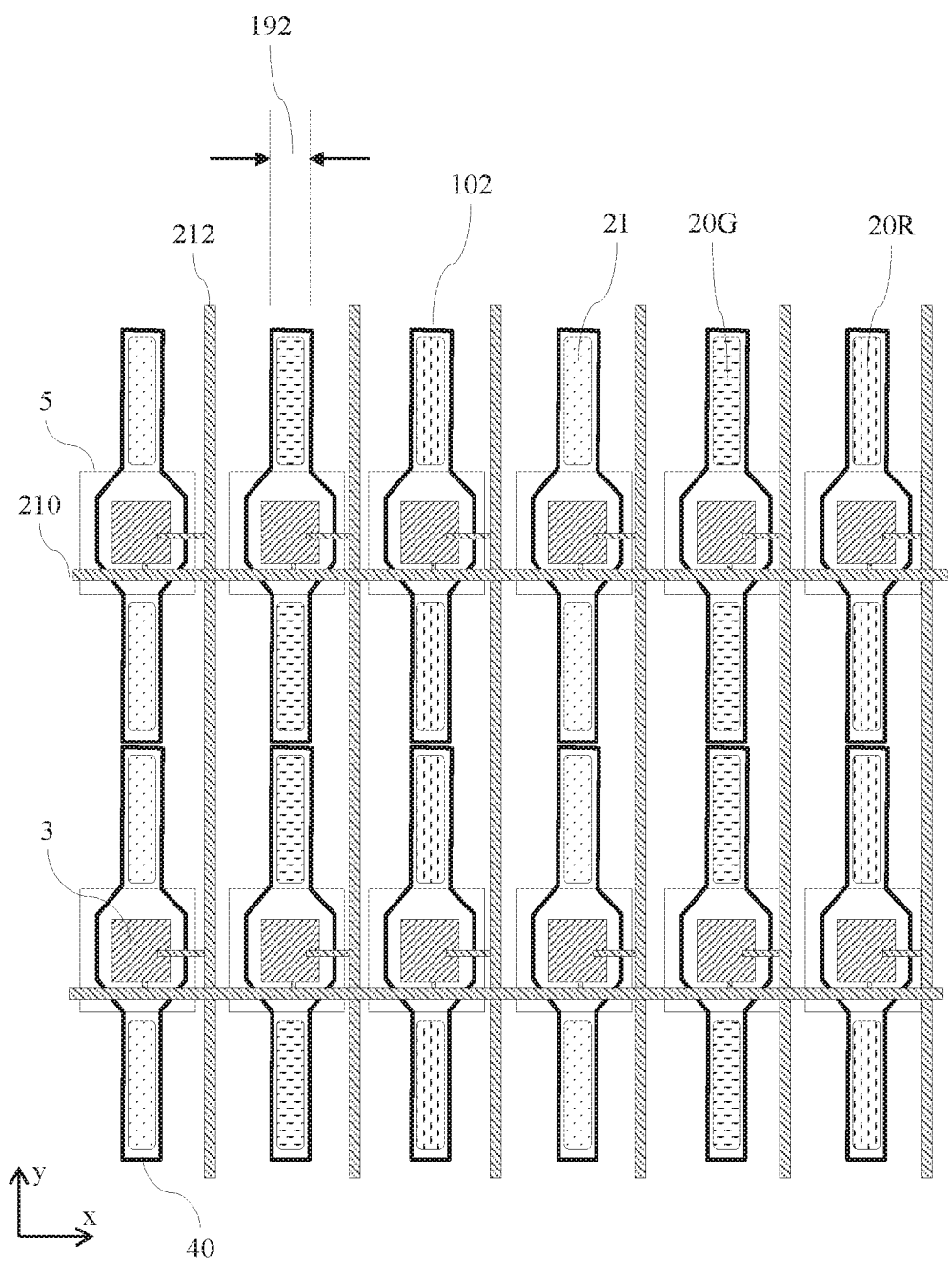
FIG. 11A is a schematic diagram illustrating in front view an array of reflective optical elements and aligned micro-LED array wherein the width of the output of the reflective optical elements transparent output region is reduced.

FIG. 11A is a schematic diagram illustrating in front view an array of reflective optical elements 102 and aligned micro-LED 3 array wherein the width of the output of the reflective optical elements 102 transparent output region is reduced. Input light 110 is confined within the width 192 of the output region of the reflective optical element 102, whereas no light is emitted in the region of the light blocking element 5. Thus, a narrow width pixelated light source is provided by each reflective optical element 102.

Figure 11B:
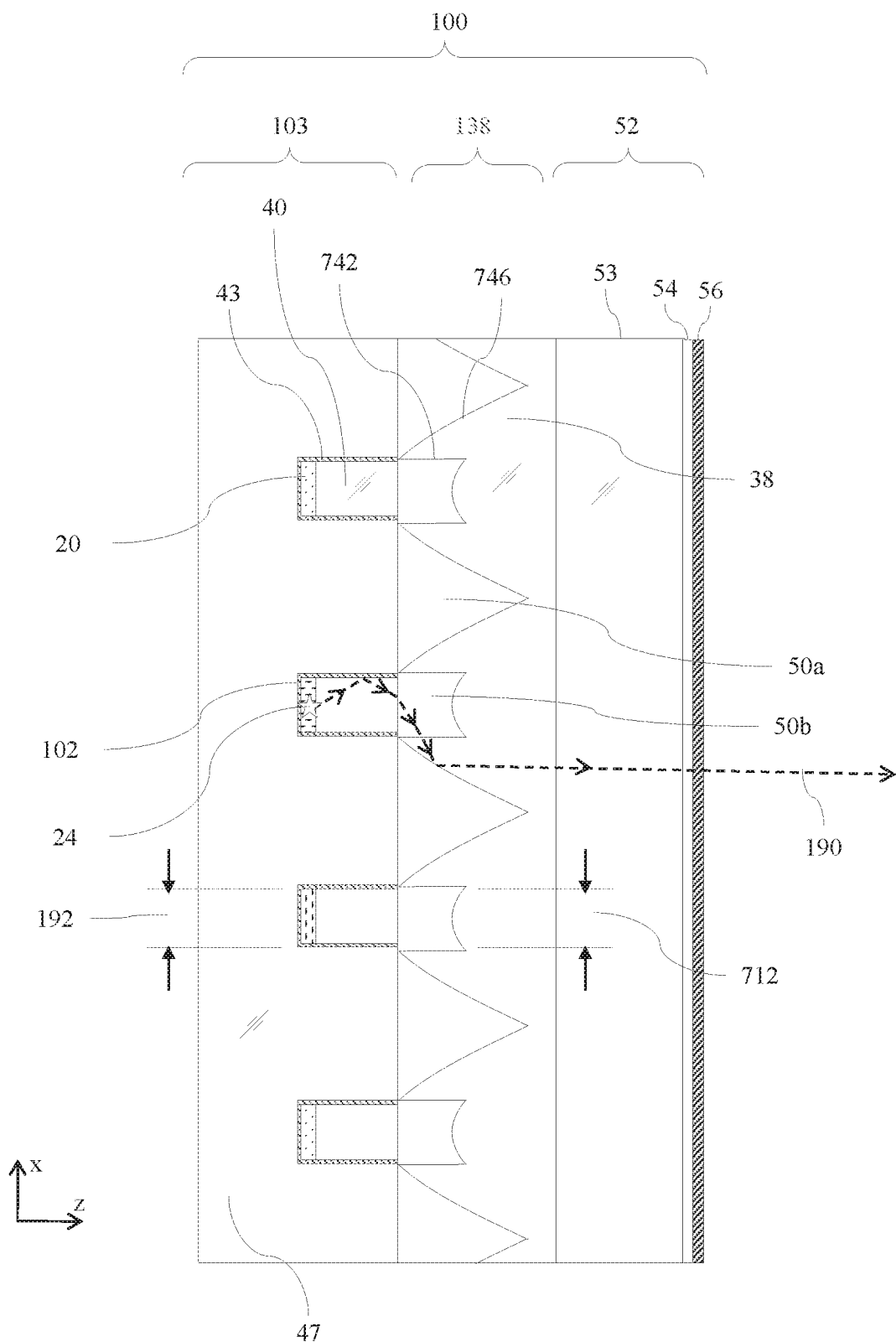
FIG. 11B is a schematic diagram illustrating in top view an array of reflective optical elements and aligned micro-LED array wherein the width of the output of the reflective optical elements transparent output region is reduced and arranged in alignment to an array of collimating catadioptric optical elements.

FIG. 11B is a schematic diagram illustrating in top view an array of reflective optical elements 102 wherein the width 192 of the output of the reflective optical elements 102 transparent output region is reduced and arranged in alignment to an array of collimating catadioptric optical elements 38 with input width 712.

A catadioptric optical element 38 is aligned with the output of each reflective optical element 102 with width 192 that is the same or less than the width 712 of the input of the catadioptric optical element 38.

Illustrative light ray 190 is output from the reflective optical element 102 at a high output angle with respect to the normal direction of the display 100. Such a light ray is directed through the catadioptric optical element 38 by total internal reflection and/or refraction such that it is output at angles close to the normal direction. Features of the arrangements of FIGS. 11A-B not discussed in further detail may be assumed to correspond to the features with equivalent reference numerals as discussed above, including any potential variations in the features.

Figure 11C:
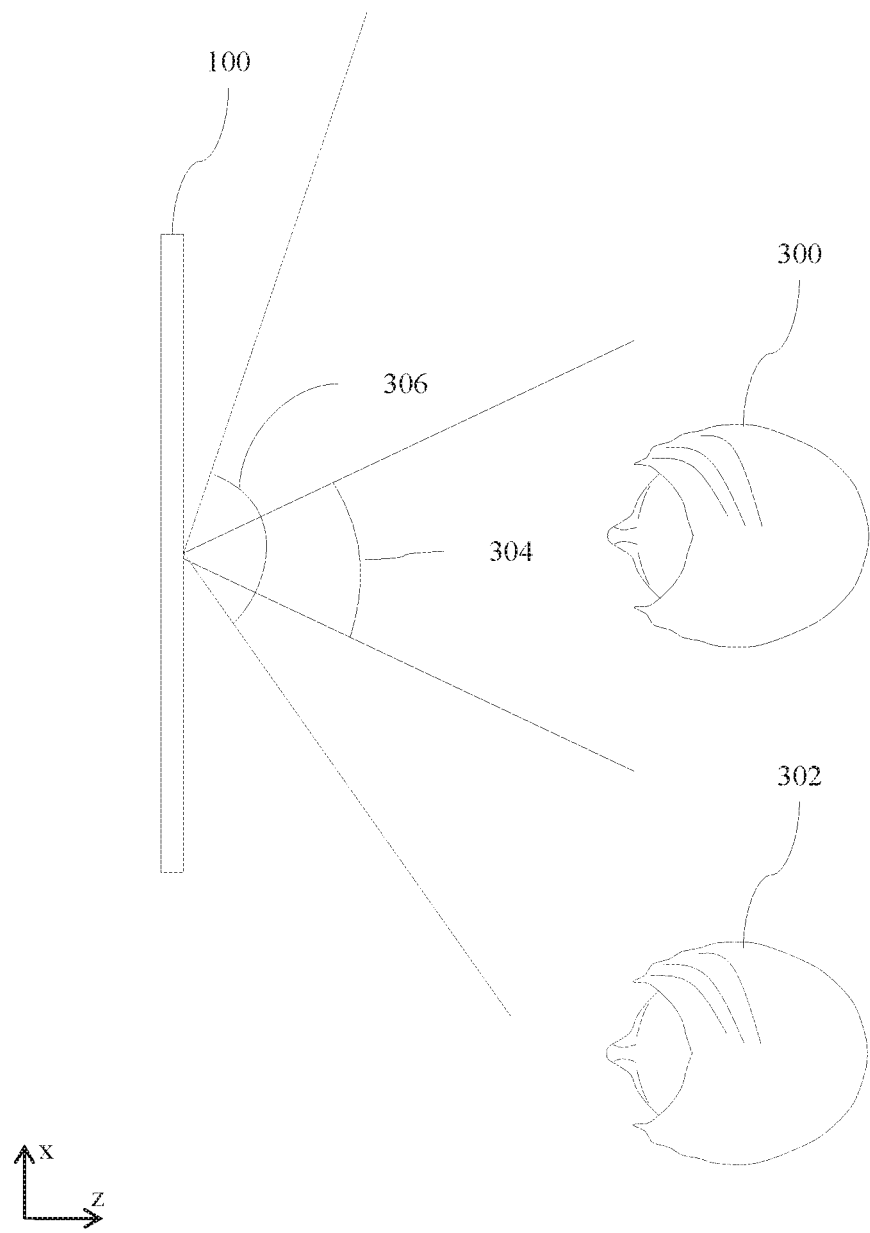
FIG. 11C is a schematic diagram illustrating in top view viewing of a directional display by a primary user and an off-axis snooper.

FIG. 11C is a schematic diagram illustrating in top view viewing of a directional display by a primary user and an off-axis snooper for the display 100 of FIG. 11B.

The angular size 304 of the light cone from the reflective optical element 102 is reduced by the catadioptric optical element 38. Advantageously the head on luminous intensity is increased and display efficiency for a head on user 300 enhanced.

Further a privacy display as illustrated in FIG. 11C may be provided such that snooper 302 cannot see the displayed image. Such privacy displays may also provide low stray light for off axis operation, for example in night time use and automotive display.

A directional output comprises an optical output luminous intensity distribution that is non-Lambertian to achieve higher efficiency for head-on users. Such directional distributions typically have solid angle profiles that have a full width for half maximum luminance in at least one axis that is less than 50 degrees for a wide-angle mode of operation and less than 30 degrees for a privacy or stray light mode of operation.

It would be desirable to provide a switchable privacy display.

Figure 11D:
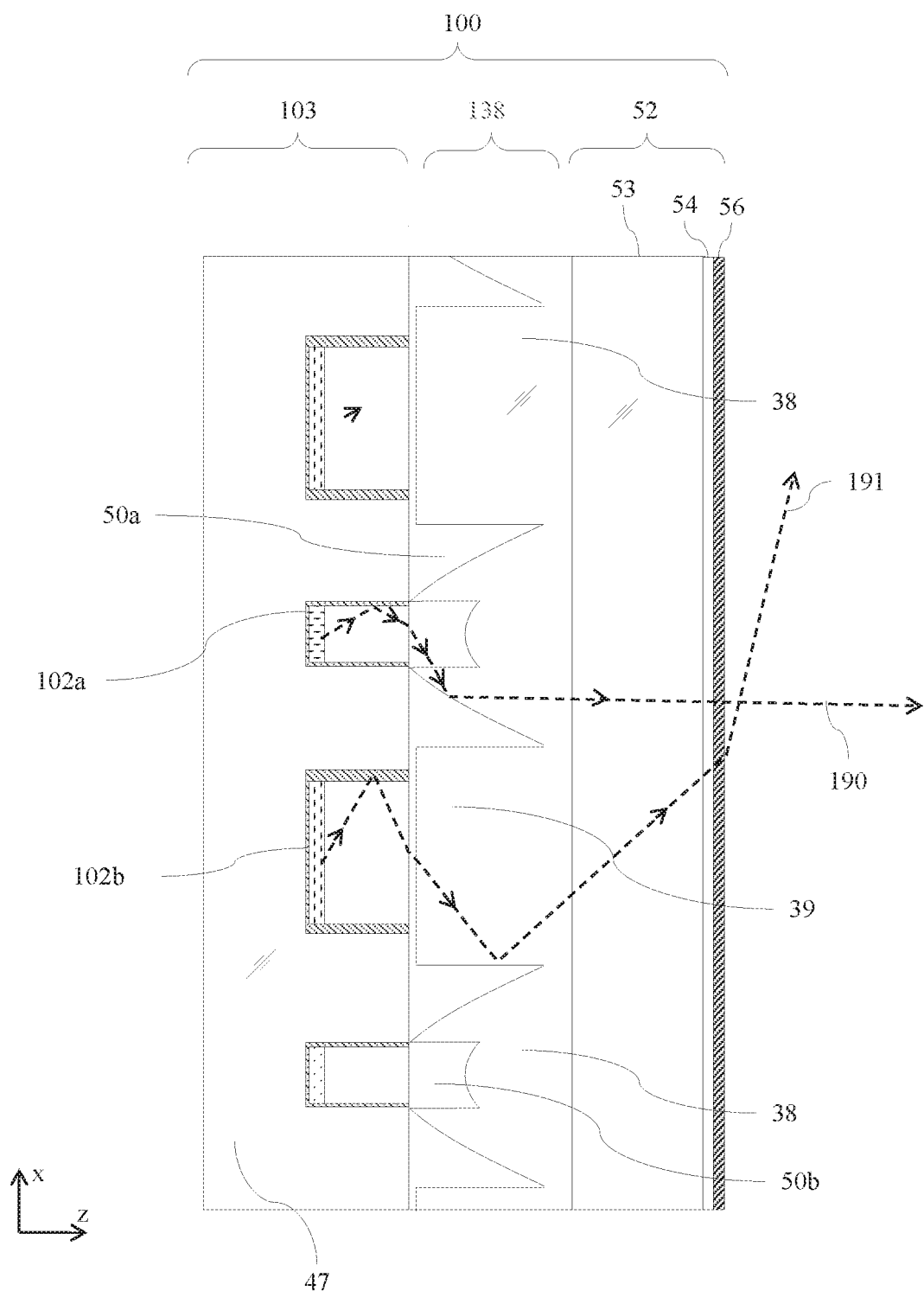
FIG. 11D is a schematic diagram illustrating in top view an array of reflective optical elements and aligned micro-LED array aligned to an array of collimating catadioptric optical elements and an array of linear waveguides to provide a switchable privacy display.

FIG. 11D is a schematic diagram illustrating in top view an array of reflective optical elements and aligned micro-LED array aligned to an array of collimating catadioptric optical elements 38 and an array of linear waveguides 39 to provide a switchable privacy colour display 100.

Switchable privacy displays comprising micro-LEDs are described in PCT/GB2018/050893 and incorporated herein in its entirety by reference.

In operation, light from reflective optical elements 102a are aligned to catadioptric optical elements 38 to provide the narrow angle size 304 light cone as illustrated in FIG. 11C.

Light from reflective optical elements 102b is aligned to linear waveguides 39 that are arranged between the catadioptric optical elements 38. Light rays 191 are provided that have substantially the same directional distribution as the light ray in the reflective optical element 102b. Returning to the description of FIG. 11C, light cone 306 may be provided by illuminating micro-LEDs 3 aligned to reflective optical elements 102b. Advantageously a display may be switched between a narrow angle mode for power savings and privacy operation; and a wide-angle mode for multiple users and higher image uniformity.

Features of the arrangement of FIG. 11D not discussed in further detail may be assumed to correspond to the features with equivalent reference numerals as discussed above, including any potential variations in the features.

The structure and operation of catadioptric optical element 38 will now be described further.

Figure 11E:
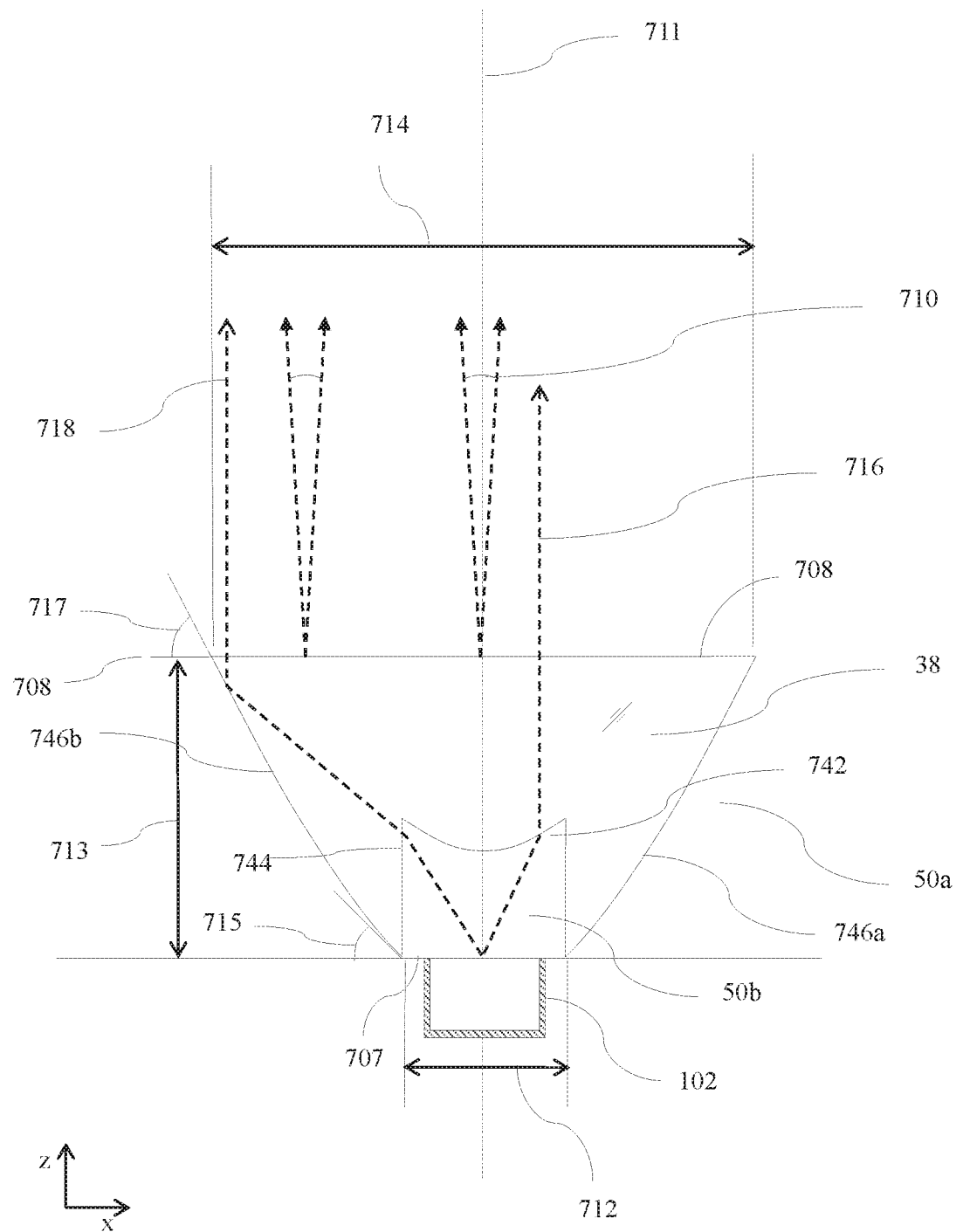
FIG. 11E is a schematic diagram illustrating in top view the structure and operation of a catadioptric optical element and aligned reflective optical element.

FIG. 11E is a schematic diagram illustrating in top view the structure and operation of a catadioptric optical element and aligned reflective optical element.

The catadioptric optical element 38 comprises in at least one catadioptric cross-sectional plane through its optical axis 711 a first outer surface 746a and a second outer surface 746b facing the first outer surface 746a. The first and second outer surfaces 746a, 746b comprise curved surfaces.

The first and second outer surfaces 746a, 746b extend from a first end 707 of the catadioptric optical element 38 to a second end 708 of the catadioptric optical element 38, the second end 708 of the catadioptric optical element 38 facing the first end 707 of the catadioptric optical element 38;

The distance 712 between the first and second outer surfaces 746a, 746b at the first end 707 of the catadioptric optical element 38 is less than the distance 714 between the first and second outer surfaces 746a, 746b at the second end 708 of the catadioptric optical element 38.

At least one transparent inner surface 742, 744 is arranged between the first and second ends 707, 708 and between the first and second outer surfaces 746a, 746b.

The reflective optical element 102 may be positioned between the first end 707 of the catadioptric optical element 38 and the at least one transparent inner surface 742, 744 of the catadioptric optical element 38 and aligned with the catadioptric optical element. For example in the cross sectional plane the centre of the reflective optical element 102 may be aligned with the optical axis 711 of the catadioptric optical element. In the present disclosure the terminology "at the first end of" the catadioptric optical element includes, for example, the micro-LED being a small amount under the first end 707, in the same plane as the end 707 of the catadioptric optical element 38, or in the vicinity of the end 707, or in the proximity of the end 707 or adjacent the end. In each case this may include aligned with the optical axis of the catadioptric optical element. The above description can be applied to all the embodiments.

A catadioptric optical system uses both reflection and refraction of light. Further, a catadioptric optical system is one where refraction and reflection are combined in an optical system, usually via lenses (dioptrics) and curved mirrors (catoptrics). Catadioptric optical elements can include RXI optical elements that achieve ray deflections by refraction (R), reflection from metals (X), and total internal reflection (I).

The first and second outer surfaces 746a, 746b each comprise curved surfaces that extend from a first end 707 of the catadioptric optical element to the second end 708 of the catadioptric optical element 38, the second end 708 of the catadioptric optical element facing the first end 707 of the catadioptric optical element 38. Further the transparent inner surface 742, 744 comprises at least one curved surface 742. The exterior angle 715 between the first end 707 and the first outer surface 746a at the first end 707 may be less than the exterior angle 717 between the first end 707 and the first outer surface 746a at the second end 708. Further the exterior angle between the first end 707 and the second outer surface 746b at the first end 707 is less than the exterior angle between the first end 707 and the second outer surface 746b at the second end 708.

Advantageously collimated light may be provided with a directional light output distribution that has a narrow cone angle.

The catadioptric optical element 38 may be arranged to provide substantially collimated output light from the reflective optical element 102 for light that is incident on the curved outer surfaces 746a, 746b and the at least one of the transparent inner surface 744 which may have positive optical power. Further at least one of the transparent inner surfaces 744 may have zero optical power. Advantageously surfaces 744 may be conveniently provided during tooling and moulding steps of manufacture. Further, such surfaces may cooperate to provide collimated light for all light rays from reflective optical element 102 over a high output solid angle.

Thus some of the light output illustrated by ray 718 of reflective optical element 102 of the plurality of reflective optical elements 102 is transmitted by the at least one transparent inner surface 744 before it is reflected at the first or second outer surfaces 746a, 746b and directed into the first directional light output distribution 120; and some of the light output illustrated by ray 716 of reflective optical element 102 of the plurality of reflective optical element 102 is transmitted by the at least one transparent inner surface 742 and directed into the first directional light output distribution 120 without reflection at the first or second outer surfaces 746a, 746b.

In at least one cross sectional plane, the present embodiments provide a reduction in the width of the output directional light output distribution to provide directionality with a directional light output distribution (as described by solid angle Ωout) that is smaller than the input directional light output distribution (as described by solid angle Ωin) by the catadioptric optical element.

Figure 12A:
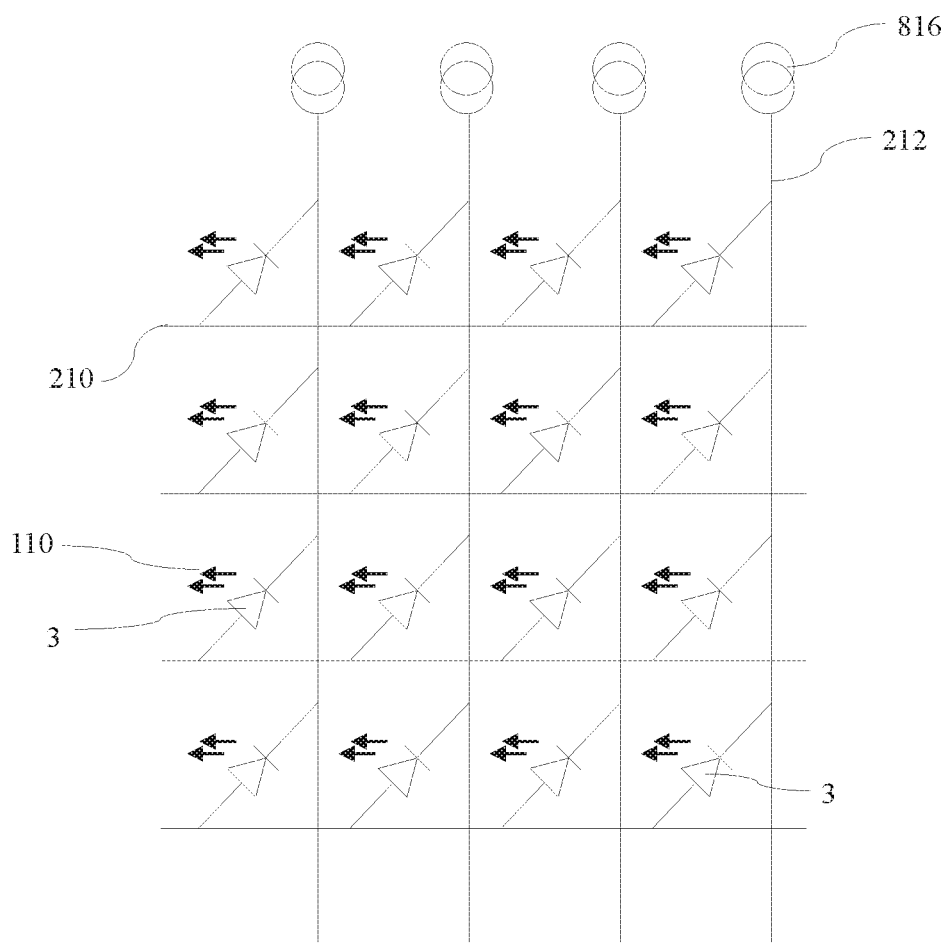
FIGS. 12A-C are schematic diagrams illustrating addressing systems for the plurality of LEDs.

FIG. 12A is a schematic diagram illustrating an addressing system for the plurality of LEDs. The electrodes 211, 213 of FIG. 3B for each of the micro-LEDs 3 of the plurality micro-LEDs 3 are respectively connected to one column addressing electrode 212 and one row addressing electrode 210 to form a matrix. In this embodiment an array of current sources 816 is used to drive the addressing electrodes 212. The voltage on each of the row electrodes 210 is pulsed in sequence to scan or address the array of micro-LEDs 3. A current source 816 may be provided for each column electrode 212 or may be time multiplexed (shared) amongst a set of column electrodes 212. The micro-LEDs 3 have a relatively sharp voltage vs. current curve and can be operated with very short pulses without cross-talk between them. The array of micro-LEDs 3 forms an addressable display without the need for additional active components such as TFTs or integrated circuits at each pixel. However, all the energy to illuminate the micro-LEDs must be provided during the addressing pulse. Advantageously the addressing matrix is simple and low cost.

It would be desirable to reduce the peak LED current while maintaining light output levels. Returning to the description of FIG. 7F, drive circuit 820 and additional addressing electrode 213 are illustrated in embodiments wherein circuits 820 at the pixels can achieve extended drive time for each pixel.

Figure 12B:
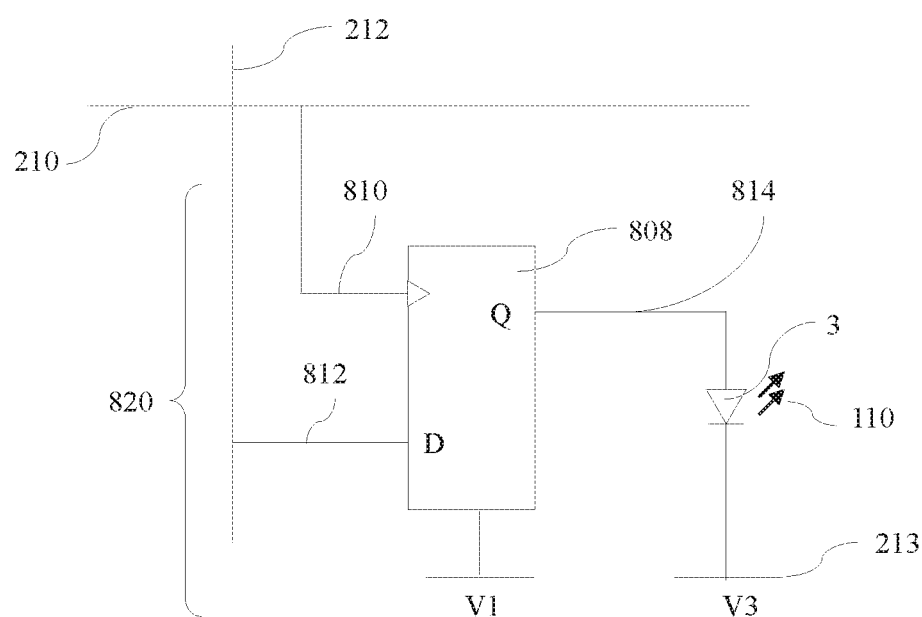

FIG. 12B is a schematic diagram illustrating another addressing embodiment for the plurality of LEDs. The micro-LEDs 3 of the plurality micro-LEDs 3 are addressed by column addressing electrodes 212 and row addressing electrodes 210 to form a two-dimensional matrix. For clarity only one micro-LED 3 and one column electrode 212 and one row electrode 210 of the matrix is shown. FIG. 12B differs from FIG. 12A in that each micro-LED 3 has associated with it an integrated circuit 808 which includes a storage or memory or latching function. The integrated circuit 808 may be an analog or digital circuit and may be embodied as a separate chip located using a method that is similar to the micro-LED 3 location method or may be embodied with TFTs. The integrated circuit 808 may be provided with one or more additional supply potentials V1, V3. The drive circuit 820 comprises integrated circuit 808. When the row electrode 210 is pulsed the clock input 810 of integrated circuit 808 stores the column electrode 212 voltage connected to the Data input 812. The output 814 of the integrated circuit 808 drives the micro-LED 3. The other end of the micro-LED is connected to supply potential V3. Depending on the design of integrated circuit 808 the potential V1 may be different to V3. The integrated circuit 808 may include a voltage to current converter. The potential V3 on electrode 213 and the anode and cathode connections of the micro-LED 3 may be configured so that the micro-LED is forward biased and emits light. The integrated circuit 808 provides drive to the micro-LED 3 for longer than the duration of the addressing pulse on row electrode 210 and the peak current drive to the micro-LEDs 3 is reduced. Advantageously the peak current in each micro-LED 3 is reduced.

Figure 12C:
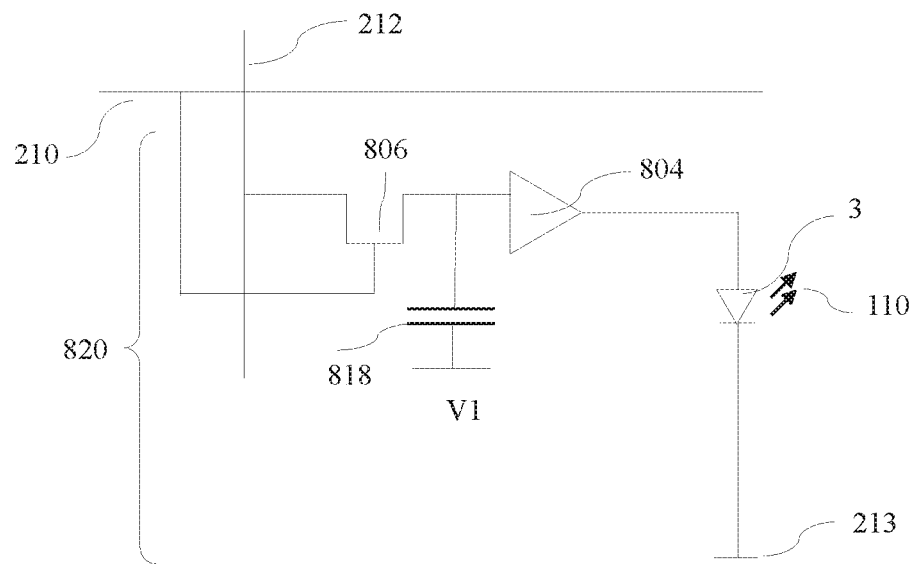

FIG. 12C is a schematic diagram illustrating another addressing embodiment for the plurality of LEDs. The micro-LEDs 3 of the plurality micro-LEDs 3 are addressed by column addressing electrodes 212 and row addressing electrodes 210 to form a 2-dimensional matrix or array. Drive circuit 820 comprises TFT 806, amplifier 804 and capacitor 818. In this embodiment row electrodes 210 is connected to the gate of TFT 806 and when the row addressing electrode 210 is pulsed, the data from column addressing electrode 212 is stored on capacitor 818. Capacitor 818 may be small compared to that typically used in a matrix to drive an LCD panel and may be provided by the input capacitance of amplifier 804. The amplifier 804 may drive one or more micro-LEDs 3. Amplifier 804 may be provided with 1 or more supply voltages (not shown). Amplifier 804 may include a voltage to current converter circuit. V1 may be a ground or reference potential. The voltage output from amplifier 804 must be greater than voltage V3 on electrode 213 by the combined forward voltage drop (Vf) of the micro-LED 3 in order for the micro-LED 3 to illuminate.

The time for driving each micro-LED 3 is increased. Advantageously current crowding may be reduced and device efficiency improved.

Operation of LEDs and micro-LEDs 3 will now be described.

Figure 13A:
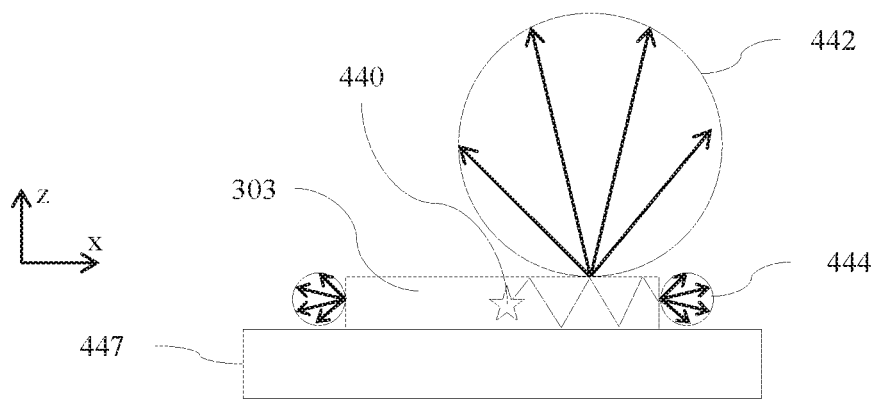
FIG. 13A is a schematic diagram illustrating in side view luminous intensity emission profile from a macroscopic LED.

FIG. 13A is a schematic diagram illustrating in side view luminous intensity emission profile from a macroscopic LED 303 of the size typically comprised in a packaged LED, for example 0.5×0.5 mm or larger.

Figure 13B:
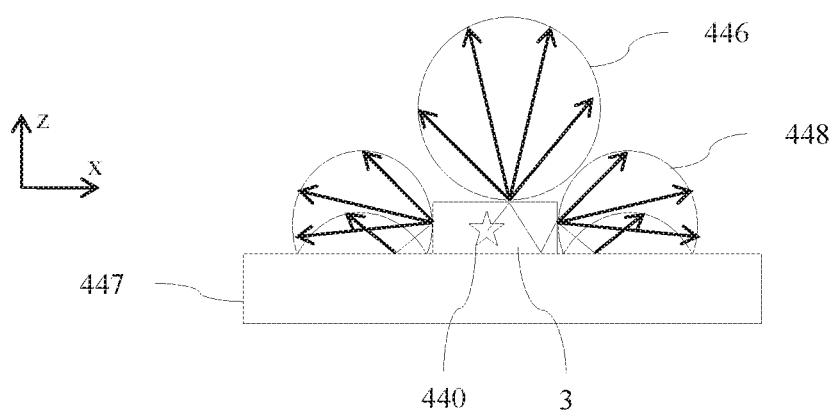
FIG. 13B is a schematic diagram illustrating in side view luminous intensity emission profile from a micro-LED.

FIG. 13B is a schematic diagram illustrating in side view luminous intensity emission profile from a micro-LED 3 mounted on a backplane substrate 447 and arranged to emit light away from the backplane substrate 447.

After light emission 440 within macroscopic LEDs 303 and micro-LEDs 3, the high refractive index of gallium nitride causes light guiding within the chip.

For macroscopic LEDs 303, surface roughening can provide top surface light extraction and such LEDs 330 typically output a substantially Lambertian luminous intensity profile 442 from its top surface, with lower level luminous intensity profiles 404 from edge emission.

However, scaling to micro-LED sizes surface roughening has less impact on output by top surface scatter and so the proportion of light that is output by edge emission increases so that top surface luminous intensity profile 446 reduces in comparison to edge emission luminous intensity profile 448. Such increased edge emission from micro-LEDs can reduce the light output efficiency for desirable directions of output (such as in the normal direction) for known micro-LED surface mounting methods.

Figure 14:
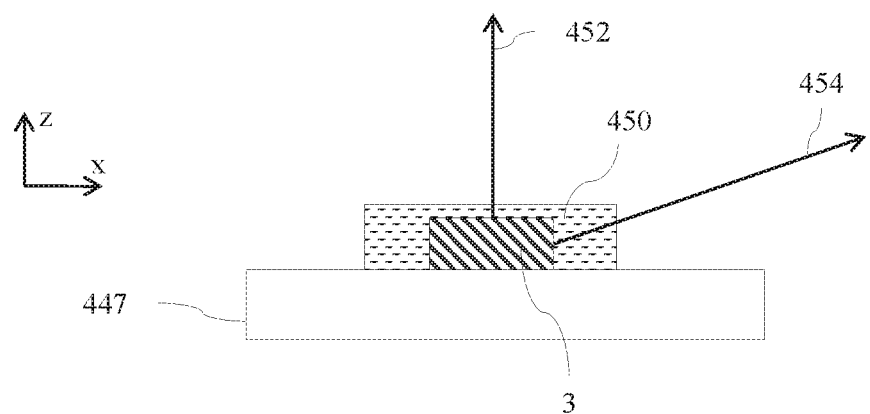
FIG. 14 is a schematic diagram illustrating in side view variation in optical path length through a wavelength conversion coating for light from a micro-LED.

FIG. 14 is a schematic diagram illustrating in side view variation in optical path length through a small particle size wavelength conversion coating layer 450.

Such coating 450 may have a different thickness to light rays 452 that are directed in the surface normal direction in comparison to rays 454 that are emitted in a lateral direction. Such a different thickness can provide an undesirable colour change of output with viewing direction. Further light may be lost in thicker layers of wavelength conversion materials, reducing efficiency. Further, accurate methods with very small volumes of material may be used to provide control of colour output.

Further heating from the micro-LED 3 can degrade the efficiency and lifetime of the wavelength conversion material 450.

Advantageously the present embodiments achieve a uniform illumination for light rays 452, 454 from the micro-LED 3 onto the wavelength conversion elements 20 and reduce the operating temperature of the wavelength conversion materials.

Arrangements of phosphor particles 400 with micro-LEDs in known colour output micro-LED 3 will now be described.

Figure 15A:
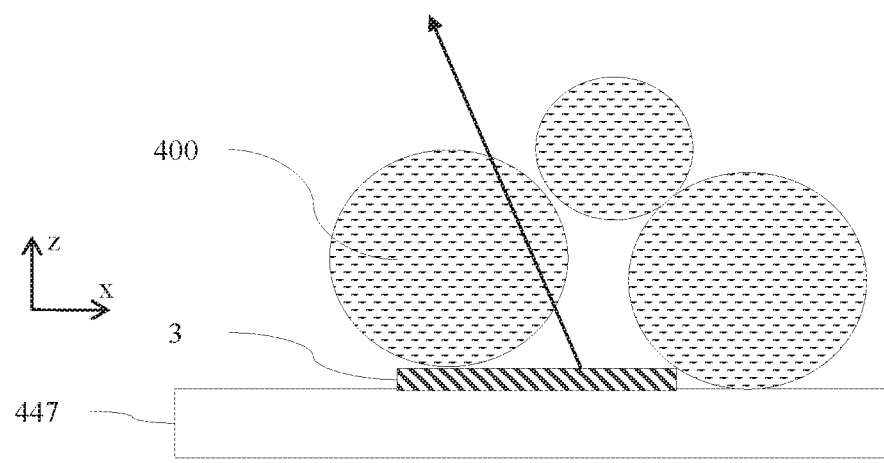
FIG. 15A is a schematic diagram illustrating in side view output from a micro-LED comprising wavelength conversion coating with large particle sizes.
Figure 15B:
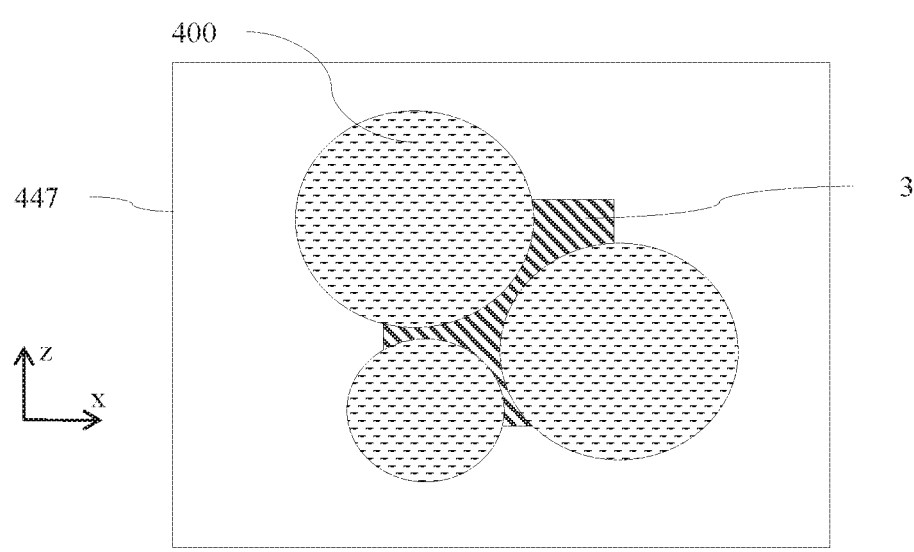
FIG. 15B is a schematic diagram illustrating in front view output from a micro-LED comprising wavelength conversion coating with large particle sizes.

FIG. 15A is a schematic diagram illustrating in side view output from a micro-LED comprising wavelength conversion coating with large particle sizes; and FIG. 15B is a schematic diagram illustrating in front view output from a micro-LED comprising wavelength conversion coating with large particle sizes. As described hereinbefore, the particles 400 of phosphor may have sizes that are similar to the sizes of micro-LEDs 3 for high resolution cell phone applications. Thus, light may be lost between particles 400 and colour gamut may be reduced and inconsistent colour output achieved across an array of micro-LEDs 3. Advantageously the present embodiments achieve a uniform illumination for phosphor materials as illustrated in FIGS. 10A-B.

Features of the arrangements of FIGS. 15A-B not discussed in further detail may be assumed to correspond to the features with equivalent reference numerals as discussed above, including any potential variations in the features.

Manufacturing methods for array 103 of reflective optical elements 102 and colour display 100 will now be described.

FIGS. 16A-G are schematic diagrams illustrating in side view a method to form an array of reflective optical elements 102 and aligned micro-LED array. For illustrative clarity a representative pair of reflective optical elements 102 of the array 103 is illustrated, however the array 103 may in practice comprise millions of reflective optical elements 102, numbering the total number of colour sub-pixels in a display, or in many displays.

Figure 16A:
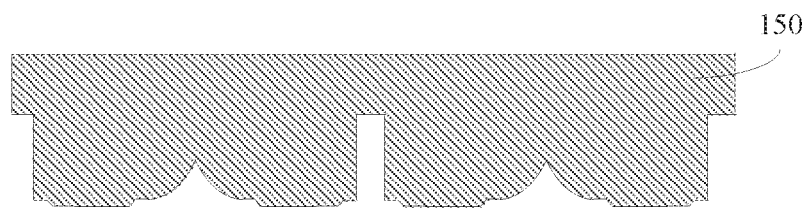
FIGS. 16A-G are schematic diagrams illustrating in side view a method to form an array of reflective optical elements and aligned micro-LED array.

In a first step as illustrated in FIG. 16A, a tool 150 may be provided, for example by diamond turning of a metal tooling blank.

Figure 16B:
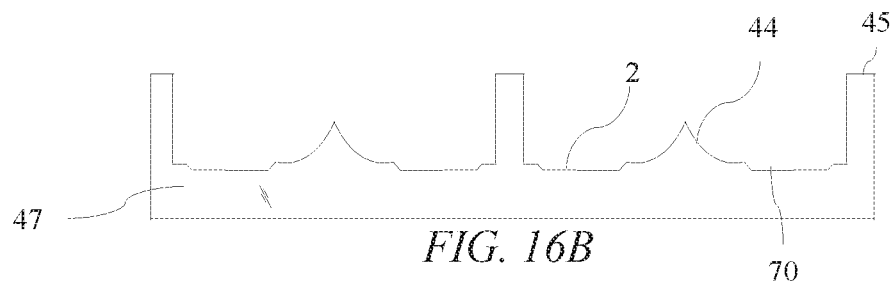

In a second step as illustrated in FIG. 16B, the body 47 may be formed by means of embossing, casting, injection moulding against the tool 150 or other known replication methods, and the tool 150 removed.

Figure 16C:
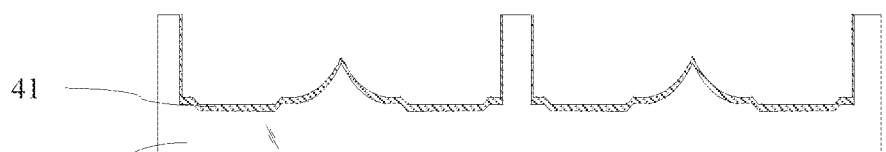

In a third step as illustrated in FIG. 16C a coating 41 may be applied to the body 47. The coating may be an evaporated, sprayed or sputtered metal coating or may comprise a coated white material, formed for example by dip or spray coating. Alternatively, the body may be formed in a reflective white material such as CEL-W epoxy marketed by Hitachi Chemical and the third step omitted.

Figure 16D:
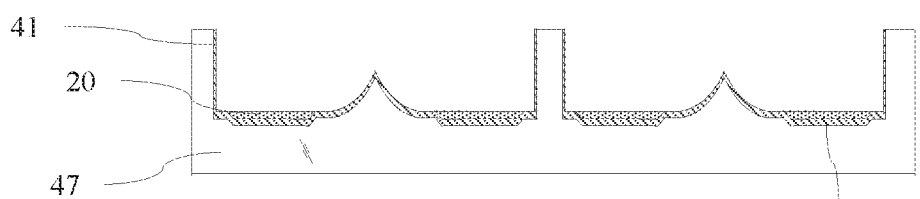

In a fourth step as illustrated in FIG. 16D, wavelength conversion materials may be applied on to the surface or in to wells 70 of the reflective surface to provide wavelength conversion elements 20. The wells 70 provide a defined location for the wavelength conversion material when deposited from a liquid solution for example by means of ink-jet printing. After deposition the liquid carrier is evaporated to leave the wavelength conversion material.

Figure 16E:
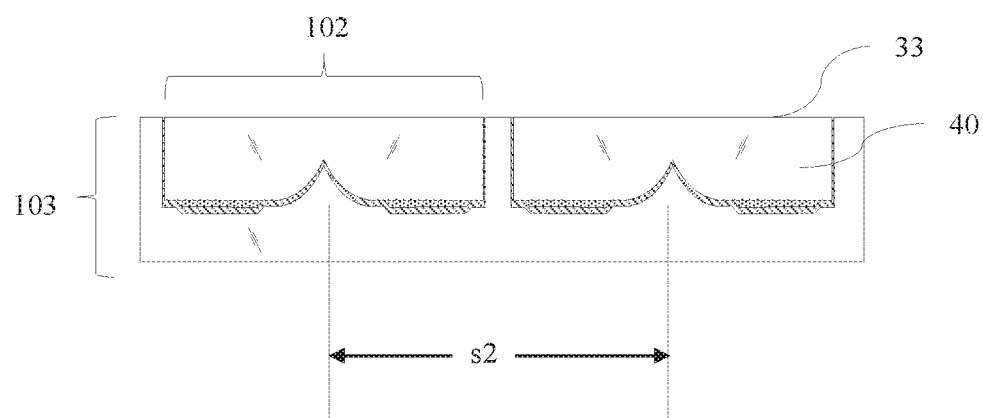

In a fifth step as illustrated in FIG. 16E, a filler material 40 is provided between the reflective surface and a mould and cured to provide output surface 33. The reflective optical elements 102 in a first direction have a separation s2.

Figure 16F:
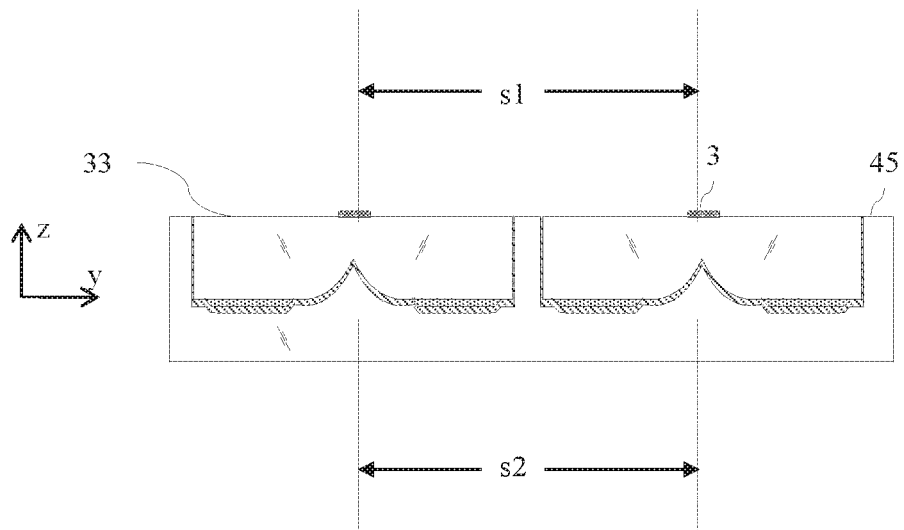

In a sixth step as illustrated in FIG. 16F micro-LEDs 3 and addressing electrodes (not shown) are arranged on the surface 33, where the separation s1 of the micro-LEDs 3 in the same first direction is the same as the separation s2.

Figure 16G:
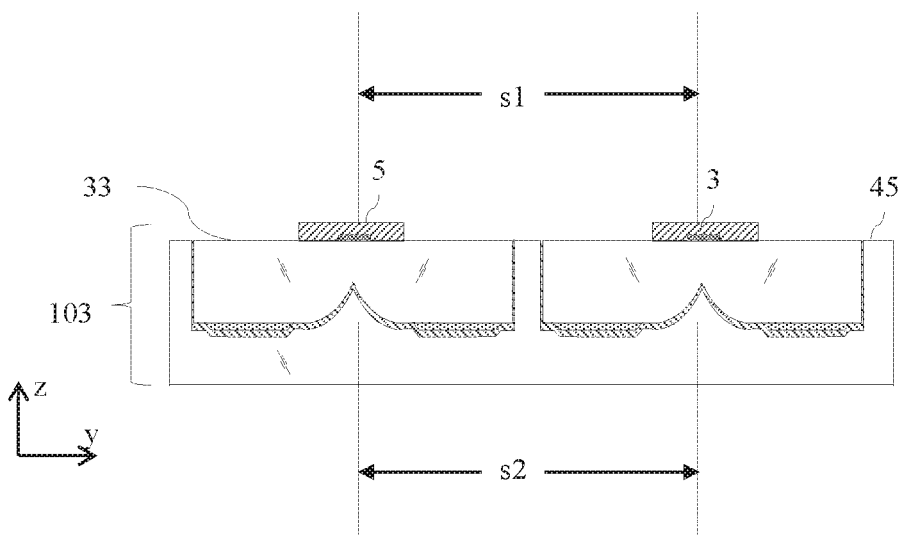

In a seventh step as illustrated in FIG. 16G, light blocking layer 5 is formed on the micro-LEDs 3. The light blocking layer may be a metal or a black resin. In the embodiments that the light blocking layer 5 is a metal, it may also function as part of the pixel addressing circuitry used to address and control the micro-LEDs 3.

Features of the arrangements of FIGS. 16A-G not discussed in further detail may be assumed to correspond to the features with equivalent reference numerals as discussed above, including any potential variations in the features.

A highly parallel method of manufacture for colour display 100 will now be described.

FIGS. 17A-17F are schematic diagrams illustrating in side view a method to form in parallel an array of displays 100 comprising arrays of reflective optical elements 102 and aligned micro-LED 3 arrays.

Figure 17A:
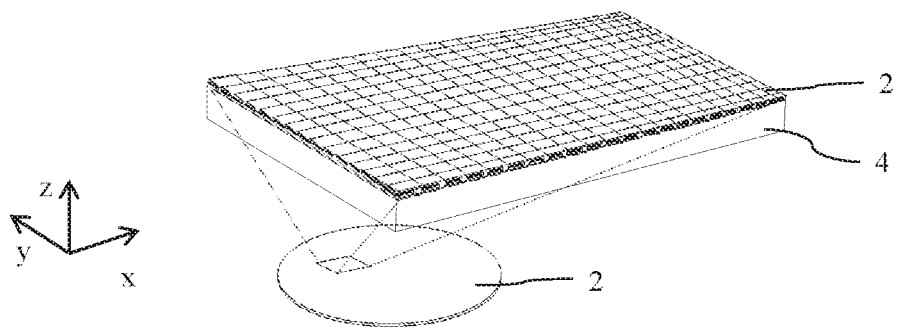
FIGS. 17A-17F are schematic diagrams illustrating in side view a method to form an array of reflective optical elements and aligned micro-LED array, in accordance with the present disclosure.

As illustrated in FIG. 17A, a monolithic LED wafer 2 that may be gallium nitride for example may be formed on a substrate 4 that may be sapphire, silicon or silicon carbide for example.

Figure 17B:
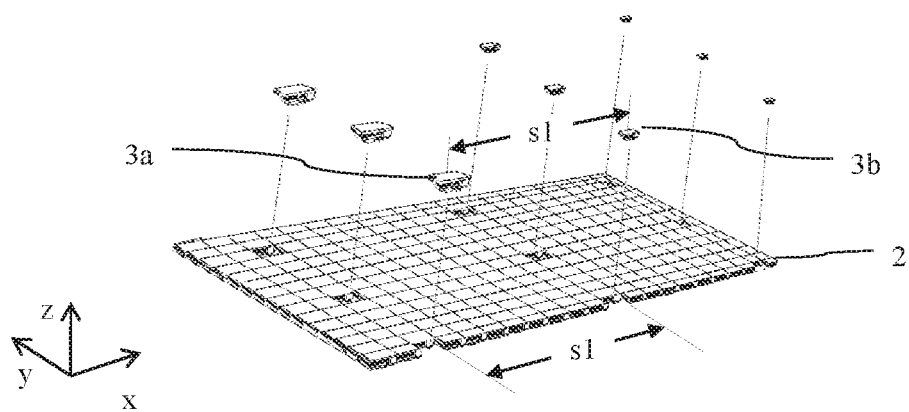

As illustrated in FIG. 17B, a non-monolithic array of micro-LEDs 3 may be extracted from the monolithic wafer 2 to provide micro-LEDs 3a, 3b with separation s1.

Figure 17C:
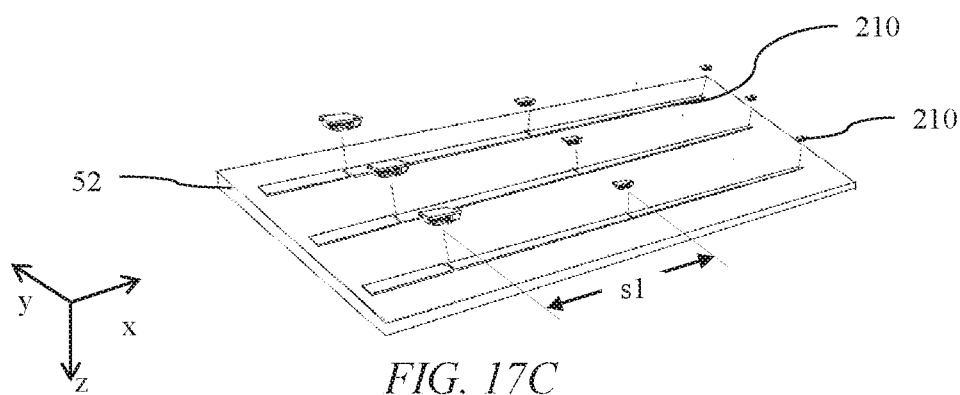

As illustrated in FIG. 17C, micro-LEDs 3a, 3b may be arranged on substrate 52 in alignment with addressing electrodes and other optical, electrical and thermal management elements (not shown) such that separation s1 is preserved.

Figure 17D:
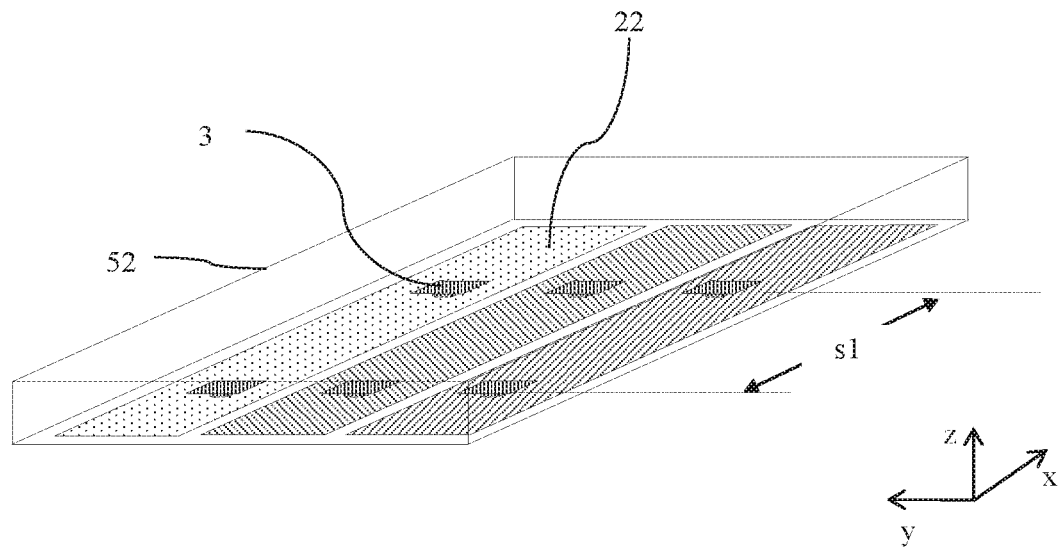

As illustrated in FIG. 17D, the substrate 52 may be aligned with a plurality of micro-LEDs with separations s1.

Figure 17E:
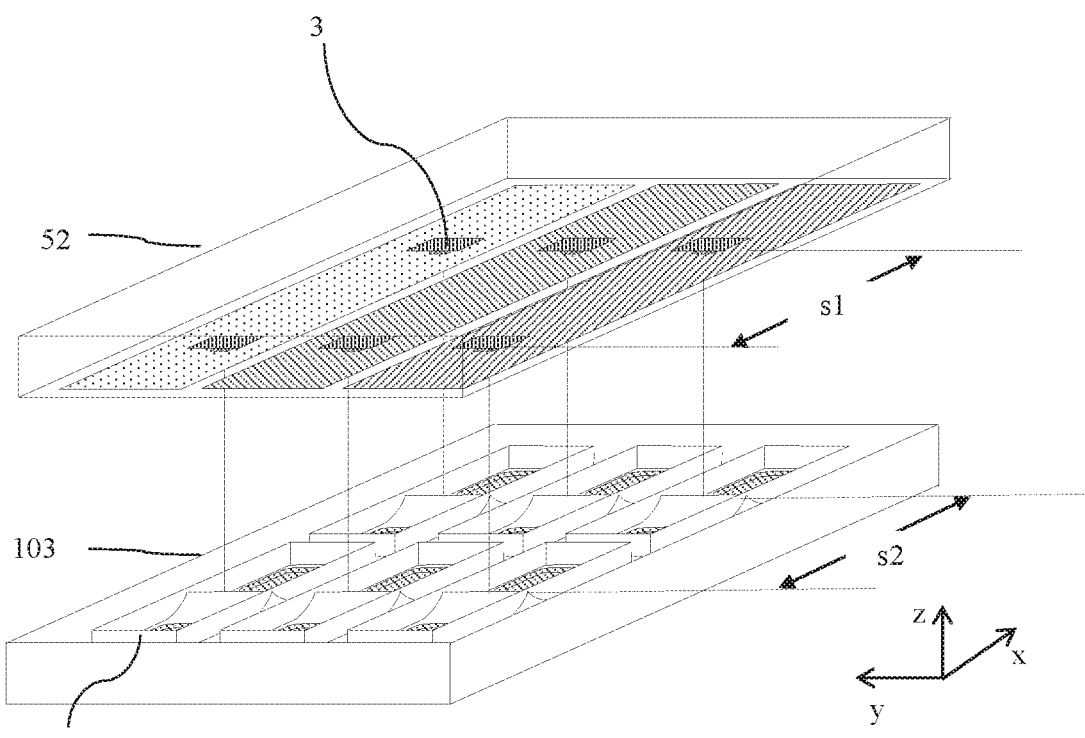

As illustrated in FIG. 17E, the substrate 52 and array 103 are aligned so each micro-LED 3 is aligned with a respective reflective optical element 102.

Figure 17F:
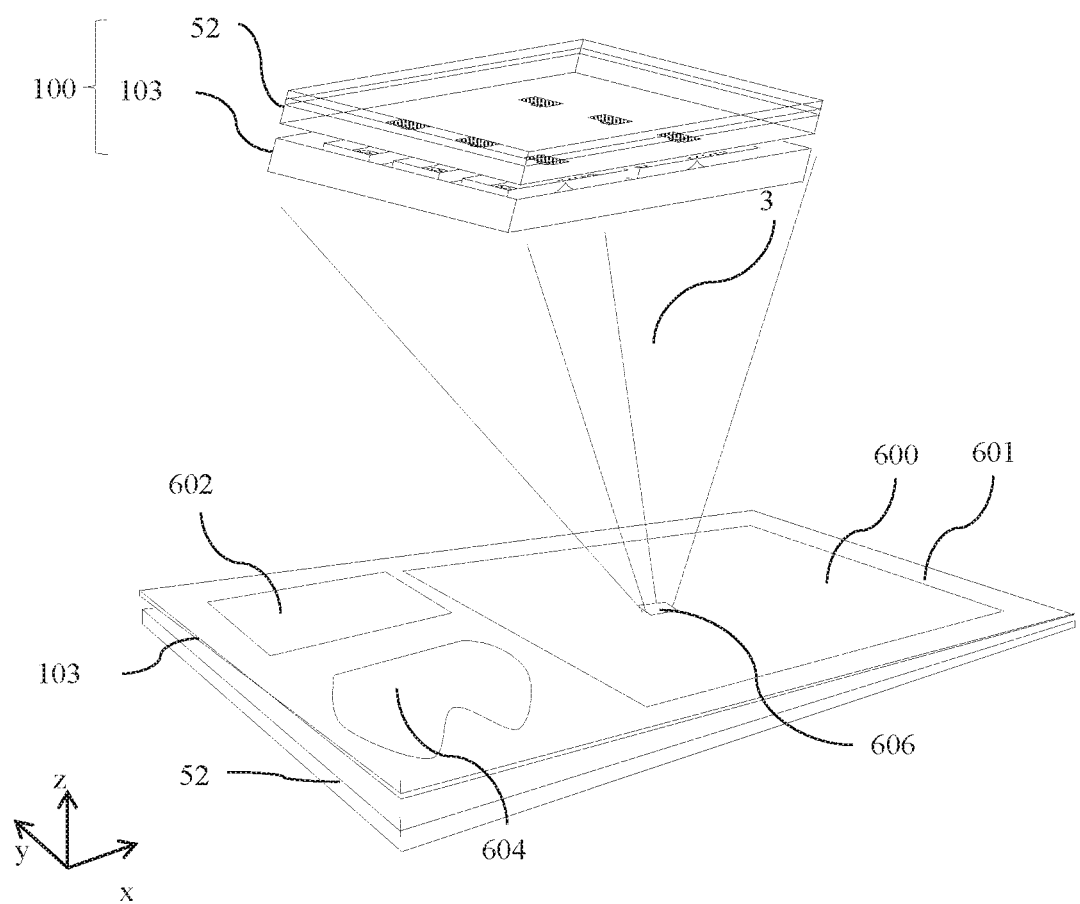

It would be desirable to provide multiple illumination apparatuses from large areas of aligned optical elements. As illustrated in FIG. 17F, the substrate 52 and array 103 may be provided at substantially larger area than the area of an individual display. Thus, various different colour displays 100 may be extracted with different areas and shapes 600, 602, 604, 606.

Advantageously large numbers of displays 100 may be formed over large areas using small numbers of extraction steps, while preserving alignment to a respective array of optical elements.

Further device seal lines 601 may be provided at the edge of each element to provide hermetic sealing of the optical elements and reduce dust and other material ingress into the optical elements during use.

Advantageously manufacturing cost and complexity can be reduced, and reliability during use increased.

Features of the arrangements of FIGS. 17A-F not discussed in further detail may be assumed to correspond to the features with equivalent reference numerals as discussed above, including any potential variations in the features.

The words "substantially" and "approximately", as may be used in this disclosure provide a tolerance which is accepted in the industry for its corresponding word and/or relativity between items. Such an industry-accepted tolerance ranges from zero to ten percent and corresponds to, but is not limited to, lengths, positions, angles, etc. Such relativity between items ranges between approximately zero to ten percent.

Embodiments of the present disclosure may be used in a variety of optical systems. The embodiment may include or work with a variety of lighting, backlighting, optical components, displays, tablets and smart phones for example. Aspects of the present disclosure may be used with practically any apparatus related to displays, environmental lighting, optical devices, optical systems, or any apparatus that may contain any type of optical system. Accordingly, embodiments of the present disclosure may be employed in displays, environmental lighting, optical systems and/or devices used in a number of consumer professional or industrial environments.

It should be understood that the disclosure is not limited in its application or creation to the details of particular arrangements illustrated, because the disclosure is capable of other embodiments. Moreover, aspects of the disclosure may be set forth in different combinations and arrangements to define embodiments unique in their own right. Also, the terminology used in this disclosure is for the purpose of description and not of limitation.

While embodiments in accordance with the principles that are disclosed herein have been described, it should be understood that they have been presented by way of example only, and not limitation. Therefore, the breadth and scope of this disclosure should not be limited by any of the exemplary embodiments described, but should be defined only in accordance with any claims and their equivalents issuing from this disclosure. In addition, the above advantages and features are provided in described embodiments, but shall not limit the application of such issued claims to processes and structures accomplishing any or all of the above advantages.

The section headings herein are included to provide organizational cues. These headings shall not limit or characterise the embodiments set out in any claims that may issue from this disclosure. To take a specific example, although the headings refer to a "Technical Field," the claims should not be limited by the language chosen under this heading to describe the field. Further, a description of technology in the "Background" is not to be construed as an admission that certain technology is prior art to any embodiment in this disclosure. Neither is the "Summary" to be considered as a characterization of the embodiments in issued claims. Furthermore, any reference in this disclosure to "invention" in the singular should not be used to argue that there is merely one point of novelty in this disclosure. Multiple embodiments may be set forth according to the limitations of the multiple claims issuing from this disclosure, and such claims define the embodiments, and their equivalents, that are protected by them. In all instances, the scope of claims shall be considered on their own merits in the light of this disclosure and should not be constrained by the headings used in this disclosure.

The invention claimed is:

1. A colour display apparatus comprising:
a plurality of micro-LEDs arranged in a micro-LED array, wherein the plurality of micro-LEDs are micro-LED die chips, wherein each micro-LED die chip has a width or diameter that is at most 150 micrometers;
a plurality of reflective optical elements arranged in a reflective optical element array; and
a plurality of wavelength conversion elements arranged in a wavelength conversion array,
wherein each of the plurality of wavelength conversion elements is arranged to receive light emitted by one or more micro LI of the plurality of micro-LEDs, convert the received light into light of a different colour wavelength band, and output the light of a different colour wavelength band for display,
wherein each of the plurality of reflective optical elements is arranged to re-direct at least part of the light emitted by one or more micro-LEDs of the plurality of micro-LEDs towards one or more of the plurality of wavelength conversion elements
wherein each reflective optical element comprises a reflective rear surface and reflective walls extending from the reflective rear surface, the reflective rear surface and reflective walls defining a space therebetween, and
wherein each micro-LED die chip in the micro-LED array has a separation spacing from the nearest micro-LED die chip in the micro-LED array of less than or equal to 200 micrometers in one column or row of the micro-LED array.

2. A colour display apparatus according to claim 1, wherein each of the plurality of wavelength conversion elements is spaced apart from the one or more micro-LEDs that the wavelength conversion element is arranged to receive light from.

3. A colour display apparatus according to claim 1, wherein the micro-LEDs are arranged to emit light in an opposite direction to a direction in which the wavelength conversion elements output light for display.

4. A colour display apparatus according to claim 1, wherein the micro-LEDs are arranged to emit light in the same direction as a direction in which the wavelength conversion elements output light for display.

5. A colour display apparatus according to claim 1, wherein a transmissive material is arranged in the space defined by the reflective rear surface and the reflective walls of each reflective optical element.

6. A colour display apparatus according to claim 1, wherein the reflective rear surface of each reflective optical element comprises a reflective light input structure, wherein in at least one cross-sectional plane the reflective light input structure comprises at least one light deflecting surface; and
wherein each of the plurality of micro-LEDs is aligned with the respective reflective light input structure.

7. A colour display apparatus according to claim 1, wherein the light emitted by each of the plurality of micro-LEDs is of the same colour wavelength band.

8. A colour display apparatus according to claim 7, wherein the colour wavelength band of the light emitted by each of the plurality of micro-LEDs is blue light.

9. A colour display apparatus according to claim 7, wherein the colour wavelength band of the light emitted by each of the plurality of micro-LEDs is ultraviolet light.

10. A colour display apparatus according to claim 1, wherein the colour wavelength band of the light emitted by at least one of the micro-LEDs of the plurality of micro-LEDs is red light and the colour wavelength band of the light emitted by at least one of the micro-LEDs of the plurality of micro-LEDs is blue light or ultraviolet light.

11. A colour display apparatus according to claim 1, wherein the wavelength conversion elements comprise a phosphor or a quantum dot material.

12. A colour display apparatus according to claim 1, wherein the wavelength conversion elements are formed on the reflective rear surface of at least some of the reflective optical elements, and wherein each of the plurality of reflective optical elements is arranged to re-direct the light incident on it from one or more micro-LEDs of the plurality of micro-LEDs towards one or more of the plurality of wavelength conversion elements.

13. A colour display apparatus according to claim 1, wherein some of the reflective optical elements are not aligned with the wavelength conversion elements.

14. A colour display apparatus according to claim 1, wherein the colour display apparatus comprises diffuser regions, and wherein some of the reflective optical elements are aligned with the diffuser regions.

15. A colour display apparatus according to claim 14, wherein the diffuser regions and/or wavelength conversion elements are formed on a surface of the transmissive material.

16. A colour display apparatus according to claim 1, wherein each micro-LED is a micro-LED that has a width that is at most 100 micrometers and preferably at most 50 micrometers.

17. A colour display apparatus according to claim 5, wherein the plurality of micro-LEDs are formed on a surface of the transmissive material.

18. A colour display apparatus according to claim 1, further comprising an output substrate.

19. A colour display apparatus according to claim 18, wherein the wavelength conversion elements are formed on a first side of the output substrate and the first side of the output substrate faces the reflective optical element.

20. A colour display apparatus according to claim 1, further comprising a colour filter array comprising a plurality of absorptive colour filter regions, the plurality of colour filter regions being arranged in an array.

21. A colour display apparatus according to claim 20, wherein each of the colour filter regions is aligned with only one respective reflective optical element of the reflective optical element array.

22. A colour display apparatus according to claim 20, wherein the colour filter array is formed on the output substrate.

23. A colour display apparatus according to claim 18, wherein each of the plurality of micro-LEDs is funned between a respective optical reflective element and the output substrate.

24. A colour display apparatus according to claim 18, wherein the plurality of micro-LEDs are formed on the output substrate.

25. A colour display apparatus according to claim 1, further comprising a control system arranged to address the plurality of micro-LEDs with display pixel data to control the plurality of micro-LEDs to emit light according to the display pixel data.

26. A colour display apparatus according claim 25, wherein the control system comprises a plurality of addressing electrodes arranged to provide colour pixel data to each micro-LEDs of the plurality of micro-LEDs.

27. A colour display apparatus according to claim 1, further comprising a plurality of light blocking elements arranged in an array; wherein each light blocking element is aligned with a respective micro-LED of the plurality of micro-LEDs and the respective aligned micro-LED is arranged between the light blocking element and the reflective optical element.

28. A colour display apparatus according to claim 27, therein each light blocking element is reflective.

29. A colour display apparatus according to claim 27, wherein each light blocking element is an addressing electrode.

30. A colour display apparatus according to claim 18, wherein the output substrate comprises an optical isolator comprising a linear polariser and at least one retarder.

31. A colour display apparatus according to claim 30, wherein the at least one retarder is a quarter waveplate.

32. A colour display apparatus according to claim 1, wherein each micro-LED is aligned with a respective one of the reflective one of the optical elements.

33. A colour display apparatus according to claim 1, wherein at least one of the micro-LEDs of the plurality of micro-LEDs is not aligned with any of the reflective optical elements.

34. A colour display apparatus according to claim 1, wherein the reflective rear surface of each reflective optical element comprises a white reflector.

35. A colour display apparatus according to claim 1, wherein the reflective rear surface of each reflective optical element comprises a metal layer.

36. A colour display apparatus according to claim 1, wherein the reflective rear surface of each reflective optical element comprises a planar region.

37. A colour display apparatus according to claim 1, wherein the reflective rear surface of each reflective optical element comprises a microstructure.

38. A colour display apparatus according to claim 1, wherein the reflective rear surface of each reflective optical element defines a well.

39. A colour display apparatus according to claim 38, wherein a wavelength conversion element is located within the well defined by the reflective rear surface of each reflective optical element.

40. A colour display apparatus according to claim 5, wherein a surface of the transmissive material comprises a refractive input microstructure.

41. A colour display apparatus according to claim 40, wherein the reflective rear surface of each reflective optical element comprises a reflective light input structure, wherein in at least one cross-sectional lane the reflective light in Jut structure coin rises at least one light deflecting surface, and wherein the refractive input microstructure is aligned with the reflective light input structure.

42. A colour display apparatus according to claim 6,
wherein for each reflective optical element of the reflective optical element array, the at least one light deflecting surface is arranged to direct at least some light from at least one micro-LED towards a wavelength conversion element.

43. A colour display apparatus according to claim 6, wherein a transmissive material is arranged in the space defined by the reflective rear surface and the reflective walls of each reflective optical element, and wherein for each reflective optical element of the reflective optical element array, the reflective light input structure is arranged to direct at least some light from at least one micro-LED to be guided between a surface of the transmissive material and the reflective rear surface.

44. A colour display apparatus according to claim 6, wherein the reflective light input structure comprises at least one curved surface.

45. A colour display apparatus according to claim 6, wherein the reflective light input structure comprises at least one concave surface.

46. A colour display apparatus according to claim 1, wherein a catadioptric optical element is aligned with each reflective optical element.

47. A colour display apparatus according to claim 46, wherein the catadioptric optical element comprises in at least one catadioptric cross-sectional plane through its optical axis:
a first outer surface and a second outer surface facing the first outer surface;
wherein the first and second outer surfaces comprise curved surfaces;
wherein the first and second outer surfaces extend from a first end of the catadioptric optical element to a second end of the catadioptric optical element, the second end of the catadioptric optical element facing the first end of the catadioptric optical element;
wherein the distance between the first and second outer surfaces at the first end of the catadioptric optical element is less than the distance between the first and second outer surfaces at the second end of the catadioptric optical element; and
at least one transparent inner surface is arranged between the first and second ends and between the first and second outer surfaces.

48. A colour display apparatus according to claim 1, wherein each micro-LED die chip in the micro-LED array has a separation spacing from the nearest micro-LED die chip in the micro-LED array of less than or equal to 200 micrometers in one column or row of the micro-LED array.

49. A colour display apparatus according to claim 1, wherein each micro-LED die chip in the micro-LED array has a separation spacing from the nearest micro-LED die chip in the micro LED array of less than or equal to 20 micrometers in one column or row of the micro-LED array.

* * * * *